(12) United States Patent
Choe et al.

(10) Patent No.: US 11,943,998 B2
(45) Date of Patent: Mar. 26, 2024

(54) ORGANIC LIGHT EMITTING DIODE AND ORGANIC LIGHT EMITTING DEVICE INCLUDING THE SAME

(71) Applicant: LG Display Co., Ltd., Seoul (KR)

(72) Inventors: Ik-Rang Choe, Paju-si (KR); Hye-Gun Ryu, Paju-si (KR); Jun-Yun Kim, Paju-si (KR); Seong-Keun Kim, Paju-si (KR); Ju-Young Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 666 days.

(21) Appl. No.: 17/100,611

(22) Filed: Nov. 20, 2020

(65) Prior Publication Data
US 2021/0167289 A1    Jun. 3, 2021

(30) Foreign Application Priority Data

Nov. 28, 2019  (KR) .................. 10-2019-0155531
Oct. 6, 2020   (KR) .................. 10-2020-0128779

(51) Int. Cl.
| | |
|---|---|
| H01L 51/50 | (2006.01) |
| C09K 11/06 | (2006.01) |
| H10K 85/30 | (2023.01) |
| H10K 85/60 | (2023.01) |
| H10K 50/11 | (2023.01) |
| H10K 50/12 | (2023.01) |
| H10K 50/13 | (2023.01) |
| H10K 101/10 | (2023.01) |

(52) U.S. Cl.
CPC .......... *H10K 85/322* (2023.02); *C09K 11/06* (2013.01); *H10K 85/622* (2023.02); *H10K 85/631* (2023.02); *H10K 85/633* (2023.02); *H10K 85/654* (2023.02); *H10K 85/6572* (2023.02); *C09K 2211/1018* (2013.01); *H10K 50/11* (2023.02); *H10K 50/121* (2023.02); *H10K 50/13* (2023.02); *H10K 85/626* (2023.02); *H10K 2101/10* (2023.02)

(58) Field of Classification Search
None
See application file for complete search history.

(56) References Cited

U.S. PATENT DOCUMENTS

2022/0002319 A1* 1/2022 Lee ..................... H10K 85/626

FOREIGN PATENT DOCUMENTS

WO    WO 2018/212169 A1    11/2018

OTHER PUBLICATIONS

Bui, T.T., et al, "Thermally Activated Delayed Fluorescence Emitters for Deep Blue Organic Light Emitting Diodes: A Review of Recent Advances," Appl. Sci., 2018, vol. 8, pp. 1-23.

* cited by examiner

*Primary Examiner* — Gregory D Clark
(74) *Attorney, Agent, or Firm* — Birch, Stewart, Kolasch & Birch, LLP

(57) ABSTRACT

The present disclosure provides an organic light emitting diode including a first electrode; a second electrode facing the first electrode; and an emitting material layer including a first compound and a second compound positioned between the first and second electrodes, wherein the first compound includes a hexagonal-ring moiety including one boron atom, one oxygen atom and four carbon atoms, and the second compound includes a hexagonal-ring moiety including one boron atom, one nitrogen atom and four carbon atoms, and an organic light emitting device including the organic light emitting diode.

20 Claims, 12 Drawing Sheets

ORGANIC LIGHT EMITTING DIODE AND ORGANIC LIGHT EMITTING DEVICE INCLUDING THE SAME

CROSS-REFERENCE TO RELATED APPLICATIONS

The present application claims the priority benefit of the Korean Patent Application No. 10-2019-0155531 filed in the Republic of Korea on Nov. 28, 2019 and the Korean Patent Application No. 10-2020-0128779 filed in the Republic of Korea on Oct. 6, 2020, the entire contents of all these applications are hereby expressly incorporated by reference as if fully set forth herein into the present application.

BACKGROUND

Field of Technology

The present disclosure relates to an organic light emitting diode, and more particularly, to an organic light emitting diode having excellent emitting property and an organic light emitting device including the organic light emitting diode.

Discussion of the Related Art

Recently, a demand for flat panel display devices having small occupied areas is increased. Among the flat panel display devices, a technology of an organic light emitting display device, which includes an organic light emitting diode (OLED) and can be referred to as an organic electroluminescent device, is rapidly developed.

The OLED emits light by injecting electrons from a cathode as an electron injection electrode and holes from an anode as a hole injection electrode into an emitting material layer, combining the electrons with the holes, generating an exciton, and transforming the exciton from an excited state to a ground state. In the fluorescent material, only singlet exciton is involved in the emission such that the related art fluorescent material has low emitting efficiency. In the phosphorescent material, both the singlet exciton and the triplet exciton are involved in the emission such that the phosphorescent material has higher emitting efficiency than the fluorescent material. However, the metal complex compound, which is a typical phosphorescent material, has a short emitting lifespan and thus has a limitation in commercialization.

SUMMARY

The present disclosure is directed to an OLED and an organic light emitting device that substantially obviate one or more of the problems associated with the limitations and disadvantages of the related conventional art.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the embodiments of the present disclosure, as described herein, an aspect of the present disclosure is an organic light emitting diode including a first electrode; a second electrode facing the first electrode; and an emitting material layer including a first compound and a second compound and positioned between the first and second electrodes, wherein the first compound includes a hexagonal-ring moiety including one boron atom, one oxygen atom and four carbon atoms, and the second compound includes a hexagonal-ring moiety including one boron atom, one nitrogen atom and four carbon atoms.

Another aspect of the present disclosure is an organic light emitting device including a substrate; and an organic light emitting diode disposed on or over the substrate, the organic light emitting diode including: a first electrode; a second electrode facing the first electrode; and an emitting material layer including a first compound and a second compound and positioned between the first and second electrodes, wherein the first compound includes a hexagonal-ring moiety including one boron atom, one oxygen atom and four carbon atoms, and the second compound includes a hexagonal-ring moiety including one boron atom, one nitrogen atom and four carbon atoms.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure.

DETAILED DESCRIPTION OF THE EMBODIMENTS

Reference will now be made in detail to some of the examples and preferred embodiments, which are illustrated in the accompanying drawings.

The present disclosure relates to an OLED, in which a delayed fluorescent material and a fluorescent material are applied in a single emitting material layer or adjacent emitting material layers, and an organic light emitting device including the OLED. For example, the organic light emitting device can be an organic light emitting display device or an organic lighting device. As an example, an organic light emitting display device, which is a display device including one or more OLEDs of the present disclosure, will be mainly described.

Figure 1:
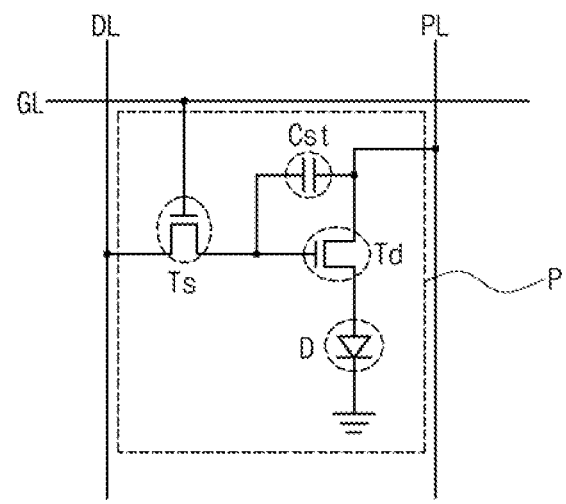
FIG. 1 is a schematic circuit diagram of an organic light emitting display device of the present disclosure.

FIG. 1 is a schematic circuit diagram of an organic light emitting display device of the present disclosure. All the components of the organic light emitting display device according to all embodiments of the present disclosure are operatively coupled and configured.

As shown in FIG. 1, an organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region can include a red pixel region, a green pixel region and a blue pixel region. Although a pixel region is exemplified, the organic light emitting display device can include a plurality of such pixel regions having a plurality of gate lines, data lines, TFTs, OLEDs, etc.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
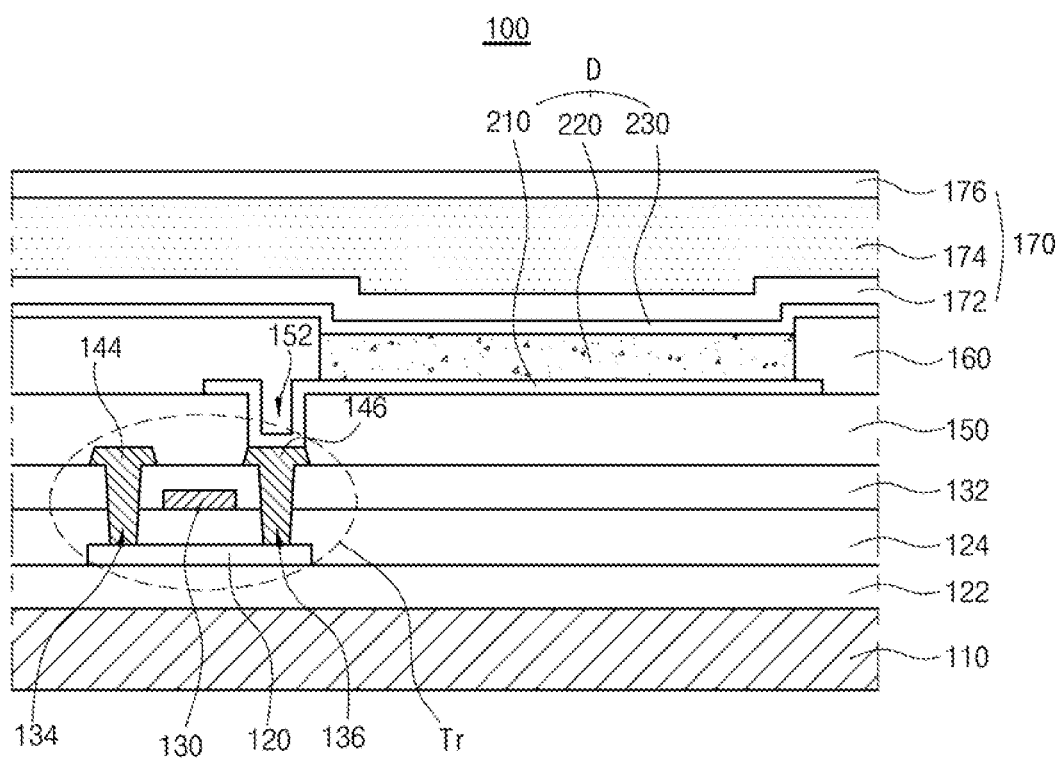
FIG. 2 is a schematic cross-sectional view of an organic light emitting display device according to a first embodiment of the present disclosure.

FIG. 2 is a schematic cross-sectional view of an organic light emitting display device according to a first embodiment of the present disclosure.

As shown in FIG. 2, an organic light emitting display device 100 includes a substrate 110, a TFT Tr and an OLED D connected to the TFT Tr.

The substrate 110 can be a glass substrate or a plastic substrate. For example, the substrate 110 can be a polyimide substrate.

A buffer layer 122 is formed on the substrate, and the TFT Tr is formed on the buffer layer 122. The buffer layer 122 can be omitted.

A semiconductor layer 120 is formed on the buffer layer 122. The semiconductor layer 120 can include an oxide semiconductor material or polycrystalline silicon.

When the semiconductor layer 120 includes the oxide semiconductor material, a light-shielding pattern can be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities can be doped into both sides of the semiconductor layer 120.

A gate insulating layer 124 is formed on the semiconductor layer 120. The gate insulating layer 124 can be formed of an inorganic insulating material such as silicon oxide or silicon nitride.

A gate electrode 130, which is formed of a conductive material, e.g., metal, is formed on the gate insulating layer 124 to correspond to a center of the semiconductor layer 120. In FIG. 2, the gate insulating layer 124 is formed on an entire surface of the substrate 110. Alternatively, the gate insulating layer 124 can be patterned to have the same shape as the gate electrode 130.

An interlayer insulating layer 132, which is formed of an insulating material, is formed on the gate electrode 130. The interlayer insulating layer 132 can be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130. In FIG. 2, the first and second contact holes 134 and 136 are formed through the interlayer insulating layer 132 and the gate insulating layer 124. Alternatively, when the gate insulating layer 124 is patterned to have the same shape as the gate electrode 130, the first and second contact holes 134 and 136 is formed only through the interlayer insulating layer 132.

A source electrode 144 and a drain electrode 146, which are formed of a conductive material, e.g., metal, are formed on the interlayer insulating layer 132. The source electrode 144 and the drain electrode 146 are spaced apart from each other with respect to the gate electrode 130 and respectively contact both sides of the semiconductor layer 120 through the first and second contact holes 134 and 136.

The semiconductor layer 120, the gate electrode 130, the source electrode 144 and the drain electrode 146 constitute the TFT Tr. The TFT Tr serves as a driving element. Namely, the TFT Tr is the driving TFT Td (of FIG. 1).

In the TFT Tr, the gate electrode 130, the source electrode 144, and the drain electrode 146 are positioned over the semiconductor layer 120. Namely, the TFT Tr has a coplanar structure.

Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

The gate line and the data line cross each other to define the pixel region, and the switching TFT is formed to be connected to the gate and data lines. The switching TFT is connected to the TFT Tr as the driving element. In addition, the power line, which can be formed to be parallel to and spaced apart from one of the gate and data lines, and the storage capacitor for maintaining the voltage of the gate electrode of the TFT Tr in one frame can be further formed.

A planarization layer 150 is formed on an entire surface of the substrate 110 to cover the source and drain electrodes 144 and 146. The planarization layer 150 provides a flat top surface and has a drain contact hole 152 exposing the drain electrode 146 of the TFT Tr.

The OLED D is disposed on the planarization layer 150 and includes a first electrode 210, which is connected to the drain electrode 146 of the TFT Tr, a light emitting layer 220 and a second electrode 230. The light emitting layer 220 and the second electrode 230 are sequentially stacked on the first electrode 210. The OLED D is positioned in each of the red, green and blue pixel regions and respectively emits the red, green and blue light.

The first electrode 210 is separately formed in each pixel region. The first electrode 210 can be an anode and can be formed of a conductive material, e.g., a transparent conductive oxide (TCO), having a relatively high work function. For example, the first electrode 210 can be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc-oxide (Al:ZnO, AZO).

When the organic light emitting display device 100 is operated in a bottom-emission type, the first electrode 210 may have a single-layered structure of the transparent conductive material layer. When the organic light emitting display device 100 of the present disclosure is operated in a top-emission type, a reflection electrode or a reflection layer can be formed under the first electrode 210. For example, the reflection electrode or the reflection layer can be formed of silver (Ag) or aluminum-palladium-copper (APC) alloy. In this instance, the first electrode 210 may have a triple-layered structure of ITO/Ag/ITO or ITO/APC/ITO.

In addition, a bank layer 160 is formed on the planarization layer 150 to cover an edge of the first electrode 210. Namely, the bank layer 160 is positioned at a boundary of the pixel region and exposes a center of the first electrode 210 in the pixel region.

The light emitting layer 220 as an emitting unit is formed on the first electrode 210. The light emitting layer 220 can have a single-layered structure of an emitting material layer (EML) including an emitting material. To increase an emitting efficiency of the organic light emitting display device, the light emitting layer 220 can have a multi-layered structure. For example, the light emitting layer 220 can further include a hole injection layer (HIL), a hole transporting layer (HTL), an electron blocking layer (EBL), a hole blocking layer (HBL), an electron transporting layer (ETL) and an electron injection layer (EIL). The HIL, the HTL and the EBL are sequentially disposed between the first electrode (210) and the EML, and the HBL, the ETL and the EIL are sequentially disposed between the EML and the second electrode 230. In addition, the EML can has a single-layered structure or a multi-layered structure. Moreover, two or more light emitting layers can be disposed to be spaced apart from each other such that the OLED D can have a tandem structure.

The second electrode 230 is formed over the substrate 110 where the light emitting layer 220 is formed. The second electrode 230 covers an entire surface of the display area and can be formed of a conductive material having a relatively low work function to serve as a cathode. For example, the second electrode 230 can be formed of aluminum (Al), magnesium (Mg), calcium (Ca), silver (Ag) or their alloy or combination. In the top-emission type organic light emitting display device 100, the second electrode 230 may have a thin profile (small thickness) to provide a light transmittance property (or a semi-transmittance property).

Further, the organic light emitting display device 100 can include a color filter corresponding to the red, green and blue pixel regions. For example, when the OLED D, which has the tandem structure and emits the white light, is formed to all of the red, green and blue pixel regions, a red color filter pattern, a green color filter pattern and a blue color filter pattern can be formed in the red, green and blue pixel regions, respectively, such that a full-color display is provided.

When the organic light emitting display device 100 is operated in a bottom-emission type, the color filter can be disposed between the OLED D and the substrate 110, e.g., between the interlayer insulating layer 132 and the planarization layer 150. Alternatively, when the organic light emitting display device 100 is operated in a top-emission type, the color filter can be disposed over the OLED D, e.g., over the second electrode 230.

An encapsulation film 170 is formed on the second electrode 230 to prevent penetration of moisture into the OLED D. The encapsulation film 170 includes a first inorganic insulating layer 172, an organic insulating layer 174 and a second inorganic insulating layer 176 sequentially stacked, but it is not limited thereto.

The Organic light emitting display device 100 may further include a polarization plate (not shown) for reducing an ambient light reflection. For example, the polarization plate can be a circular polarization plate. In the bottom-emission type organic light emitting display device 100, the polarization plate may be disposed under the substrate 110. In the top-emission type organic light emitting display device 100, the polarization plate may be disposed on or over the encapsulation film 170.

In addition, in the top-emission type organic light emitting display device 100, a cover window can be attached to the encapsulation film 170 or the polarization plate. In this instance, the substrate 110 and the cover window have a flexible property such that a flexible organic light emitting display device can be provided.

Figure 3:
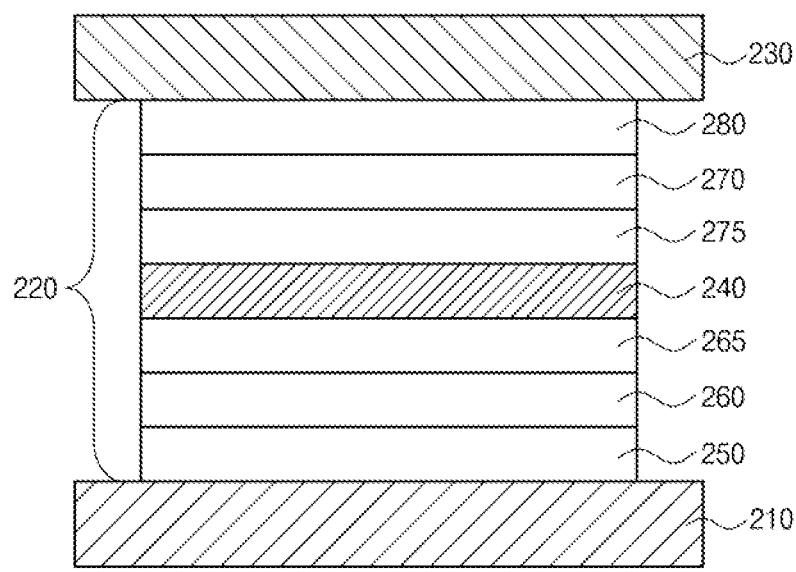
FIG. 3 is a schematic cross-sectional view of an OLED according to a second embodiment of the present disclosure.

FIG. 3 is a schematic cross-sectional view of an OLED according to a second embodiment of the present disclosure.

As shown in FIG. 3, the OLED D1 includes the first and second electrodes 210 and 230, which face each other, and the light emitting layer 220 therebetween. The light emitting layer 220 includes an emitting material layer (EML) 240. The organic light emitting display device 100 (of FIG. 2) may include a red pixel region, a green pixel region and a blue pixel region, and the OLED D1 may be positioned in the blue pixel region.

The first electrode 210 can be an anode, and the second electrode 230 can be a cathode.

The light emitting layer 220 further include at least one of a hole transporting layer (HTL) 260 between the first electrode 210 and the EML 240 and an electron transporting layer (ETL) 270 between the second electrode 230 and the EML 240.

In addition, the light emitting layer 220 can further include at least one of a hole injection layer (HIL) 250 between the first electrode 210 and the HTL 260 and an electron injection layer (EIL) 280 between the second electrode 230 and the ETL 270.

Moreover, the light emitting layer 220 can further include at least one of an electron blocking layer (EBL) 265 between the HTL 260 and the EML 240 and a hole blocking layer (HBL) 275 between the EML 240 and the ETL 270.

For example, the HIL 250 may include at least one compound selected from the group consisting of 4,4',4"-tris (3-methylphenylamino)triphenylamine (MTDATA), 4,4',4"-tris(N,N-diphenyl-amino)triphenylamine(NATA), 4,4',4"-tris(N-(naphthalene-1-yl)-N-phenyl-amino)triphenylamine (1T-NATA), 4,4',4"-tris(N-(naphthalene-2-yl)-N-phenyl-amino)triphenylamine(2T-NATA), copper phthalocyanine (CuPc), tris(4-carbazoyl-9-yl-phenyl)amine(TCTA), N,N'-diphenyl-N,N'-bis(1-naphthyl)-1,1'-biphenyl-4,4"-diamine (NPB; NPD), 1,4,5,8,9,11-hexaazatriphenylenehexacarbonitrile(dipyrazino[2,3-f:2'3'-h]quinoxaline-2,3,6,7,10,11-hexacarbonitrile; HAT-CN), 1,3,5-tris[4-(diphenylamino)phenyl]benzene(TDAPB), poly(3,4-ethylenedioxythiophene)polystyrene sulfonate(PEDOT/PSS), and N-(biphenyl-4-yl)-9,9-dimethyl-N-(4-(9-phenyl-9H-carbazol-3-yl)phenyl)-9H-fluoren-2-amine, but it is not limited thereto.

The HTL 260 may include at least one compound selected from the group consisting of N,N'-diphenyl-N,N'-bis(3-methylphenyl)-1,1'-biphenyl-4,4'-diamine; TPD), NPB (NPD), 4,4'-bis(N-carbazolyl)-1,1'-biphenyl(CBP), poly[N,N'-bis(4-butylpnehyl)-N,N'-bis(phenyl)-benzidine](Poly-TPD), (poly[(9,9-dioctylfluorenyl-2,7-diyl)-co-(4,4'-(N-(4-sec-butylphenyediphenylamine))] (TFB), di-[4-(N,N-di-p-tolyl-amino)-phenyl]cyclohexane(TAPC), 3,5-di(9H-carbazol-9-yl)-N,N-diphenylaniline(DCDPA), N-(biphenyl-4-yl)-9,9-dimethyl-N-(4-(9-phenyl-9H-carbazol-3-yl) phenyl)-9H-fluoren-2-amine, and N-(biphenyl-4-yl)-N-(4-(9-phenyl-9H-carbazol-3-yl)phenyl)biphenyl-4-amine, but it is not limited thereto.

The ETL 270 may include at least one of an oxadiazole-based compound, a triazole-based compound, a phenanthroline-based compound, a benzoxazole-based compound, a benzothiazole-based compound, a benzimidazole-based compound, and a triazine-based compound. For example, the ETL 270 may include at least one compound selected from the group consisting of tris-(8-hydroxyquinoline aluminum(Alq$_3$), 2-biphenyl-4-yl-5-(4-t-butylphenyl)-1,3,4-oxadiazole(PBD), spiro-PBD, lithium quinolate(Liq), 1,3,5-tris(N-phenylbenzimidazol-2-yl)benzene(TPBi), bis(2-methyl-8-quinolinolato-N1,O8)-(1,1'-biphenyl-4-olato) aluminum(BAlq), 4,7-diphenyl-1,10-phenanthroline (Bphen), 2,9-bis(naphthalene-2-yl)4,7-diphenyl-1,10-phenanthroline(NBphen), 2,9-dimethyl-4,7-diphenyl-1,10-phenathroline(BCP), 3-(4-biphenyl)-4-phenyl-5-tert-butylphenyl-1,2,4-triazole(TAZ), 4-(naphthalen-1-yl)-3,5-diphenyl-4H-1,2,4-triazole(NTAZ), 1,3,5-tri(p-pyrid-3-yl-phenyl)benzene(TpPyPB), 2,4,6-tris(3'-(pyridin-3-yl) biphenyl-3-yl)1,3,5-triazine(TmPPPyTz), Poly[9,9-bis(3'-((N,N-dimethyl)-N-ethylammonium)-propyl)-2,7-fluorene]-alt-2,7-(9,9-dioctylfluorene)](PFNBr), tris (phenylquinoxaline(TPQ), and diphenyl-4-triphenylsilyl-phenylphosphine oxide(TSPO1), but it is not limited thereto.

The EIL 280 may include at least one of an alkali halide compound, such as LiF, CsF, NaF, or BaF$_2$, and an organometallic compound, such as Liq, lithium benzoate, or sodium stearate, but it is not limited thereto.

The EBL 265, which is positioned between the HTL 260 and the EML 240 to block the electron transfer from the EML 240 into the HTL 260, may include at least one compound selected from the group consisting of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis(carbazol-9-yl) benzene(mCP), 3,3'-bis(N-carbazolyl)-1,1'-biphenyl (mCBP), CuPc, N,N'-bis[4-[bis(3-methylphenyl)amino] phenyl]-N,N'-diphenyl-[1,1'-biphenyl]-4,4'-diamine (DNTPD), TDAPB, DCDPA, and 2,8-bis(9-phenyl-9H-carbazol-3-yl)dibenzo[b,d]thiophene), but it is not limited thereto.

The HBL 275, which is positioned between the EML 240 and the ETL 270 to block the hole transfer from the EML 240 into the ETL 270, may include the above material of the ETL 270. For example, the material of the HBL 275 has a HOMO energy level being lower than a material of the EML 240 and may be at least one compound selected from the group consisting of BCP, BAlq, Alq3, PBD, spiro-PBD, Liq, bis-4,6-(3,5-di-3-pyridylphenyl)-2-methylpyrimidine (B3PYMPM), bis[2-(diphenylphosphino)phenyl]teeth oxide (DPEPO), 9-(6-9H-carbazol-9-yl)pyridine-3-yl)-9H-3,9'-bicarbazole, and TSPO1, but it is not limited thereto.

The EML 240 includes a first compound of a delayed fluorescent material (compound) and a second compound of a fluorescent material (compound). The EML can further include a third compound as a host. The EML 240 including the first and second compounds emits blue light, and the OLED D1 is positioned in the blue pixel region.

For example, the third compound as the host can be one of 9-(3-(9H-carbazol-9-yephenyl)-9H-carbazole-3-carbonitrile (mCP-CN), CBP, 3,3'-bis(N-carbazolyl)-1,1'-biphenyl (mCBP), 1,3-bis(carbazol-9-yebenzene (mCP), oxybis(2,1-phenylene))bis(diphenylphosphine oxide) (DPEPO), 2,8-bis (diphenylphosphoryl)dibenzothiophene (PPT), 1,3,5-tri[(3-pyridyl)-phen-3-yl]benzene (TmPyPB), 2,6-di(9H-carbazol-9-yl)pyridine (PYD-2Cz), 2,8-di(9H-carbazol-9-yl) dibenzothiophene (DCzDBT), 3',5'-di(carbazol-9-yl)-[1,1'-bipheyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), diphenyl-4-triphenylsilylphenyl-phosphine oxide (TSPO1), 9-(9-phenyl-9H-carbazol-6-yl)-9H-carbazole (CCP), 4-(3-(triphenylen-2-yl)phenyl)dibenzo[b,d]thiophene), 9-(4-(9H-carbazol-9-yl)phenyl)-9H-3,9'-bicarbazole, 9-(3-(9H-carbazol-9-yl)phenyl)-9H-3,9'-bicarbazole, or 9-(6-(9H-carbazol-9-yl)pyridin-3-yl)-9H-3,9'-bicabazole, but it is not limited thereto.

The delayed fluorescent material as the first compound in the EML 240 is represented by Formula 1.

[Formula 1]

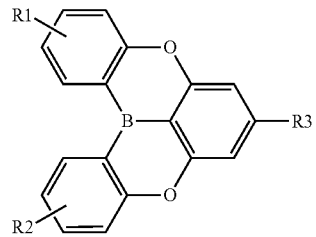

In Formula 1, each of R1 and R2 is independently selected from the group consisting of hydrogen, deuterium, tritium, halogen, C1 to C20 alkyl, C6 to C30 aryl, C5 to C30 heteroaryl, C1 to C20 alkylamine, and C6 to C30 arylamine, and R3 is C5 to C60 heteroaryl including a nitrogen atom.

For example, each of R1 and R2 can be independently selected from the group consisting of hydrogen, C1 to C20 alky, e.g., tert-butyl, and C6 to C30 aryl, e.g., phenyl. R3 can be heteroaryl having an electron donor property. For example, R3 can be selected from the group consisting of indolocarbazolyl, diindolocarbazolyl, bis-carbazolyl, acridinyl, spiroacridinyl, phenoxazinyl, phenothiazinyl and their derivatives.

The term of "alkyl", "aryl" and "heteroaryl" can include that substituted one and non-substituted one. When they are substituted, the substituent can be at least one of C1 to C20 alkyl, C6 to C30 aryl and C5 to C30 heteroaryl.

For example, the first compound can be one of compounds of Formula 2.

[Formula 2]

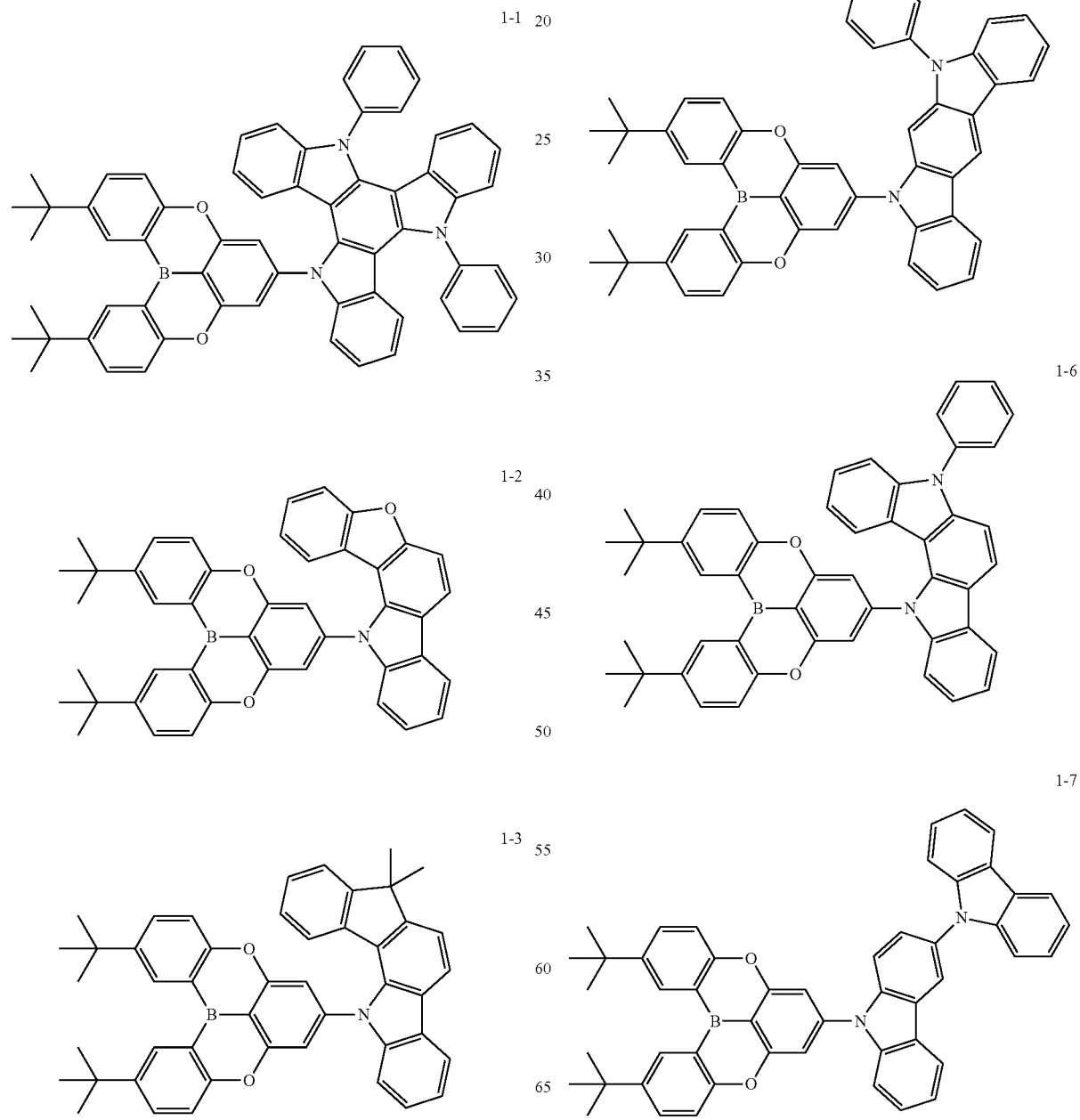

-continued
1-8
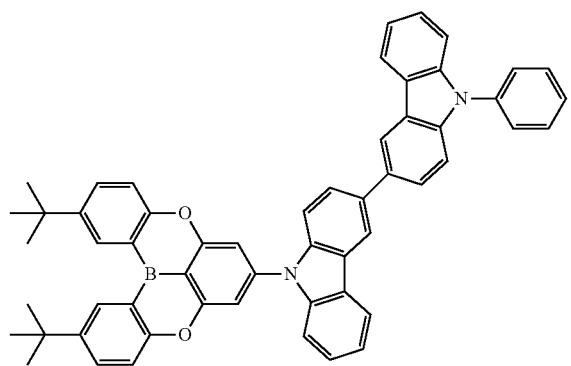
1-9
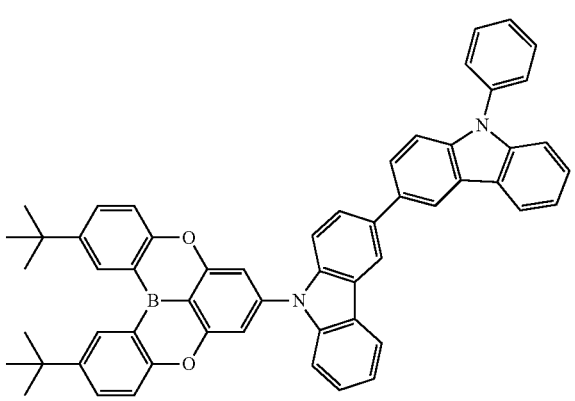
1-10
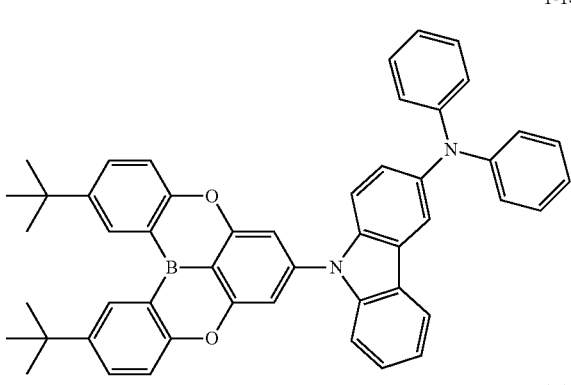
1-11
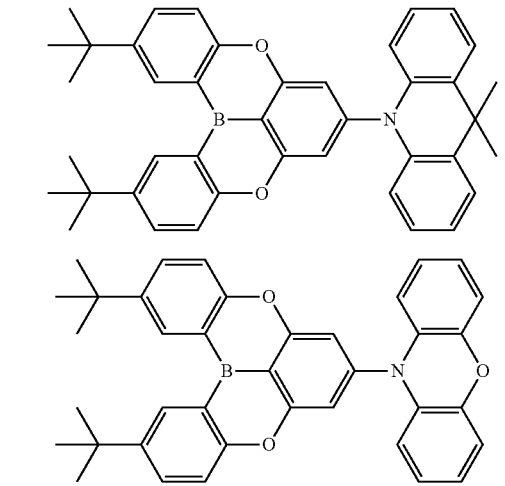
1-12
-continued
1-13
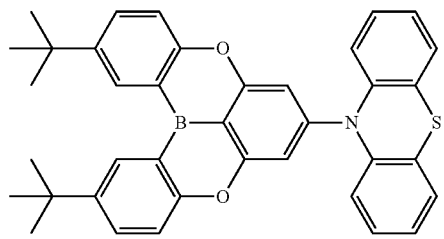
1-14
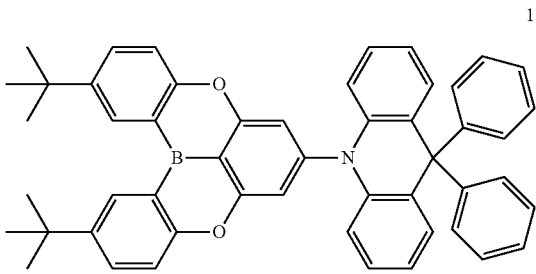
1-15
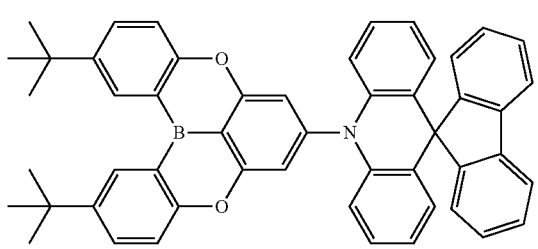
1-16
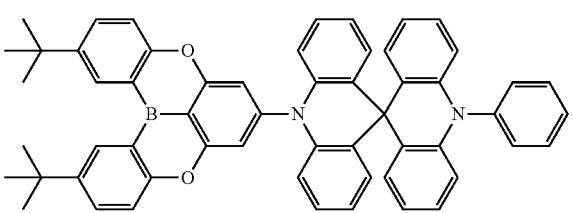
1-17
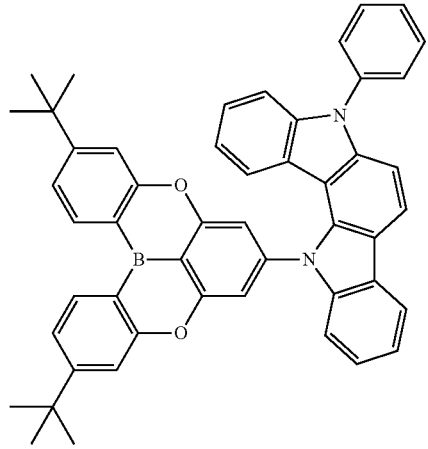

1-18
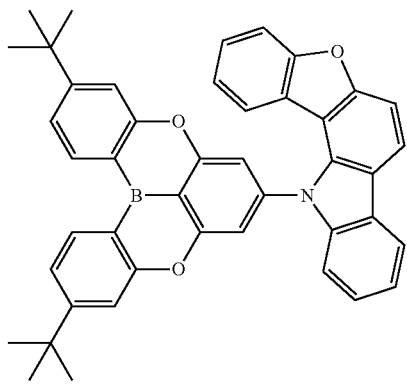
1-19
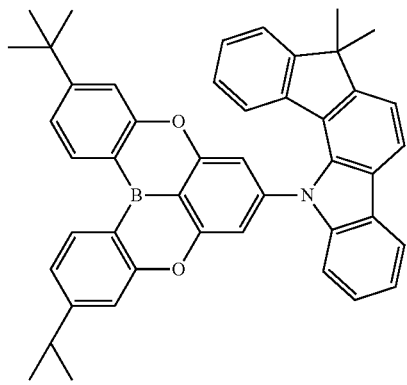
1-20
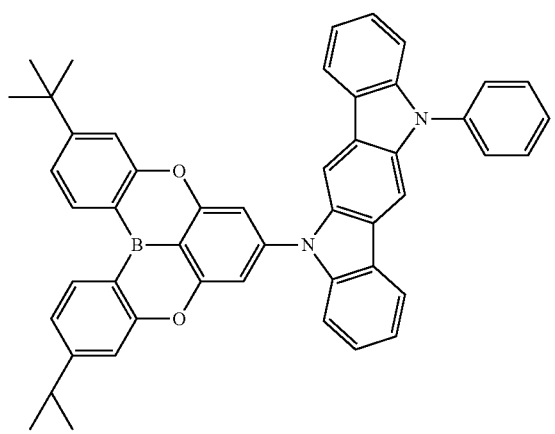
1-21
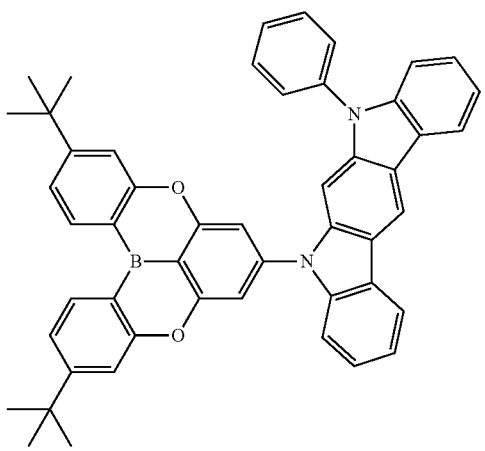
1-22
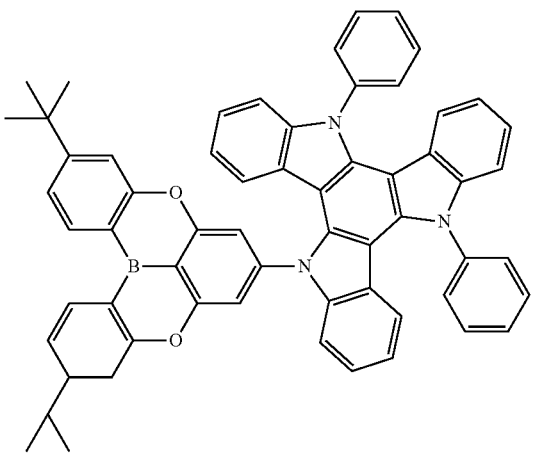
1-23
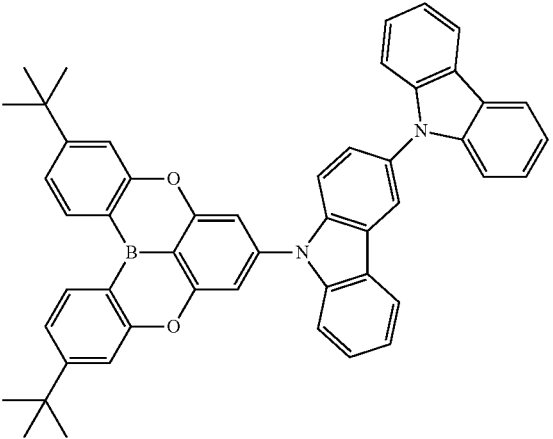

1-24
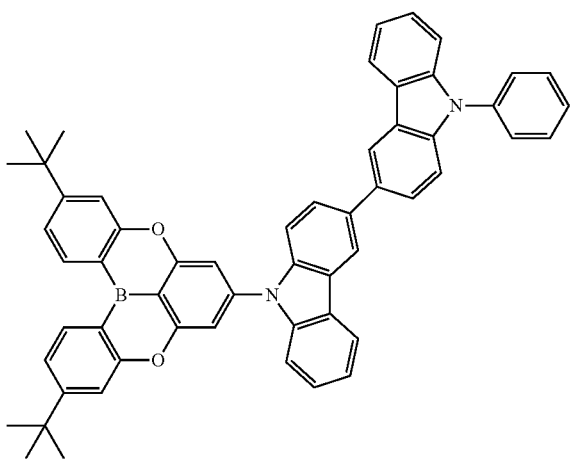
1-25
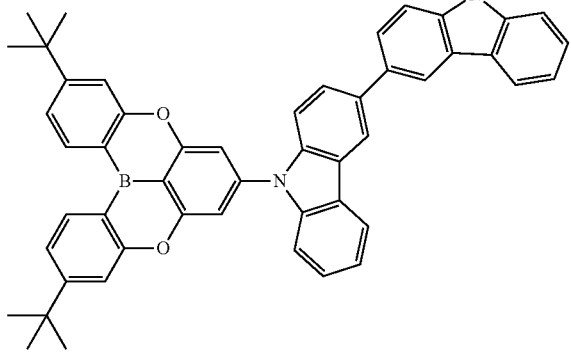
1-26
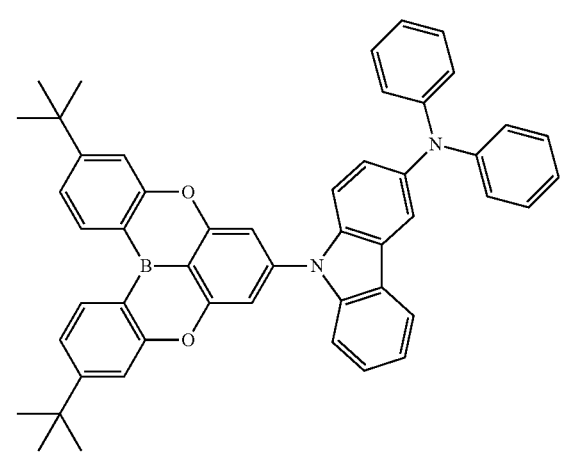
1-27
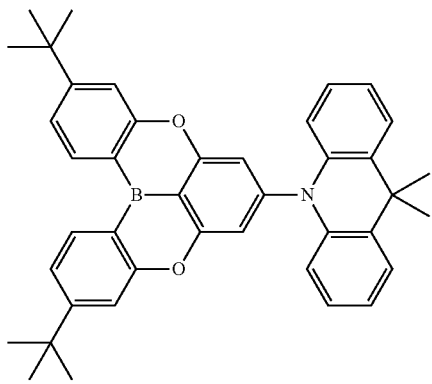
1-28
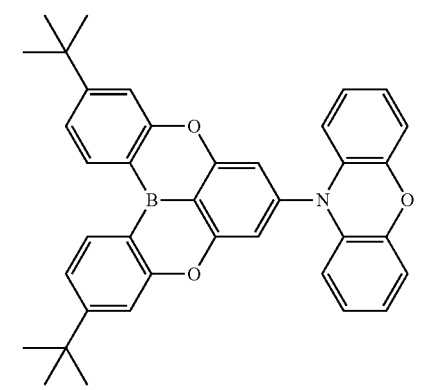
1-29
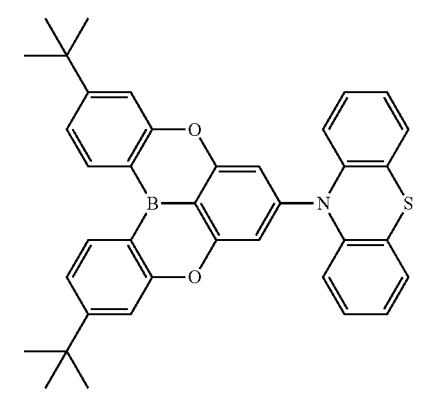
1-30
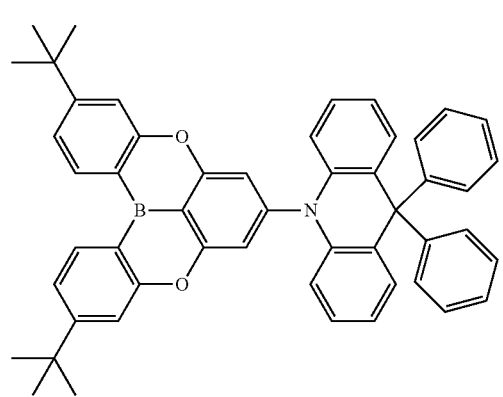

17
-continued
1-31
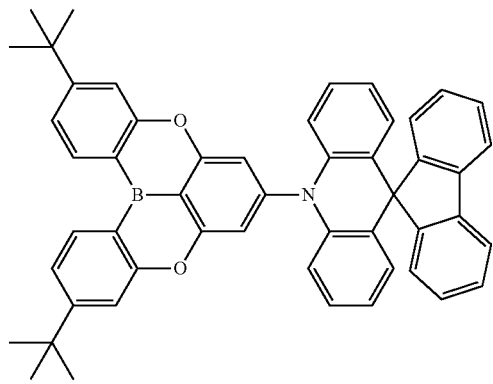
1-32
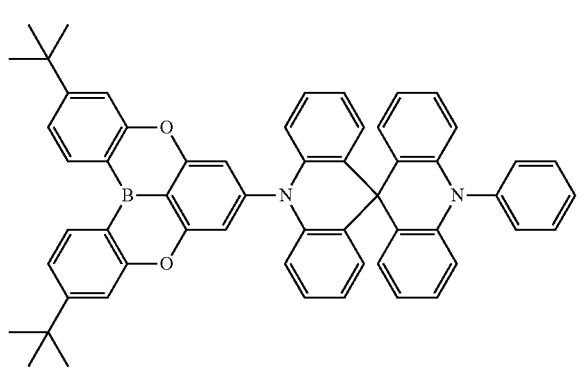
1-33
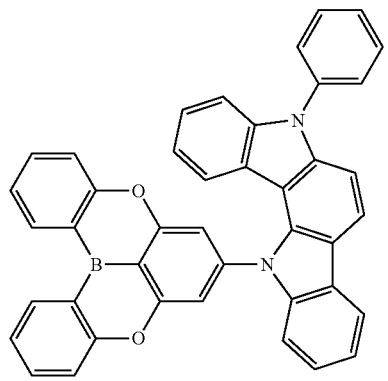
1-34
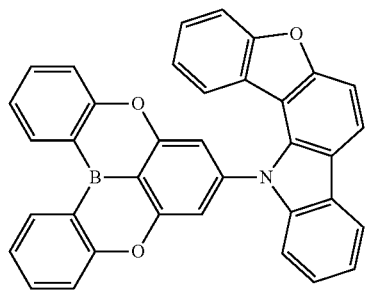
18
-continued
1-35
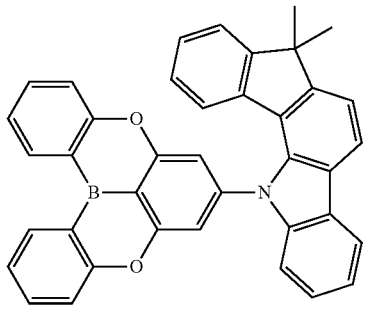
1-36
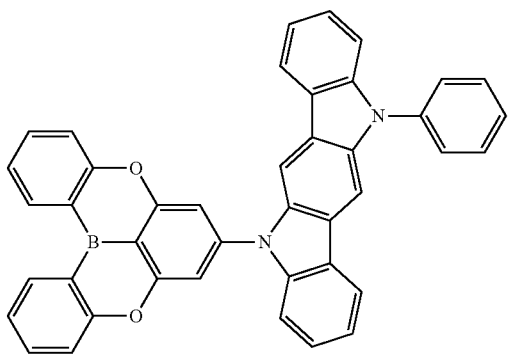
1-37
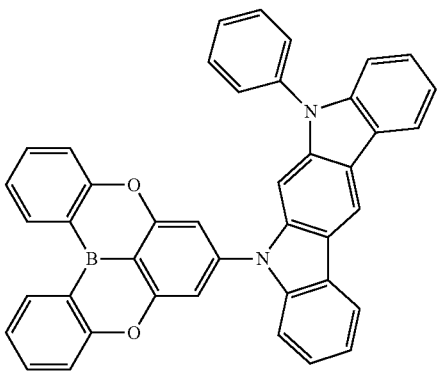
1-38
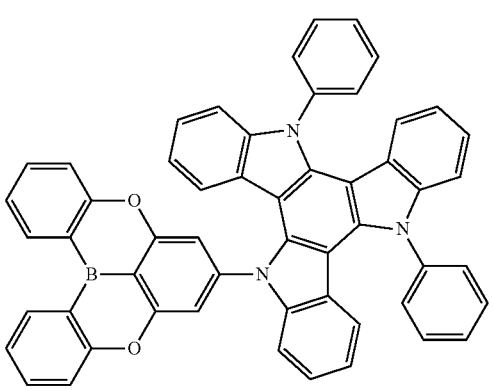

-continued
1-39
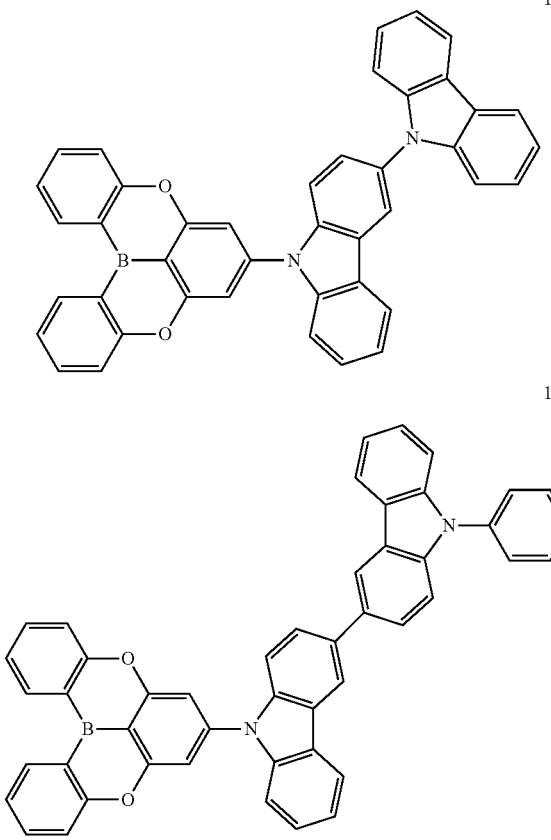
1-40
1-41
1-42
1-43
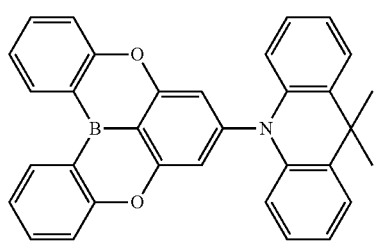
1-44
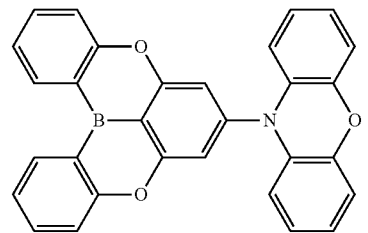
1-45
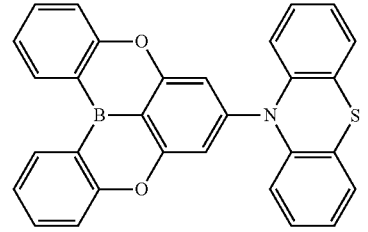
1-46
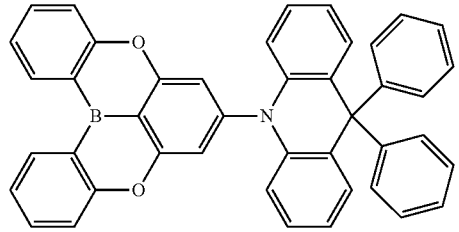
1-47
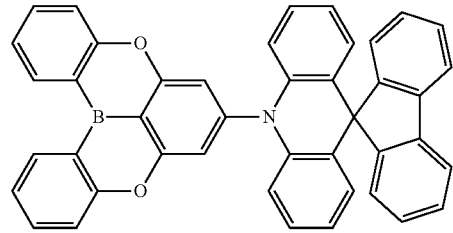
1-48
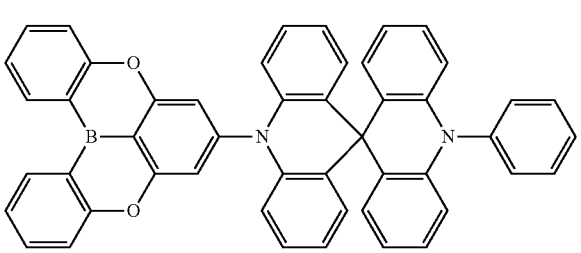

-continued
1-49
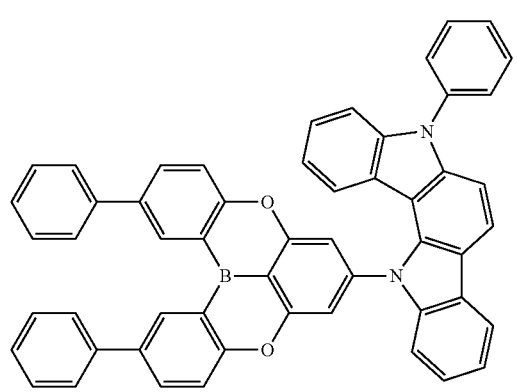
1-50
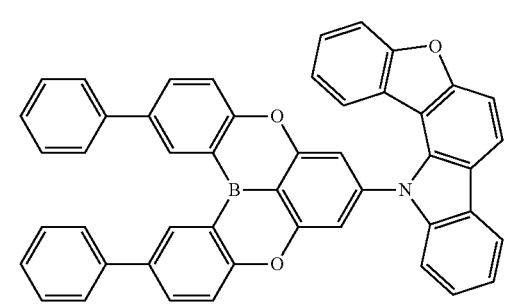
1-51
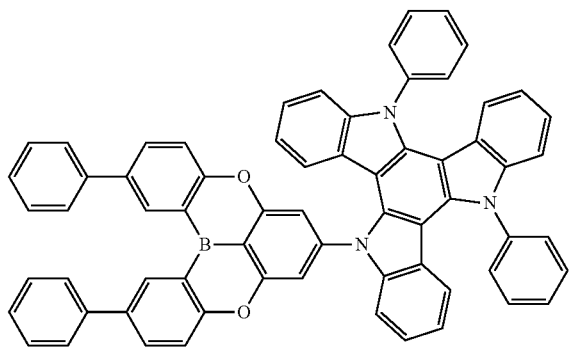
1-52
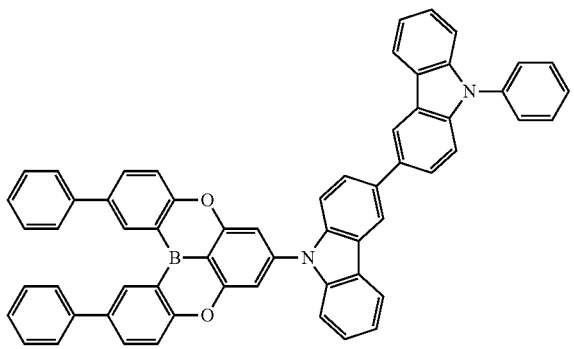
-continued
1-53
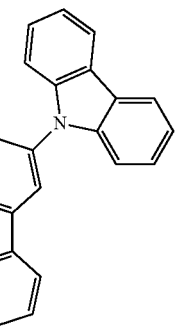
1-54
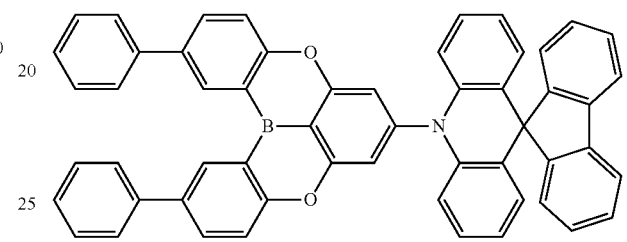
1-55
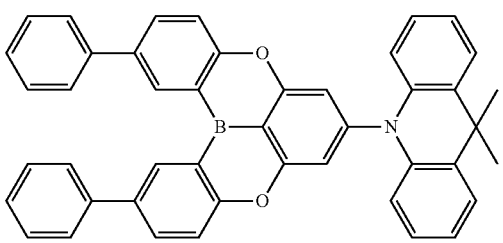
1-56
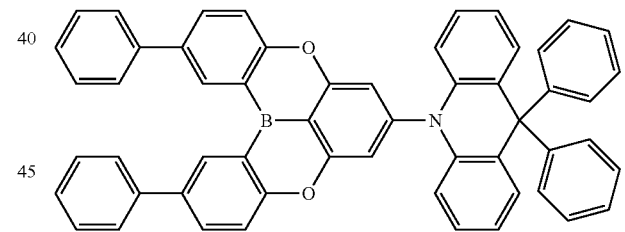
1-57
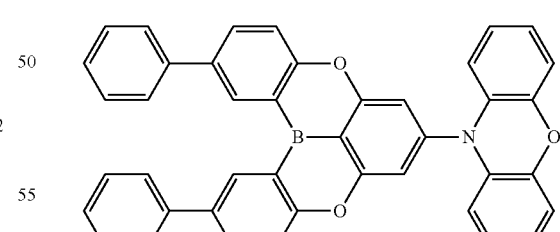
1-58
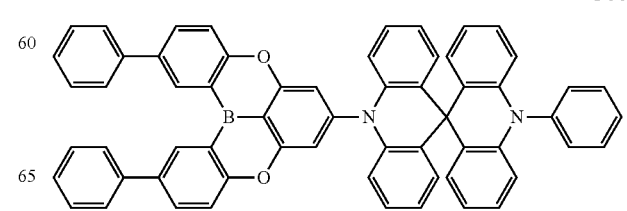

-continued
1-59
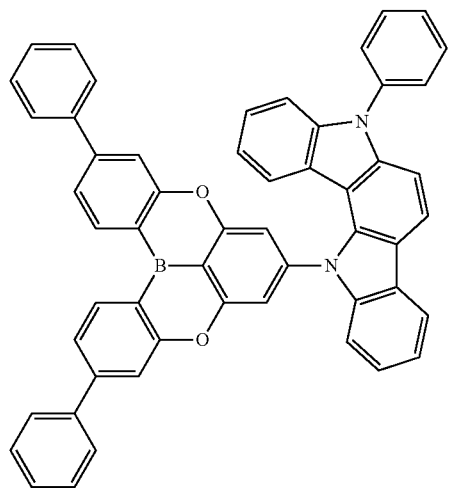
1-60
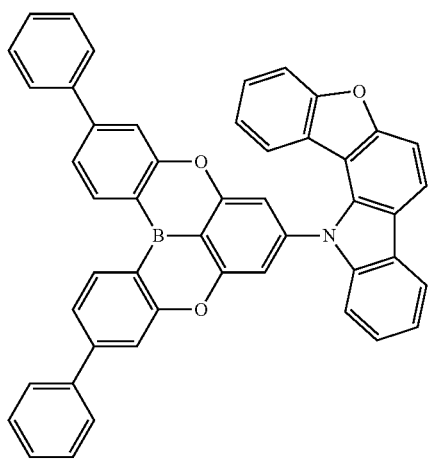
1-61
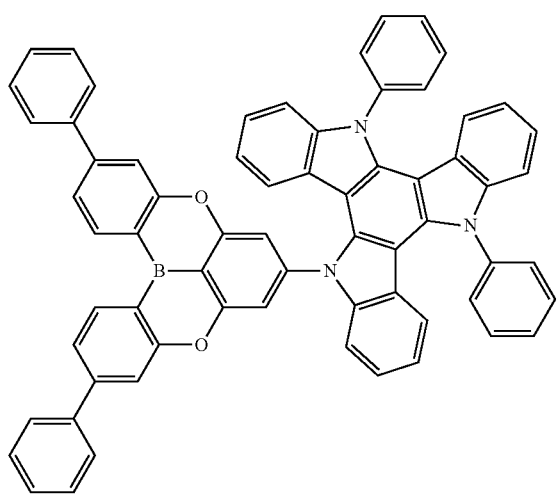
-continued
1-62
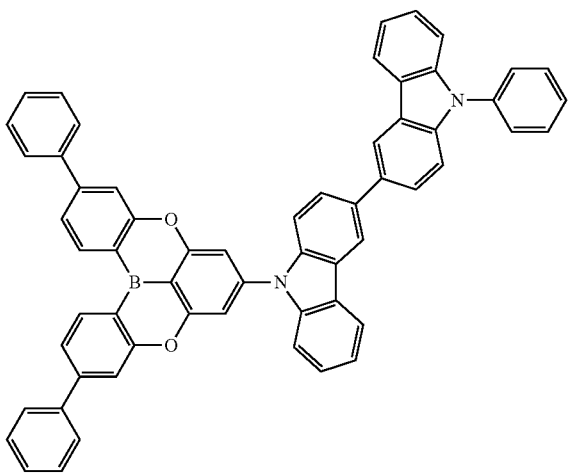
1-63
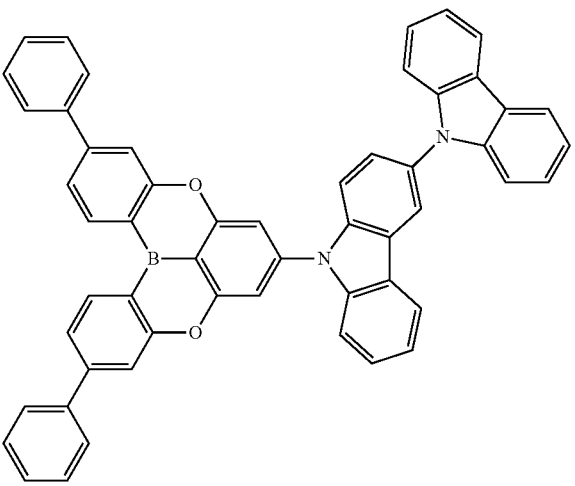
1-64
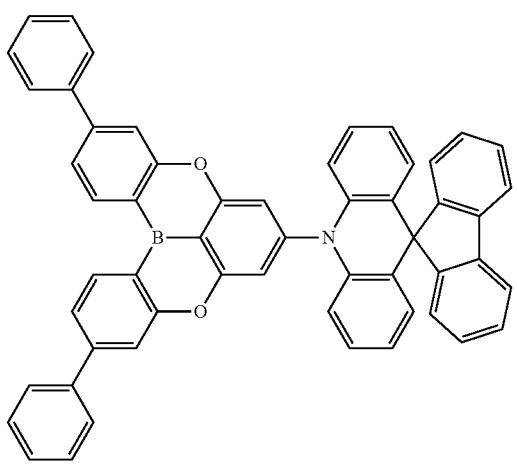

1-65

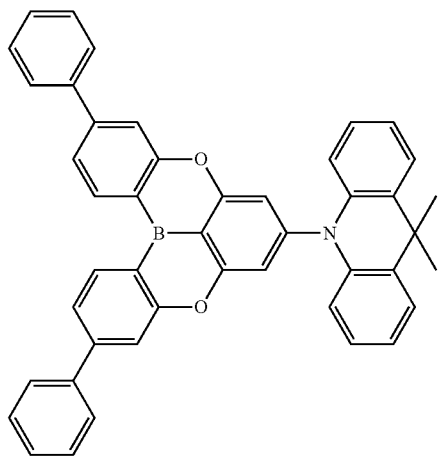

1-66

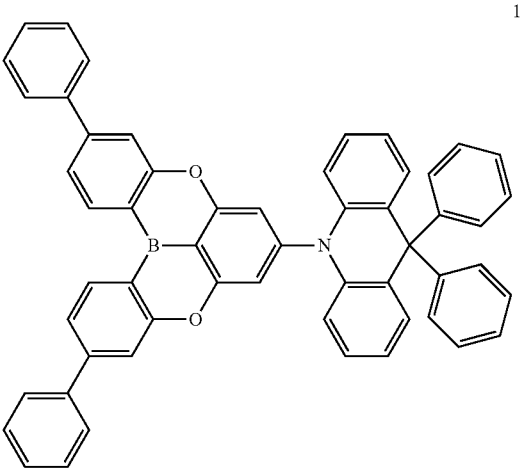

1-67

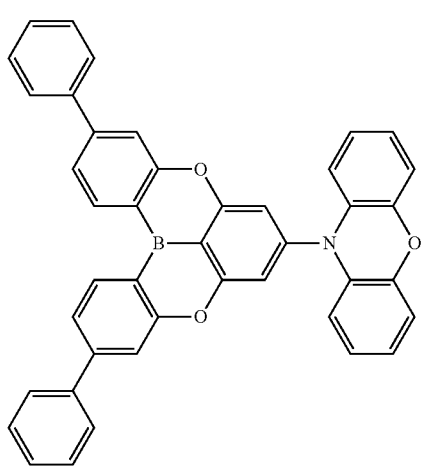

1-68

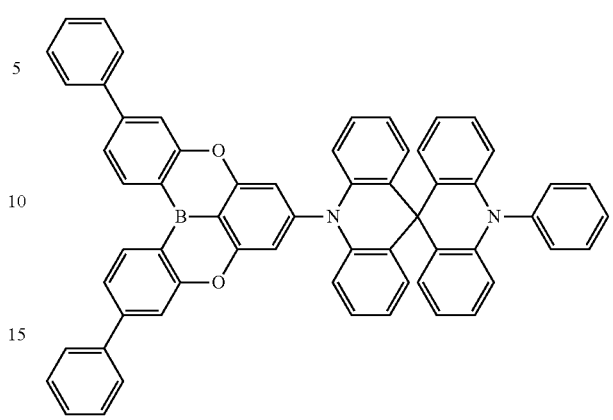

A difference between a singlet energy level and a triplet energy level of the delayed fluorescent material is very small (is less than about 0.3 eV). The energy of the triplet exciton of the delayed fluorescent material is converted into the singlet exciton by a reverse intersystem crossing (RISC) such that the delayed fluorescent material has high quantum efficiency. However, since the delayed fluorescent material has wide full width at half maximum (FWHM), the delayed fluorescent material has a disadvantage in a color purity.

To overcome the problem of the color purity of the delayed fluorescent material, the EML 240 further includes the second compound of the fluorescent material to provide a hyper fluorescence.

The second compound of the fluorescent material is represented by Formula 3.

[Formula 3]

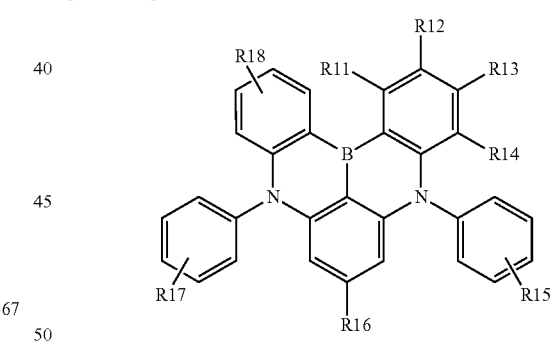

In Formula 3, each of R11 to R14 is independently selected from the group consisting of hydrogen, deuterium, tritium, boron, nitrogen, C1 to C20 alkyl, C6 to C30 aryl, C5 to C30 heteroaryl, C1 to C20 alkylamine, and C6 to C30 arylamine, or adjacent two of R11 to R14 are combined to form a fused ring including boron and nitrogen. Each of R15 and R18 is independently selected from the group consisting of hydrogen, deuterium, tritium, boron and nitrogen, C1 to C20 alkyl, C6 to C30 aryl, C5 to C30 heteroaryl, C1 to C20 alkylamine, and C6 to C30 arylamine.

For example, R12 and R13 can be combined to form a fused ring including boron and nitrogen.

The term of "alkyl", "aryl" and "heteroaryl" can include that substituted one and non-substituted one. When they are substituted, the substituent can be at least one of C1 to C20 alkyl, C6 to C30 aryl and C5 to C30 heteroaryl.

The Formula 3 as the second compound can be represented by Formula 4-1 or Formula 4-2.

[Formula 4-1]

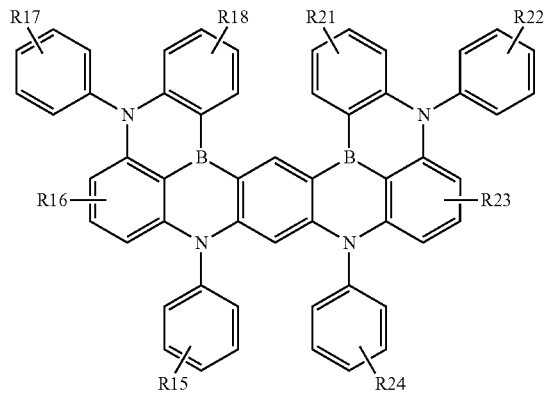

[Formula 4-2]

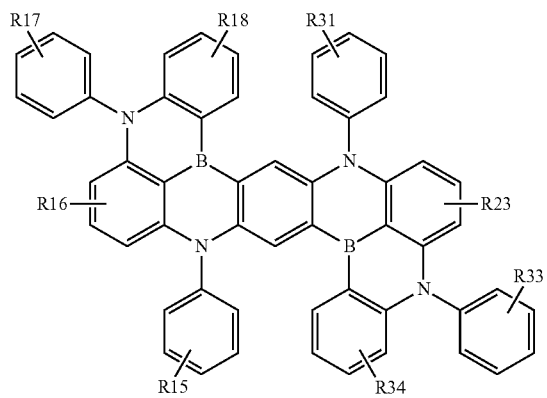

In Formula 4-1, each of R15 to R18 and R21 to R24 is independently selected from the group consisting of hydrogen, deuterium, tritium, boron and nitrogen, C1 to C20 alkyl, C6 to C30 aryl, C5 to C30 heteroaryl, C1 to C20 alkylamine, and C6 to C30 arylamine. In Formula 4-2, each of R15 to R18 and R31 to R34 is independently selected from the group consisting of hydrogen, deuterium, tritium, boron and nitrogen, C1 to C20 alkyl, C6 to C30 aryl, C5 to C30 heteroaryl, C1 to C20 alkylamine, and C6 to C30 arylamine.

For example, the second compound can be one of compounds of Formula 5.

[Formula 5]

2-1

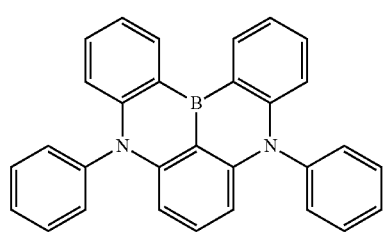

2-2

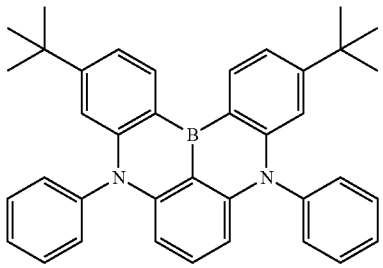

2-3

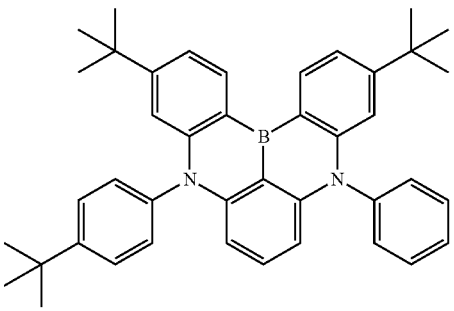

2-4

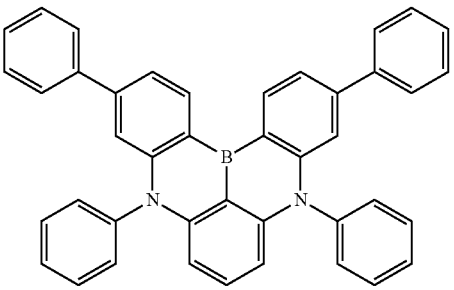

2-5

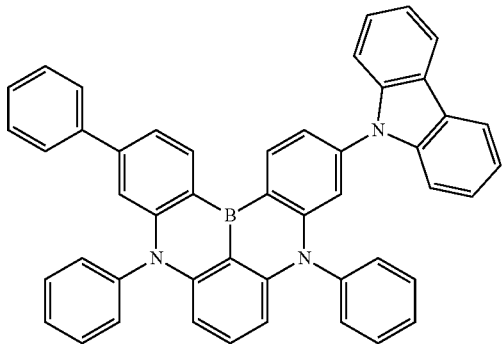

2-6

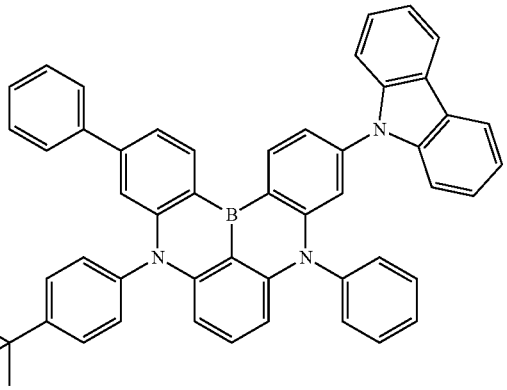

-continued
2-7
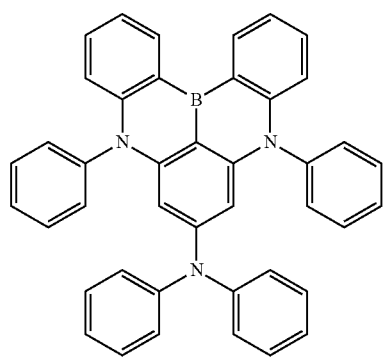
2-11
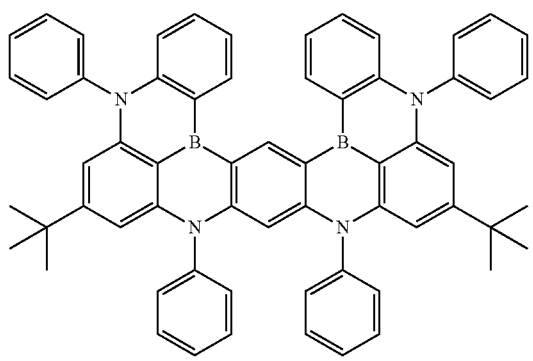
2-8
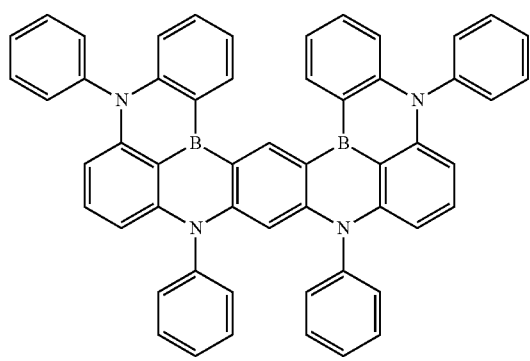
2-12
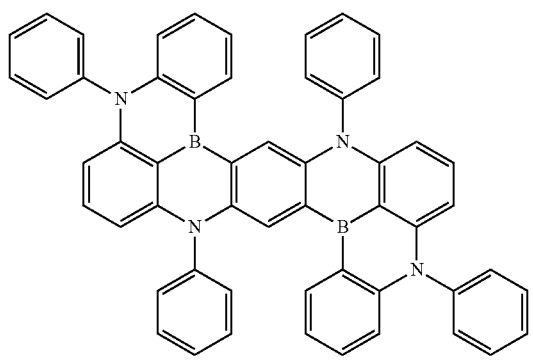
2-9
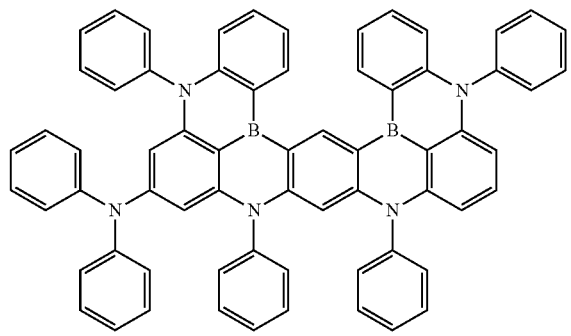
2-13
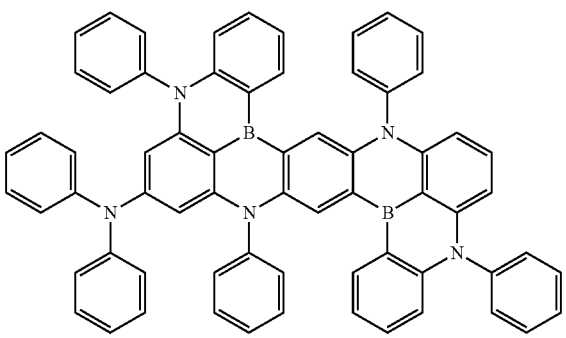
2-10
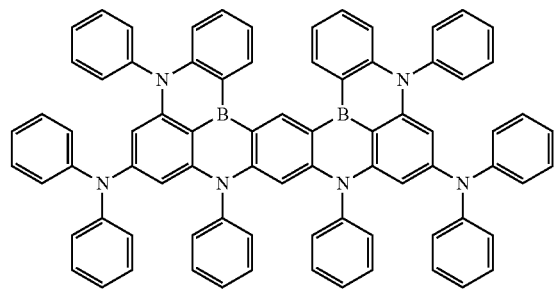
2-14
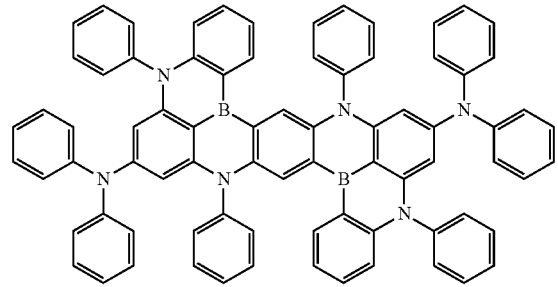

-continued 2-15

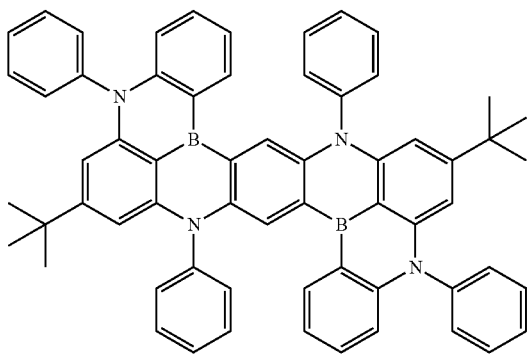

The EML 240 in the OLED D of the present disclosure includes the first compound and the second compound, and the exciton of the first compound is transported into the second compound. As a result, the OLED D provide the emission with narrow FWHM and high emitting efficiency.

In the OLED D of the present disclosure, an energy level of the first compound and an energy level of the second compound satisfy a pre-determined condition such that the transporting efficiency of the exciton from the first compound into the second compound is increased. Accordingly, the emitting efficiency and the color purity of the OLED D and the organic light emitting display device are improved.

In addition, the energy level of the first compound, the energy level of the second compound and an energy level of the third compound satisfy a pre-determined condition such that the emitting efficiency and the color purity of the OLED D and the organic light emitting display device can be further improved.

Figure 4A:
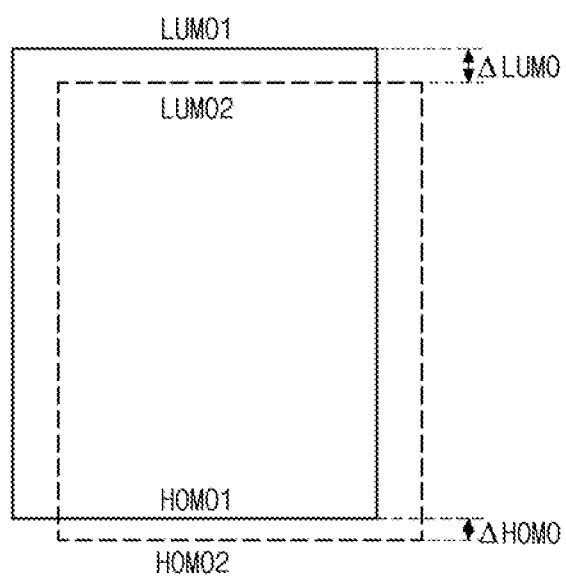
FIGS. 4A to 4D are schematic views illustrating an energy level relation of a first compound and a second compound in the OLED according to one or more embodiments of the present disclosure.
Figure 4B:
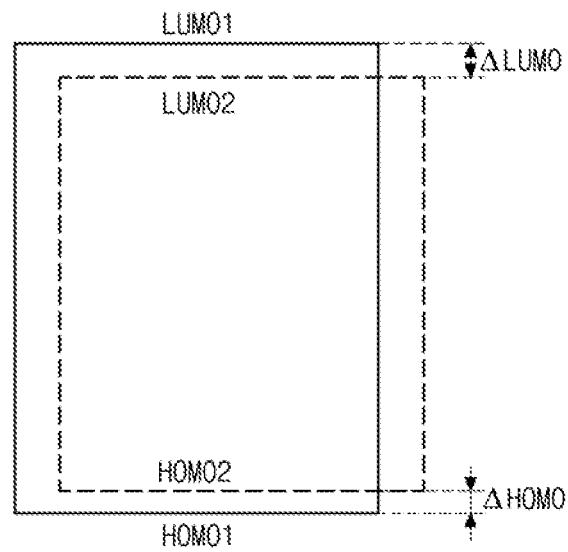

Referring to FIGS. 4A and 4B, which are a schematic view illustrating an energy level relation of a first compound and a second compound in the OLED of the present disclosure, a difference "ΔHOMO" between a highest occupied molecular orbital (HOMO) energy level "HOMO1" of the first compound and a HOMO energy level "HOMO2" of the second compound is less than 0.3 eV.

Namely, the HOMO energy level "HOMO1" of the first compound can be higher than the HOMO energy level "HOMO2" of the second compound as shown in FIG. 4A, or the HOMO energy level "HOMO1" of the first compound can be lower than the HOMO energy level "HOMO2" of the second compound as shown in FIG. 4B. In this instance, by satisfying the condition of "ΔHOMO<0.3 eV", the exciton generated in the host is efficiently transferred into the second compound through the first compound. For example, the difference "ΔHOMO" between the HOMO energy level "HOMO1" of the first compound and the HOMO energy level "HOMO2" of the second compound can be about 0.2 eV or less.

In addition, a difference "ΔLUMO" between a lowest unoccupied molecular orbital (LUMO) energy level "LUMO1" of the first compound and the LUMO energy level "LUMO2" of the second compound is about 0.3 eV or less. The LUMO energy level "LUMO1" of the first compound can be higher than the LUMO energy level "LUMO2" of the second compound.

As mentioned above, the first compound of the delayed fluorescent material uses the singlet exciton energy and the triplet exciton energy for emission. Accordingly, in the EML 240 including the first and second compounds, the energy of the first compound is transported into the second compound, and the light is emitted from the second compound. As a result, the emitting efficiency and the color purity of the OLED are improved.

Figure 4C:
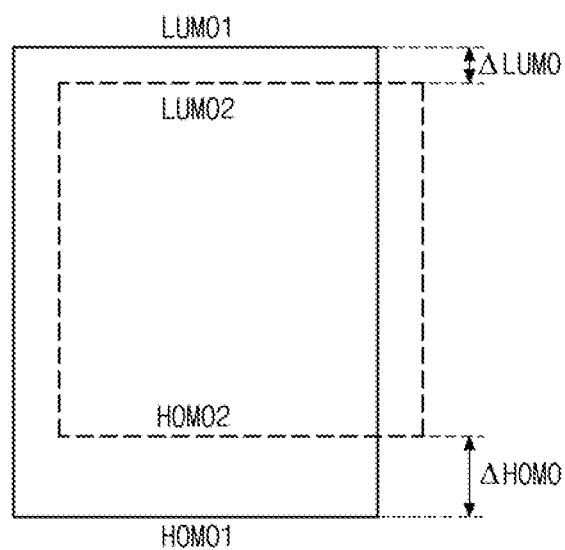
Figure 4D:
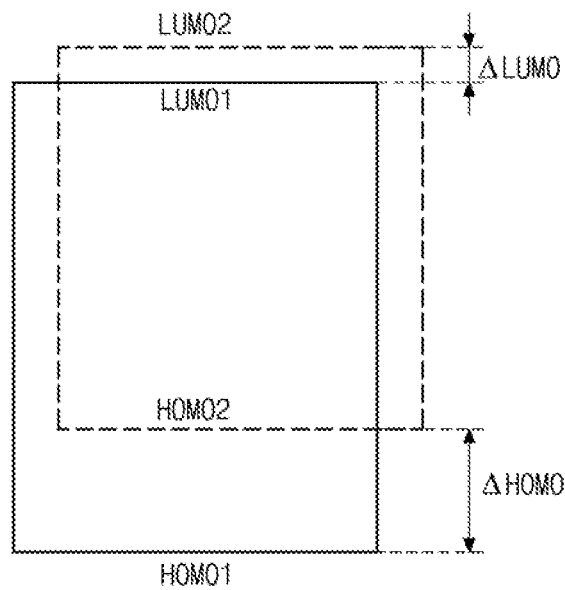

On the other hand, if a delayed fluorescent material and a fluorescent material in the EML do not satisfy the above energy level relation, there is a limitation in the emitting efficiency and/or the color purity. Namely, referring to FIG. 4C, when a difference "ΔHOMO" between a HOMO energy level "HOMO1" of the delayed fluorescent material and a HOMO energy level "HOMO2" of the fluorescent material is greater than or equal to 0.3 eV, a hole can be directly transferred from the host into the fluorescent material such that the emission can be directly generated from the fluorescent material. As a result, the emitting efficiency can be reduced. In addition, as shown in FIG. 4D, when a difference "ΔHOMO" between a HOMO energy level "HOMO1" of the delayed fluorescent material and a HOMO energy level "HOMO2" of the fluorescent material is above 0.5 eV and a LUMO energy level "LUMO1" of the delayed fluorescent material is lower than a LUMO energy level "LUMO2" of the fluorescent material, an exciplex can be generated between a hole trapped in the fluorescent material and the LUMO energy level of the delayed fluorescent material such that the exciplex emission can be generated. As a result, the emitting wavelength range can be shifted.

In the EML 240, the singlet energy level of the first compound is smaller than that of the third compound as the host and greater than that of the second compound. In addition, the triplet energy level of the first compound is smaller than that of the third compound as the host and greater than that of the second compound.

In the EML 240, a weight ratio (weight %) of the first compound can be greater than that of the second compound and can be smaller than that of the third compound. When the weight ratio of the first compound is greater than that of the second compound, the energy of the first compound is sufficiently transferred into the second compound. For example, in the EML 240, the first compound can have a weight % of about 20 to 40, and the second compound can have a weight % of about 0.1 to 5. However, it is not limited thereto.

Figure 5:
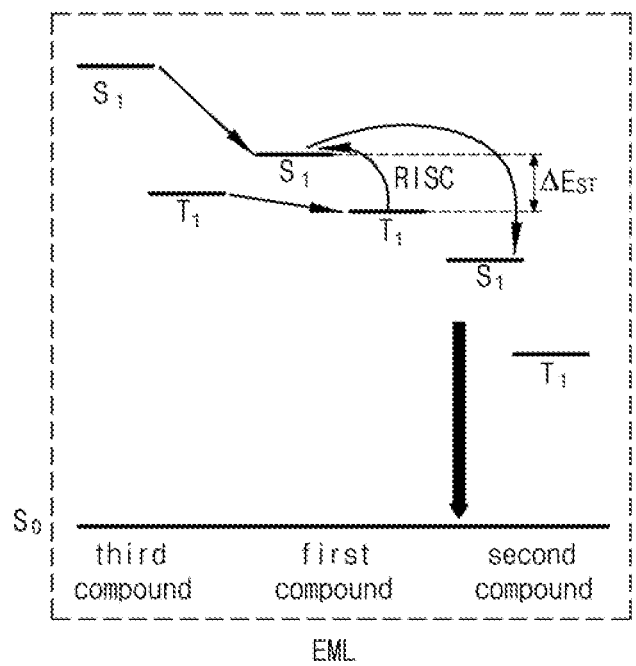
FIG. 5 is a view illustrating an emission mechanism of an OLED according to the second embodiment of the present disclosure.

Referring to FIG. 5, which is a view illustrating an emission mechanism of an OLED according to the second embodiment of the present disclosure, the single level "S1" and the triplet level "T1" generated in the third compound as a host is respectively transferred into the singlet energy "S1" and the triplet level "T1" of the first compound as a delayed fluorescent material. Since a difference between the singlet energy level of the first compound and the triplet energy level of the first compound is relatively small, the triplet energy level "T1" of the first compound is converted into the singlet energy level "S1" of the first compound by the RISC. For example, the difference ($\Delta E_{ST}$) between the singlet energy level of the first compound and the triplet energy level of the first compound can be about 0.3 eV or less. Then, the singlet energy level "S1" of the first compound is transferred into the singlet energy level "S1" of the second compound such that the second compound provide the emission.

As mentioned above, the first compound having a delayed fluorescent property has high quantum efficiency. However, since the first compound has wide FWHM, the first compound has a disadvantage in a color purity. On the other hand, the second compound having a fluorescent property has narrow FWHM. However, since the triplet exciton of the second compound is not involved in the emission, the second compound has a disadvantage in an emitting efficiency.

However, in the OLED D1 of the present disclosure, the singlet energy level of the first compound as the delayed fluorescent material is transferred into the second compound as the fluorescent dopant, and the emission is generated from the second compound. Accordingly, the emitting efficiency and the color purity of the OLED D1 are improved. In addition, since the first compound of Formulas 1 and 2 and the second compound of Formulas 3 to 5 are included in the EML 240, the emitting efficiency and the color purity of the OLED D1 are further improved. [OLED]

An anode (ITO, 50 nm), an HIL (HAT-CN (Formula 6-1), 7 nm), an HTL (NPB (Formula 6-2), 45 nm), an EBL (TAPC (Formula 6-3), 10 nm), an EML (30 nm), an HBL (B3PYMPM (Formula 6-4), 10 nm), an ETL (TPBi (Formula 6-5), 30 nm), an EIL (LiF) and a cathode are sequentially deposited to form an OLED.

[Formula 6-1]

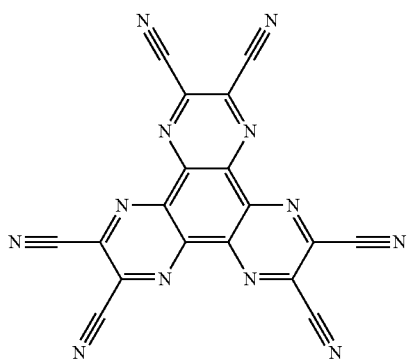

[Formula 6-2]

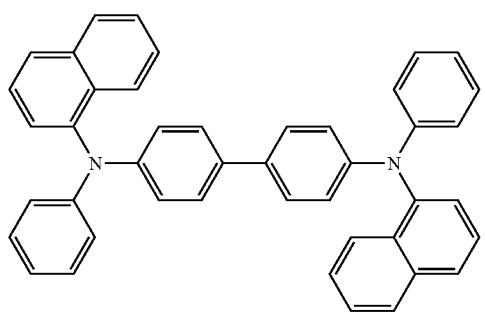

[Formula 6-3]

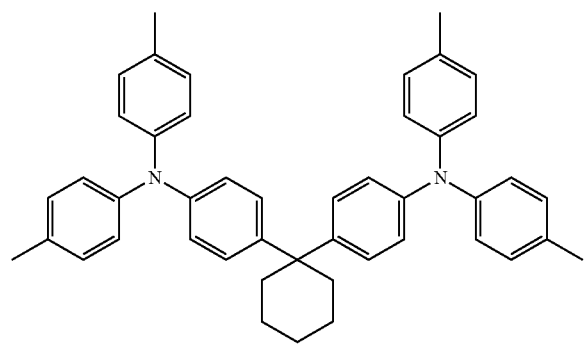

[Formula 6-4]

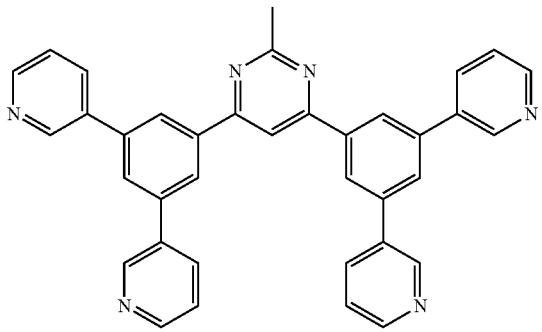

[Formula 6-5]

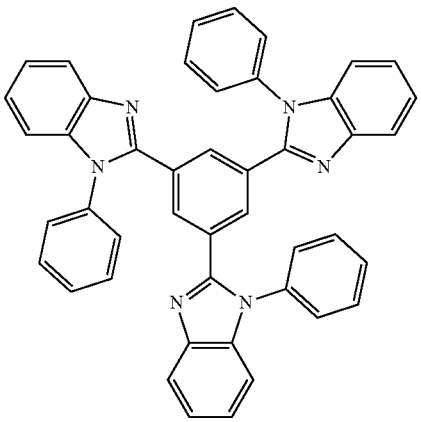

(1) Comparative Example 1 (Ref1)

A host (m-CBP (Formula 7), 69 wt %), a compound 1-1 of Formula 2 (30 wt %) and the compound 8-1 of Formula 8 (1 wt %) are used to form the EML.

(2) Comparative Example 2 (Ref2)

A host (m-CBP (Formula 7), 69 wt %), a compound 1-1 of Formula 2 (30 wt %) and the compound 8-2 of Formula 8 (1 wt %) are used to form the EML.

(3) Comparative Example 3 (Ref3)

A host (m-CBP (Formula 7), 69 wt %), a compound 1-6 of Formula 2 (30 wt %) and the compound 8-1 of Formula 8 (1 wt %) are used to form the EML.

(4) Comparative Example 4 (Ref4)

A host (m-CBP (Formula 7), 69 wt %), a compound 1-6 (30 wt %) and the compound 8-2 of Formula 8 (1 wt %) are used to form the EML.

(5) Comparative Example 5 (Ref5)

A host (m-CBP (Formula 7), 69 wt %), a compound 9-1 of Formula 9 (30 wt %) and the compound 2-1 of Formula 5 (1 wt %) are used to form the EML.

(6) Comparative Example 6 (Ref6)

A host (m-CBP (Formula 7), 69 wt %), a compound 9-1 of Formula 9 (30 wt %) and the compound 2-10 of Formula 5 (1 wt %) are used to form the EML.

(7) Comparative Example 7 (Ref7)

A host (m-CBP (Formula 7), 69 wt %), a compound 9-1 of Formula 9 (30 wt %) and the compound 8-1 of Formula 8 (1 wt %) are used to form the EML.

(8) Comparative Example 8 (Ref8)

A host (m-CBP (Formula 7), 69 wt %), a compound 9-1 of Formula 9 (30 wt %) and the compound 8-2 of Formula 8 (1 wt %) are used to form the EML.

(9) Comparative Example 9 (Ref9)

A host (m-CBP (Formula 7), 69 wt %), a compound 9-2 of Formula 9 (30 wt %) and the compound 2-1 of Formula 5 (1 wt %) are used to form the EML.

(10) Comparative Example 10 (Ref10)

A host (m-CBP (Formula 7), 69 wt %), a compound 9-2 of Formula 9 (30 wt %) and the compound 8-1 of Formula 8 (1 wt %) are used to form the EML.

(11) Example 1 (Ex1)

A host (m-CBP (Formula 7), 69 wt %), the compound 1-1 of Formula 2 (30 wt %) and the compound 2-1 of Formula 5 (1 wt %) are used to form the EML.

(12) Example 2 (Ex2)

A host (m-CBP (Formula 7), 69 wt %), the compound 1-6 of Formula 2 (30 wt %) and the compound 2-1 of Formula 5 (1 wt %) are used to form the EML.

(13) Example 3 (Ex3)

A host (m-CBP (Formula 7), 69 wt %), the compound 1-1 of Formula 2 (30 wt %) and the compound 2-10 of Formula 5 (1 wt %) are used to form the EML.

(14) Example 4 (Ex4)

A host (m-CBP (Formula 7), 69 wt %), the compound 1-6 of Formula 2 (30 wt %) and the compound 2-10 of Formula 5 (1 wt %) are used to form the EML.

(15) Example 5 (Ex5)

A host (m-CBP (Formula 7), 69 wt %), the compound 1-1 of Formula 2 (30 wt %) and the compound 2-6 of Formula 5 (1 wt %) are used to form the EML.

(16) Example 6 (Ex6)

A host (m-CBP (Formula 7), 69 wt %), the compound 1-6 of Formula 2 (30 wt %) and the compound 2-6 of Formula 5 (1 wt %) are used to form the EML.

[Formula 7]

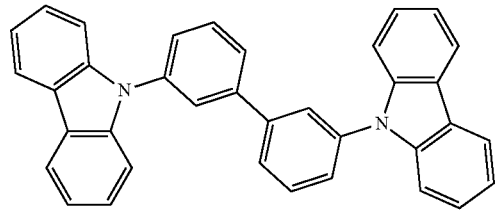

[Formula 8]

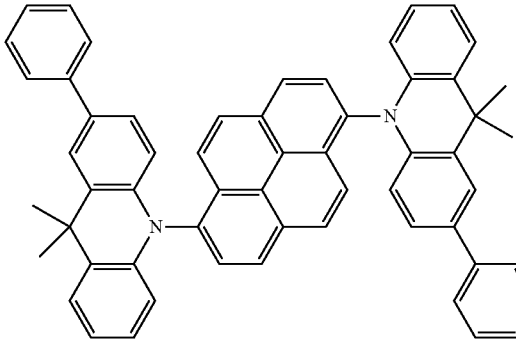

8-1

8-2

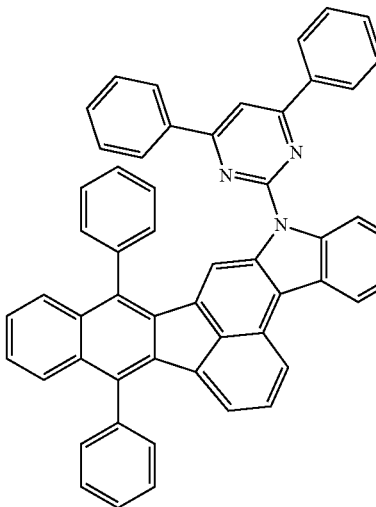

[Formula 9]

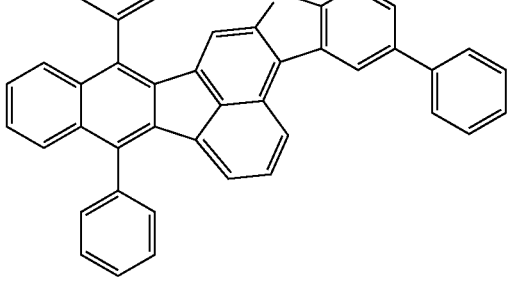

9-2

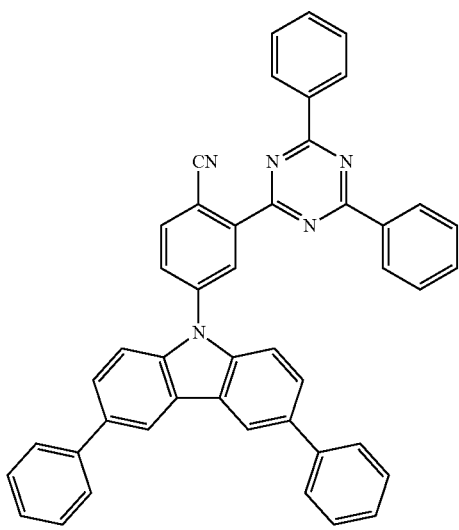

The emitting properties of the OLED in Comparative Examples 1 to 10 and Examples 1 to 6 are measured and listed in Table 1.

TABLE 1

|  | Dopant1 | Dopant2 | V | cd/A | lm/W | CIE(y) | EQE [%] | Δ HOMO [eV] | Exciplex |
|---|---|---|---|---|---|---|---|---|---|
| Ref1 | 1-1 | 8-1 | 4.98 | 12.1 | 7.6 | 0.184 | 9.4 | 0.3 | X |
| Ref2 | 1-1 | 8-2 | 4.82 | 13.7 | 8.9 | 0.191 | 10.4 | 0.3 | X |
| Ref3 | 1-6 | 8-1 | 5.22 | 7.9 | 4.7 | 0.154 | 7.0 | 0.4 | X |
| Ref4 | 1-6 | 8-2 | 6.14 | 5.6 | 2.9 | 0.163 | 5.3 | 0.4 | X |
| Ref5 | 9-1 | 2-1 | 4.98 | 12.1 | 7.6 | 0.208 | 8.5 | 0.3 | X |
| Ref6 | 9-1 | 2-10 | 4.87 | 12.3 | 8.4 | 0.216 | 10.8 | 0.5 | X |
| Ref7 | 9-1 | 8-1 | 3.53 | 16.4 | 10.7 | 0.417 | 9.4 | 0.7 | ○ |
| Ref8 | 9-1 | 8-2 | 3.57 | 24.5 | 21.0 | 0.336 | 10.7 | 0.7 | ○ |
| Ref9 | 9-2 | 2-1 | 5.05 | 10.2 | 6.7 | 0.212 | 6.9 | 0.4 | X |
| Ref10 | 9-2 | 8-1 | 3.35 | 17.1 | 13.5 | 0.405 | 8.3 | 0.6 | ○ |
| Ex1 | 1-1 | 2-1 | 3.72 | 46.1 | 38.9 | 0.207 | 21.2 | 0.1 | X |
| Ex2 | 1-6 | 2-1 | 3.71 | 47.2 | 41.7 | 0.185 | 20.3 | 0 | X |
| Ex3 | 1-1 | 2-10 | 3.78 | 40.2 | 33.7 | 0.201 | 20.6 | 0.1 | X |
| Ex4 | 1-6 | 2-10 | 3.83 | 41.4 | 33.9 | 0.149 | 19.8 | 0.2 | X |
| Ex5 | 1-1 | 2-6 | 3.47 | 38.3 | 30.4 | 0.192 | 18.5 | 0.0 | X |
| Ex6 | 1-6 | 2-6 | 3.58 | 37.1 | 31.5 | 0.183 | 17.8 | 0.1 | X |

As shown in Table 1, in comparison to the OLED of Comparative Examples 1 to 10, the emitting properties of the OLED in Examples 1 to 6 using the first compound of Formulas 1 and 2 and the second compound of Formulas 3 to 5 are improved.

The HOMO energy level and the LUMO energy level of the compounds 1-1 and 1-6 of Formula 2 as the first compound of the present disclosure, the compounds 2-1, 2-6 and 2-10 of Formula 5 as the second compound of the present disclosure, the compounds 8-1 and 8-2 of Formula 8, and the compounds 9-1 and 9-2 of Formula 9 are measured and listed Table 2.

TABLE 2

| compound | HOMO [eV] | LUMO [eV] |
|---|---|---|
| 1-1 | −5.5 | −2.6 |
| 1-6 | −5.6 | −2.7 |
| 2-1 | −5.6 | −2.9 |
| 2-6 | −5.4 | −2.8 |
| 2-10 | −5.5 | −2.9 |

TABLE 2-continued

| compound | HOMO [eV] | LUMO [eV] |
|---|---|---|
| 8-1 | −5.2 | −2.7 |
| 8-2 | −5.2 | −2.6 |
| 9-1 | −5.9 | −2.8 |
| 9-2 | −6.0 | −3.0 |

In the OLED of Examples 1 to 6, the difference between the HOMO energy level of the first compound and the HOMO energy level of the second compound is less than 0.3 eV such that the emitting efficiency of the OLED is improved. On the other hand, in the OLED of Comparative Examples 1 to 10, the difference between the HOMO energy level of the first compound and the HOMO energy level of the second compound is greater than or equal to 0.3 eV such that the emitting efficiency of the OLED is lowered and/or the emitting wavelength range is shifted.

Figure 6:
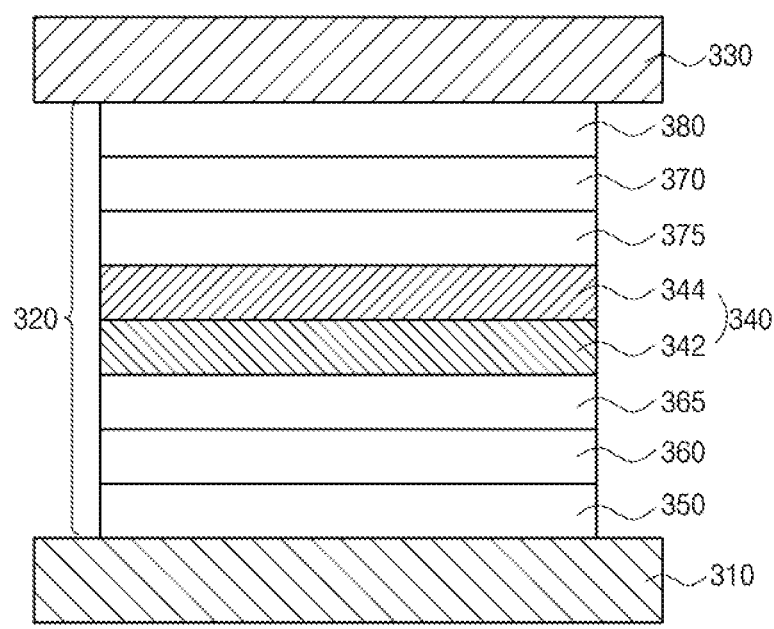
FIG. 6 is a schematic cross-sectional view of an OLED according to a third embodiment of the present disclosure.

FIG. 6 is a schematic cross-sectional view of an OLED according to a third embodiment of the present disclosure.

As shown in FIG. 6, an OLED D2 according to the third embodiment of the present disclosure includes the first and second electrodes 310 and 330, which face each other, and the light emitting layer 320 therebetween. The light emitting layer 320 includes an EML 340. The organic light emitting display device 100 (of FIG. 2) may include a red pixel region, a green pixel region and a blue pixel region, and the OLED D2 may be positioned in the blue pixel region.

The first electrode 310 can be an anode, and the second electrode 330 can be a cathode.

The light emitting layer 320 can further includes at least one of the HTL 360 between the first electrode 310 and the EML 340 and the ETL 370 between the second electrode 330 and the EML 340.

In addition, the light emitting layer 320 can further include at least one of the HIL 350 between the first electrode 310 and the HTL 360 and the EIL 380 between the second electrode 330 and the ETL 370.

Moreover, the light emitting layer 320 can further include at least one of the EBL 365 between the HTL 360 and the EML 340 and the HBL 375 between the EML 340 and the ETL 370.

The EML 340 includes a first EML (a first layer or a lower emitting material layer) 342 and a second EML (a second layer or an upper emitting material layer) 344 sequentially stacked over the first electrode 310. Namely, the second EML 344 is positioned between the first EML 342 and the second electrode 330.

In the EML 340, one of the first and second EMLs 342 and 344 includes a first compound including a hexagonal-ring moiety (e.g., six-membered ring), which includes one boron atom, one oxygen atom and four carbon atoms, and the other one of the first and second EMLs 342 and 344 includes a second compound including a hexagonal-ring moiety, which includes one boron atom, one nitrogen atom and four carbon atoms.

For example, the first compound can be represented by Formula 1 and can be one of the compounds in Formula 2. The first compound has a delayed fluorescent property. The second compound can be represented by one of Formulas 3, 4-1 and 4-2 and can be one of the compounds in Formula 5. The second compound has a fluorescent property.

In addition, the first and second EMLs 342 and 344 further include a fourth compound and a fifth compound as a host, respectively. The fourth compound in the first EML 342 and the fifth compound in the second EML 344 can be same or different. For example, each of the host of the first EML 342, i.e., the fourth compound, and the host of the second EML 344, i.e., the fifth compound, can be the above third compound.

The OLED, where the first EML 342 includes the first compound of the delayed fluorescent material, will be explained.

As mentioned above, the first compound having a delayed fluorescent property has high quantum efficiency. However, since the first compound has wide FWHM, the first compound has a disadvantage in a color purity. On other hand, the second compound having a fluorescent property has narrow FWHM. However, the triplet exciton of the second compound is not involved in the emission, the second compound has a disadvantage in an emitting efficiency.

In the OLED D2, since the triplet exciton energy of the first compound in the first EML 342 is converted into the singlet exciton energy of the first compound and the singlet exciton energy of the first compound is transferred into the singlet exciton energy of the second compound in the second EML 344 by the RISC, the second compound provides the emission. Accordingly, both the singlet exciton energy and the triplet exciton energy are involved in the emission such that the emitting efficiency is improved. In addition, since the emission is provided from the second compound of the fluorescent material, the emission having narrow FWHM is provided.

As mentioned above, the difference between the HOMO energy level of the first compound and the HOMO energy level of the second compound is less than 0.3 eV such that the emitting efficiency of the OLED D2 is further improved.

In the first EML 342, the weight ratio of the fourth compound can be equal to or greater than that of the first compound. In the second EML 344, the weight ratio of the fifth compound can be equal to or less than that of the second compound.

In addition, a weight ratio of the first compound in the first EML 342 can be greater than that of the second compound in the second EML 344. As a result, the energy is sufficiently transferred from the first compound in the first EML 342 into the second compound in the second EML 344 by a fluorescence resonance energy transfer (FRET). For example, the first compound can have a weight % of about 1 to 50 in the first EML 342, preferably about 10 to 40, more preferably about 20 to 40. The second compound can have a weight % of about 0.1 to 10 in the second EML 344, preferably about 0.1 to 5.

When the HBL 375 is positioned between the second EML 344 and the ETL 370, the fifth compound as the host of the second EML 344 can be same as a material of the HBL 375. In this instance, the second EML 344 can have a hole blocking function with an emission function. Namely, the second EML 344 can serve as a buffer layer for blocking the hole. When the HBL 375 is omitted, the second EML 344 can serve as an emitting material layer and a hole blocking layer.

When the first EML 342 includes the second compound of the fluorescent material and the EBL 365 is positioned between the HTL 360 and the first EML 342, the host of the first EML 342 can be same as a material of the EBL 365. In this instance, the first EML 342 can have an electron blocking function with an emission function. Namely, the first EML 342 can serve as a buffer layer for blocking the electron. When the EBL 365 is omitted, the first EML 342 can serve as an emitting material layer and an electron blocking layer.

Figure 7:
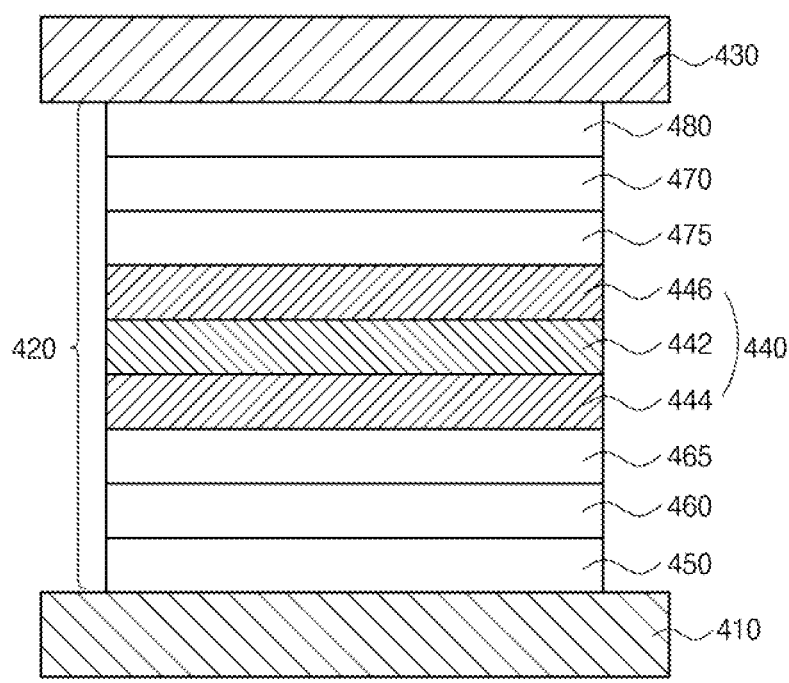
FIG. 7 is a schematic cross-sectional view of an OLED according to a fourth embodiment of the present disclosure.

FIG. 7 is a schematic cross-sectional view of an OLED according to a fourth embodiment of the present disclosure.

As shown in FIG. 7, an OLED D3 according to the fourth embodiment of the present disclosure includes the first and second electrodes 410 and 430, which face each other, and the light emitting layer 420 therebetween. The light emitting layer 420 includes an EML 440. The organic light emitting display device 100 (of FIG. 2) may include a red pixel region, a green pixel region and a blue pixel region, and the OLED D3 may be positioned in the blue pixel region.

The first electrode 410 can be an anode, and the second electrode 430 can be a cathode.

The light emitting layer 420 can further includes at least one of the HTL 460 between the first electrode 410 and the EML 440 and the ETL 470 between the second electrode 430 and the EML 440.

In addition, the light emitting layer 420 can further include at least one of the HIL 450 between the first electrode 410 and the HTL 460 and the EIL 480 between the second electrode 430 and the ETL 470.

Moreover, the light emitting layer 420 can further include at least one of the EBL 465 between the HTL 460 and the EML 440 and the HBL 475 between the EML 440 and the ETL 470.

The EML 440 includes a first EML (a first layer, an intermediate emitting material layer) 442, a second EML (a second layer, a lower emitting material layer) 444 between the first EML 442 and the first electrode 410, and a third EML (a third layer, an upper emitting material layer) 446 between the first EML 442 and the second electrode 430. Namely, the EML 440 has a triple-layered structure of the second EML 444, the first EML 442 and the third EML 446 sequentially stacked.

For example, the first EML 442 can be positioned between the EBL 465 and the HBL 475, the second EML 444 can be positioned between the EBL 465 and the first EML 442, and the third EML 446 can be positioned between the HBL 475 and the first EML 442.

In the EML 440, the first EML 442 includes a first compound including a hexagonal-ring moiety, which includes one boron atom, one oxygen atom and four carbon atoms, and each of the second and third EMLs 444 and 446 includes a second compound including a hexagonal-ring moiety, which includes one boron atom, one nitrogen atom and four carbon atoms.

For example, the first compound can be represented by Formula 1 and can be one of the compounds in Formula 2. The first compound has a delayed fluorescent property. The second compound can be represented by one of Formulas 3, 4-1 and 4-2 and can be one of the compounds in Formula 5.

The second compound has a fluorescent property. The second compound of the second EML 444 and the second compound of the third EML 446 can be same or different.

In addition, the first to third EMLs 442, 444 and 446 further include a sixth compound, a seventh compound and an eighth compound as a host, respectively. The sixth compound in the first EML 442, the seventh compound in the second EML 444 and the eighth compound in the third EML 446 can be same or different. For example, each of the host of the first EML 442, i.e., the sixth compound, the host of the second EML 444, i.e., the seventh compound, and the host of the third EML 446, i.e., the eighth compound can be the above third compound.

In the OLED D3, since the triplet exciton energy of the first compound in the first EML 442 is converted into the singlet exciton energy of the first compound and the singlet exciton energy of the first compound is transferred into the singlet exciton energy of the second compound in the second EML 444 and into the singlet exciton energy of the second compound in the third EML 446 by the RISC, the second compound in the second and third EMLs 444 and 446 provides the emission. Accordingly, both the singlet exciton energy and the triplet exciton energy are involved in the emission such that the emitting efficiency is improved. In addition, since the emission is provided from the second compound of the fluorescent material, the emission having narrow FWHM is provided.

As mentioned above, the difference between the HOMO energy level of the first compound and the HOMO energy level of the second compound is less than 0.3 eV such that the emitting efficiency of the OLED D2 is further improved.

In the first EML 442, the weight ratio of the sixth compound can be equal to or greater than that of the first compound. In the second EML 444, the weight ratio of the seventh compound can be equal to or less than that of the second compound. In the third EML 446, the weight ratio of the eighth compound can be equal to or less than that of the second compound.

In addition, a weight ratio of the first compound in the first EML 442 can be greater than each of that of the second compound in the second EML 444 and that of the second compound in the third EML 446. As a result, the energy is sufficiently transferred from the first compound in the first EML 442 into the second compound in the second EML 444 and the second compound in the third EML 446 by a fluorescence resonance energy transfer (FRET). For example, the first compound can have a weight % of about 1 to 50 in the first EML 442, preferably about 10 to 40, more preferably about 20 to 40. The second compound can have a weight % of about 0.1 to 10 in each of the second EML 444 and the third EML 446, preferably about 0.1 to 5.

The seventh compound as the host of the second EML 444 can be same as a material of the EBL 465. In this instance, the second EML 444 can have an electron blocking function with an emission function. Namely, the second EML 444 can serve as a buffer layer for blocking the electron. When the EBL 465 is omitted, the second EML 444 can serve as an emitting layer and an electron blocking layer.

The eighth compound as the host of the third EML 446 can be same as a material of the HBL 475. In this instance, the third EML 446 can have a hole blocking function with an emission function. Namely, the third EML 446 can serve as a buffer layer for blocking the hole. When the HBL 475 is omitted, the third EML 446 can serve as an emitting layer and a hole blocking layer.

The seventh compound in the second EML 444 can be same as a material of the EBL 465, and the eighth compound in the third EML 446 can be same as a material of the HBL 475. In this instance, the second EML 444 can have an electron blocking function with an emission function, and the third EML 446 can have a hole blocking function with an emission function. Namely, the second EML 444 can serve as a buffer layer for blocking the electron, and the third EML 446 can serve as a buffer layer for blocking the hole. When the EBL 465 and the HBL 475 are omitted, the second EML 444 can serve as an emitting material layer and an electron blocking layer and the third EML 446 serves as an emitting material layer and a hole blocking layer.

Figure 8:
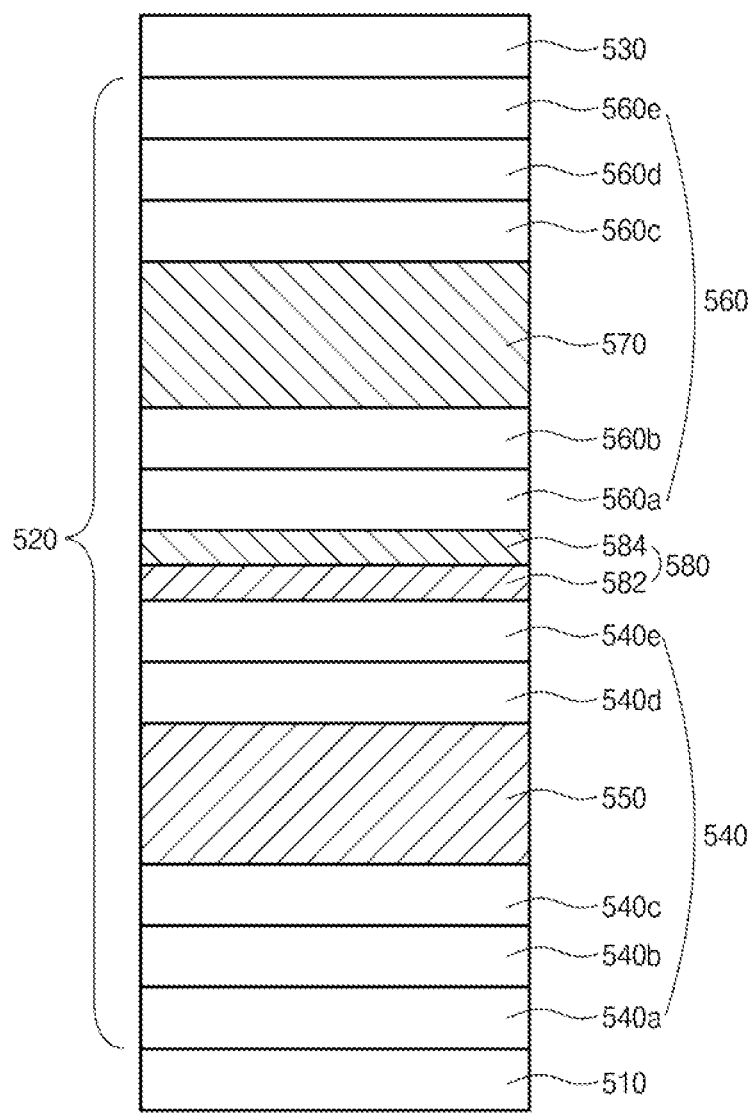
FIG. 8 is a schematic cross-sectional view of an OLED according to a fifth embodiment of the present disclosure.

FIG. 8 is a schematic cross-sectional view of an OLED according to a fifth embodiment of the present disclosure.

As shown in FIG. 8, the OLED D4 includes the first and second electrodes 510 and 530, which face each other, and the emitting layer 520 therebetween. The organic light emitting display device 100 (of FIG. 2) may include a red pixel region, a green pixel region and a blue pixel region, and the OLED D4 may be positioned in the blue pixel region.

The first electrode 510 may be an anode, and the second electrode 530 may be a cathode.

The emitting layer 520 includes a first emitting part 540 including a first EML 550 and a second emitting part 560 including a second EML 570. In addition, the emitting layer 520 may further include a charge generation layer (CGL) 580 between the first and second emitting parts 540 and 560.

The CGL 580 is positioned between the first and second emitting parts 540 and 560 such that the first emitting part 540, the CGL 580 and the second emitting part 560 are sequentially stacked on the first electrode 510. Namely, the first emitting part 540 is positioned between the first electrode 510 and the CGL 580, and the second emitting part 580 is positioned between the second electrode 530 and the CGL 580.

The first emitting part 540 includes the first EML 550.

In addition, the first emitting part 540 may further include at least one of a first HTL 540b between the first electrode 510 and the first EML 550, an HIL 540a between the first electrode 510 and the first HTL 540b, and a first ETL 540e between the first EML 550 and the CGL 580.

Moreover, the first emitting part 540 may further include at least one of a first EBL 540c between the first HTL 540b and the first EML 550 and a first HBL 540d between the first EML 550 and the first ETL 540e.

The second emitting part 560 includes the second EML 570.

In addition, the second emitting part 560 may further include at least one of a second HTL 560a between the CGL 580 and the second EML 570, a second ETL 560d between the second EML 570 and the second electrode 164, and an EIL 560e between the second ETL 560d and the second electrode 530.

Moreover, the second emitting part 560 may further include at least one of a second EBL 560b between the second HTL 560a and the second EML 570 and a second HBL 560c between the second EML 570 and the second ETL 560d.

The CGL 580 is positioned between the first and second emitting parts 540 and 560. Namely, the first and second emitting parts 540 and 560 are connected to each other through the CGL 580. The CGL 580 may be a P-N junction type CGL of an N-type CGL 582 and a P-type CGL 584.

The N-type CGL 582 is positioned between the first ETL 540e and the second HTL 560a, and the P-type CGL 584 is positioned between the N-type CGL 582 and the second HTL 560a. The N-type CGL 582 provides an electron into the first EML 550 of the first emitting part 540, and the P-type CGL 584 provides a hole into the second EML 570 of the second emitting part 560.

The first and second EMLs 550 and 570 are a blue EML. At least one of the first and second EMLs 550 and 570 includes the first compound of Formula 1 and the second compound of Formula 3. For example, the first EML 550 may include the first being the delayed fluorescent compound and the second compound being the fluorescent compound. The first EML 550 may further include a third compound being a host.

In the first EML 550, the weight ratio of the first compound may be greater than that of the second compound and smaller than that of the third compound. When the weight ratio of the first compound is greater than that of the second compound, the energy transfer from the first compound into the second compound is sufficiently generated. For example, in the first EML 550, the first compound may have a weight % of about 20 to 40, the second compound may have a weight % of about 0.1 to 10, and the third compound may have a weight % of about 50 to 80. However, it is not limited thereto.

The second EML 570 may include the first compound of Formula 1 and the second compound of Formula 3. Namely, the second EML 570 may have the same organic compound as the first EML 550. Alternatively, the second EML 570 may include a compound being different from at least one of the first compound and the second compound in the first EML 550 such that the first and second EMLs 550 and 570 have a different in an emitted-light wavelength or an emitting efficiency.

In the OLED D4 of the present disclosure, the singlet energy level of the first compound as the delayed fluorescent material is transferred into the second compound as the fluorescent dopant, and the emission is generated from the second compound. Accordingly, the emitting efficiency and the color purity of the OLED D4 are improved. In addition, since the first compound of Formulas 1 and 2 and the second compound of Formulas 3 to 5 are included in the first EML 550, the emitting efficiency and the color purity of the OLED D1 are further improved. Moreover, since the OLED D4 has a two-stack structure (double-stack structure) with two green EMLs, the color sense of the OLED D4 is improved and/or the emitting efficiency of the OLED D4 is optimized.

Figure 9:
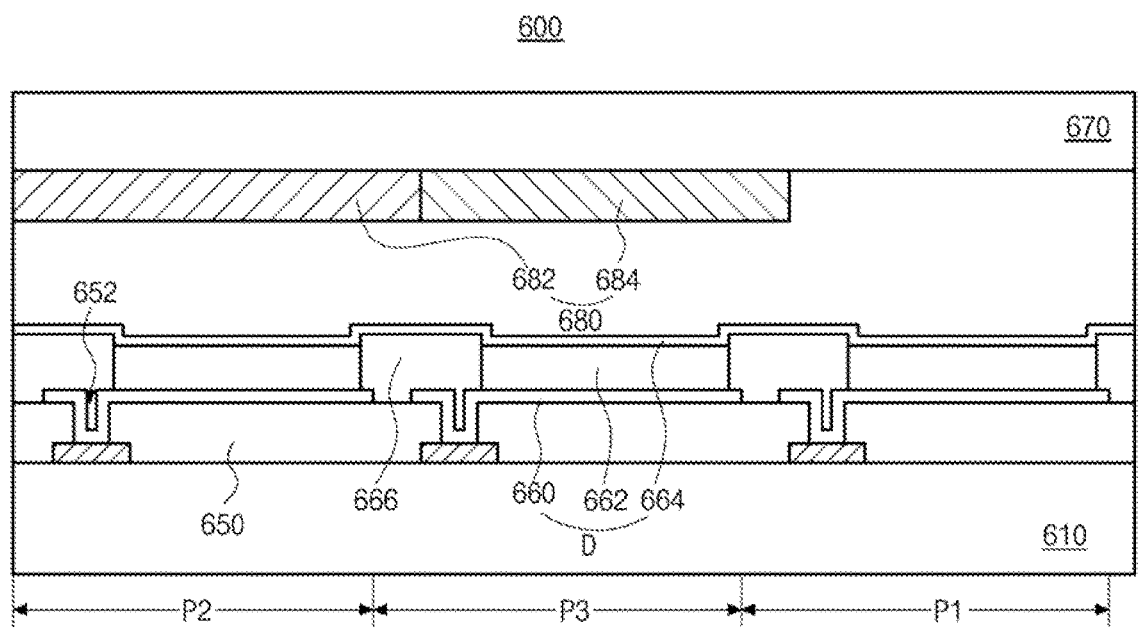
FIG. 9 is a schematic cross-sectional view of an organic light emitting display device according to a sixth embodiment of the present disclosure.

FIG. 9 is a schematic cross-sectional view of an organic light emitting display device according to a sixth embodiment of the present disclosure.

As shown in FIG. 9, the organic light emitting display device 600 includes a first substrate 610, where a first pixel region P1, a second pixel region P2 and a third pixel region P3 are defined, a second substrate 670 facing the first substrate 610, an OLED D, which is positioned between the first and second substrates 610 and 670 and providing blue emission, and a color conversion layer 680 between the OLED D and the second substrate 670. For example, the first pixel region P1 may be a blue pixel region, the second pixel region P2 may be a red pixel region, and the third pixel region P3 may be a green pixel region.

Each of the first and second substrates 610 and 670 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A TFT Tr, which corresponding to each of the red, green and blue pixels RP, GP and BP, is formed on the first substrate 610. Alternatively, a buffer layer (not shown) may be formed on the first substrate 610, and the TFT Tr may be formed on the buffer layer.

As explained with FIG. 2, the TFT Tr may include a semiconductor layer, a gate electrode, a source electrode and a drain electrode and may serve as a driving element.

A planarization layer (or passivation layer) 650 is formed on the TFT Tr. The planarization layer 1050 has a flat top surface and includes a drain contact hole 652 exposing the drain electrode of the TFT Tr.

The OLED D is disposed on the planarization layer 650 and includes a first electrode 660, an emitting layer 662 and a second electrode 664. The first electrode 660 is connected to the drain electrode of the TFT Tr, and the emitting layer 662 and the second electrode 664 are sequentially stacked on the first electrode 660.

The first electrode 660 is formed to be separate in the first to third pixel regions P1 to P3, and the second electrode 664 is formed as one-body to cover the first to third pixel regions P1 to P3.

The first electrode 660 is one of an anode and a cathode, and the second electrode 664 is the other one of the anode and the cathode. In addition, the first electrode 660 may be a reflecting electrode, and the second electrode 664 may be a light transmitting electrode (or a semi-transmitting electrode).

For example, the first electrode 660 may be the anode and may be formed of a conductive material having a relatively high work function. The first electrode 660 may include a transparent conductive oxide material layer formed of a transparent conductive oxide (TCO) material and a reflection layer (or a reflection electrode layer). The second electrode 664 may be the cathode and may include a metallic material layer formed of a low resistance metallic material having a relatively low work function. For example, the first electrode 660 may have a structure of ITO/Ag/ITO or ITO/APC/ITO, but it is not limited thereto. The second electrode 664 may include Al, Mg, Ca, Ag or Mg—Ag alloy and may have a thin profile to be transparent (or semi-transparent).

A bank layer 666 is formed on the planarization layer 650 to cover an edge of the first electrode 660. Namely, the bank layer 666 is positioned at a boundary of the first to third pixel regions P1 to P3 and exposes a center of the first electrode 660 in the first to third pixel regions P1 to P3. Since the OLED D emits the blue light in the first to third pixel regions P1 to P3, the emitting layer 662 may be formed as a common layer in the first to third pixel regions P1 to P3 without separation in the first to third pixel regions P1 to P3. The bank layer 666 may be formed to prevent the current leakage at an edge of the first electrode 660 and may be omitted.

The emitting layer 662 as an emitting unit is formed on the first electrode 660. For example, the emitting layer 662 may have a structure of FIG. 3, FIG. 6 or FIG. 8 and may provide a blue light. Namely, the OLED D in the first to third pixel regions P1 to P3 emits the blue light.

The color conversion layer 680 includes a first color conversion layer 682 corresponding to the second pixel region P2 and a second color conversion layer 684 corresponding to the third pixel region P3. The first color conversion layer 682 may be a red color conversion layer, and the second color conversion layer 684 may be a green color conversion layer. For example, the color conversion layer 680 may include an inorganic color conversion material such as a quantum dot.

The blue light from the OLED D is converted into the red light by the first color conversion layer 682 in the second pixel region P2, and the blue light from the OLED D is converted into the green light by the second color conversion layer 684 in the third pixel region P3.

Accordingly, the organic light emitting display device 600 can display a full-color image.

On the other hand, in the bottom emission type organic light emitting display device 600, the color conversion layer 680 is disposed between the OLED D and the first substrate 610.

Although not shown, the organic light emitting display device 600 may further include a color filter layer between the second substrate 670 and the color conversion layer 680. In this instance, the color purity of the organic light emitting display device 600 may be further improved. On the other hand, in the bottom emission type organic light emitting display device 600, the color filter layer may be disposed between the first substrate 610 and the color conversion layer 680.

Figure 10:
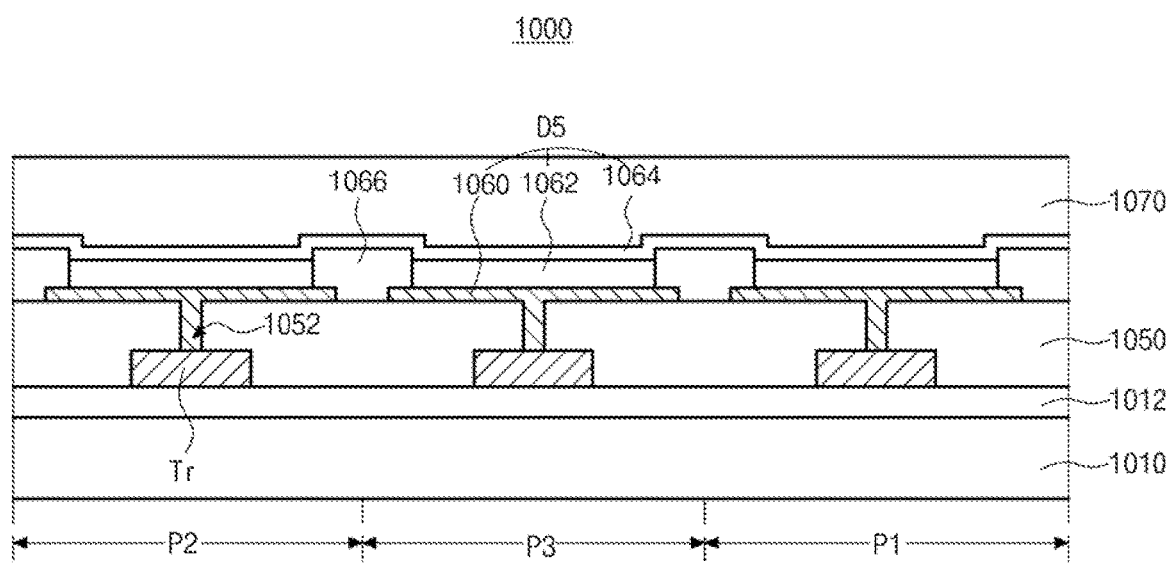
FIG. 10 is a schematic cross-sectional view of an organic light emitting display device according to a seventh embodiment of the present disclosure.

FIG. 10 is a schematic cross-sectional view of an organic light emitting display device according to a seventh embodiment of the present disclosure.

As shown in FIG. 10, the organic light emitting display device 1000 includes a substrate 1010, wherein first to third pixel regions P1, P2 and P3 are defined, a TFT Tr over the substrate 1010 and an OLED D5. The OLED D5 is disposed over the TFT Tr and is connected to the TFT Tr. For example, the first to third pixel regions P1, P2 and P3 may be a blue pixel region, a red pixel region and a green pixel region, respectively.

The substrate 1010 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 1012 is formed on the substrate 1010, and the TFT Tr is formed on the buffer layer 1012. The buffer layer 1012 may be omitted.

As explained with FIG. 2, the TFT Tr may include a semiconductor layer, a gate electrode, a source electrode and a drain electrode and may serve as a driving element.

A planarization layer (or passivation layer) 1050 is formed on the TFT Tr. The planarization layer 1050 has a flat top surface and includes a drain contact hole 1052 exposing the drain electrode of the TFT Tr.

The OLED D5 is disposed on the planarization layer 1050 and includes a first electrode 1060, an emitting layer 1062 and a second electrode 1064. The first electrode 1060 is connected to the drain electrode of the TFT Tr, and the emitting layer 1062 and the second electrode 1064 are sequentially stacked on the first electrode 1060. The OLED D5 is disposed in each of the first to third pixel regions P1 to P3 and emits different color light in the first to third pixel regions P1 to P3. For example, the OLED D5 in the first pixel region P1 may emit the blue light, the OLED D5 in the second pixel region P2 may emit the red light, and the OLED D5 in the third pixel region P3 may emit the green light.

The first electrode 1060 is formed to be separate in the first to third pixel regions P1 to P3, and the second electrode 1064 is formed as one-body to cover the first to third pixel regions P1 to P3.

The first electrode 1060 is one of an anode and a cathode, and the second electrode 1064 is the other one of the anode and the cathode. In addition, one of the first and second electrodes 1060 and 1064 may be a light transmitting electrode (or a semi-transmitting electrode), and the other one of the first and second electrodes 1060 and 1064 may be a reflecting electrode.

For example, the first electrode 1060 may be the anode and may include a transparent conductive oxide material layer formed of a transparent conductive oxide (TCO) material having a relatively high work function. The second electrode 1064 may be the cathode and may include a metallic material layer formed of a low resistance metallic material having a relatively low work function. For example, the transparent conductive oxide material layer of the first electrode 1060 include at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc oxide alloy (Al:ZnO), and the second electrode 1064 may include Al, Mg, Ca, Ag, their alloy, e.g., Mg—Ag alloy, or their combination.

In the bottom-emission type organic light emitting display device 1000, the first electrode 1060 may have a single-layered structure of the transparent conductive oxide material layer.

On the other hand, in the top-emission type organic light emitting display device 1000, a reflection electrode or a reflection layer may be formed under the first electrode 1060. For example, the reflection electrode or the reflection layer may be formed of Ag or aluminum-palladium-copper (APC) alloy. In this instance, the first electrode 1060 may have a triple-layered structure of ITO/Ag/ITO or ITO/APC/ITO. In addition, the second electrode 1064 may have a thin profile (small thickness) to provide a light transmittance property (or a semi-transmittance property).

A bank layer 1066 is formed on the planarization layer 1050 to cover an edge of the first electrode 1060. Namely, the bank layer 1066 is positioned at a boundary of the first to third pixel regions P1 to P3 and exposes a center of the first electrode 1060 in the first to third pixel regions P1 to P3.

The emitting layer 1062 as an emitting unit is formed on the first electrode 1060. The emitting layer 1062 may have a single-layered structure of an EML. Alternatively, the emitting layer 1062 may further include at least one of an HIL, an HTL, an EBL, which are sequentially stacked between the first electrode 1060 and the EML, an HBL, an ETL and an EIL, which are sequentially stacked between the EML and the second electrode 1064.

In the first pixel region P1 being the blue pixel region, the EML of the emitting layer 1062 includes the first compound being the delayed fluorescent compound and the second compound being the fluorescent compound. The EML of the emitting layer 1062 may further include a third compound being a host. The first compound is represented by Formula 1, and the second compound is represented by Formula 3.

An encapsulation film 1070 is formed on the second electrode 1064 to prevent penetration of moisture into the OLED D5. The encapsulation film 1070 may have a triple-layered structure including a first inorganic insulating layer, an organic insulating layer and a second inorganic insulating layer, but it is not limited thereto.

The organic light emitting display device 1000 may further include a polarization plate (not shown) for reducing an ambient light reflection. For example, the polarization plate may be a circular polarization plate. In the bottom-emission type organic light emitting display device 1000, the polarization plate may be disposed under the substrate 1010. In the top-emission type organic light emitting display device 1000, the polarization plate may be disposed on or over the encapsulation film 1070.

Figure 11:
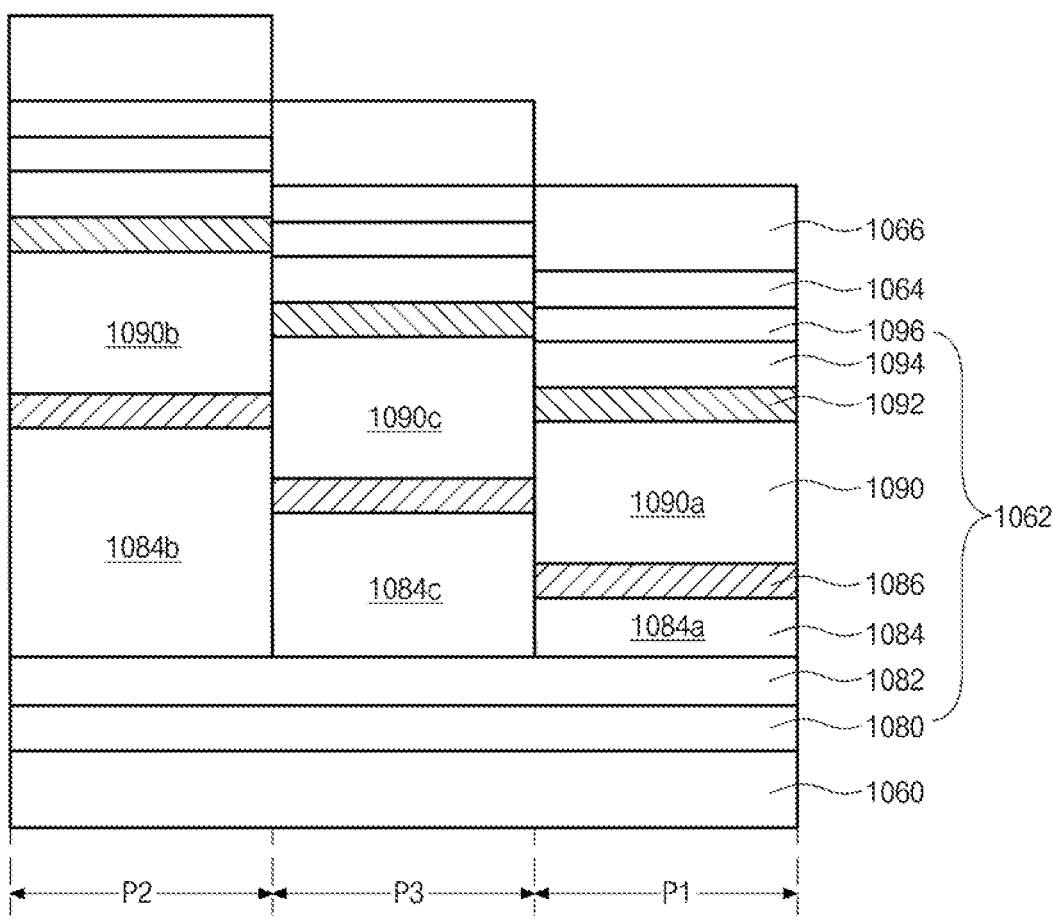
FIG. 11 is a schematic cross-sectional view of an OLED according to an eighth embodiment of the present disclosure.

FIG. 11 is a schematic cross-sectional view of an OLED according to an eighth embodiment of the present disclosure.

Referring to FIG. 11 with FIG. 10, the OLED D5 is positioned in each of first to third pixel regions P1 to P3 and includes the first and second electrodes 1060 and 1064, which face each other, and the emitting layer 1062 therebetween. The emitting layer 1062 includes an EML 1090.

The first electrode 1060 may be an anode, and the second electrode 1064 may be a cathode. For example, the first electrode 1060 may be a reflective electrode, and the second electrode 1064 may be a transmitting electrode (or a semi-transmitting electrode).

The emitting layer 1062 may further include an HTL 1082 between the first electrode 1060 and the EML 1090 and an ETL 1094 between the EML 1090 and the second electrode 1064.

In addition, the emitting layer 1062 may further include an HIL 1080 between the first electrode 1060 and the HTL 1082 and an EIL 1096 between the ETL 1094 and the second electrode 1064.

Moreover, the emitting layer 1062 may further include an EBL 1086 between the EML 1090 and the HTL 1082 and an HBL 1092 between the EML 1090 and the ETL 1094.

Furthermore, the emitting layer 1062 may further include an auxiliary HTL 1084 between the HTL 1082 and the EBL 1086. The auxiliary HTL 1084 may include a first auxiliary HTL 1084a in the first pixel region P1, a second auxiliary HTL 1084b in the second pixel region P2 and a third auxiliary HTL 1084c in the third pixel region P3.

The first auxiliary HTL 1084a has a first thickness, the second auxiliary HTL 1084b has a second thickness, and the third auxiliary HTL 1084c has a third thickness. The third thickness is smaller than the second thickness and greater than the first thickness such that the OLED D5 provides a micro-cavity structure.

Namely, by the first to third auxiliary HTLs 1084a, 1084b and 1084c having a difference in a thickness, a distance between the first and second electrodes 1060 and 1064 in the third pixel region P3, in which a first wavelength range light, e.g., green light, is emitted, is smaller than a distance between the first and second electrodes 1060 and 1064 in the second pixel region P2, in which a second wavelength range light, e.g., red light, being greater than the first wavelength range is emitted, and is greater than a distance between the first and second electrodes 1060 and 1064 in the first pixel region P1, in which a third wavelength range light, e.g., blue light, being smaller than the first wavelength range is emitted. Accordingly, the emitting efficiency of the OLED D5 is improved.

In FIG. 11, the third auxiliary HTL 1084c is formed in the first pixel region P1. Alternatively, a micro-cavity structure may be provided without the third auxiliary HTL 1084c.

A capping layer (not shown) for improving a light-extracting property may be further formed on the second electrode 1084.

The EML 1090 includes a first EML 1090a in the first pixel region P1, a second EML 1090b in the second pixel region P2 and a third EML 1090c in the third pixel region P3. The first to third EMLs 1090a, 1090b and 1090c may be a blue EML, a red EML and a green EML, respectively.

The first EML 1090a in the first pixel region P1 includes the first compound being the delayed fluorescent compound and the second compound being the fluorescent compound. The first EML 1090a in the first pixel region P1 may further include a third compound being a host. The first compound is represented by Formula 1, and the second compound is represented by Formula 3.

In the first EML 1090a in the first pixel region P1, the weight ratio of the first compound may be greater than that of the second compound and smaller than that of the third compound. When the weight ratio of the first compound is greater than that of the second compound, the energy transfer from the first compound into the second compound is sufficiently generated. For example, in the first EML 1090a in the first pixel region P1, the first compound may have a weight % of about 20 to 40, the second compound may have a weight % of about 0.1 to 10, and the third compound may have a weight % of about 50 to 80. However, it is not limited thereto.

Each of the second EML 1090b in the second pixel region P2 and the third EML 1090c in the third pixel region P3 may include a host and a dopant. For example, in each of the second EML 1090b in the second pixel region P2 and the third EML 1090c in the third pixel region P3, the dopant may include at least one of a phosphorescent compound, a fluorescent compound and a delayed fluorescent compound.

The OLED D5 in FIG. 11 respectively emits the blue light, the red light and the green light in the first to third pixel regions P1 to P3 such that the organic light emitting display device 1000 (of FIG. 10) can provide a full-color image.

The organic light emitting display device 1000 may further include a color filter layer corresponding to the first to third pixel regions P1 to P3 to improve a color purity. For example, the color filter layer may include a first color filter layer, e.g., a blue color filter layer, corresponding to the first pixel region P1, a second color filter layer, e.g., a red color filter layer, corresponding to the second pixel region P2, and a third color filter layer, e.g., a green color filter layer, corresponding to the third pixel region P3.

In the bottom-emission type organic light emitting display device 1000, the color filter layer may be disposed between the OLED D5 and the substrate 1010. On the other hand, in the top-emission type organic light emitting display device 1000, the color filter layer may be disposed on or over the OLED D5.

Figure 12:
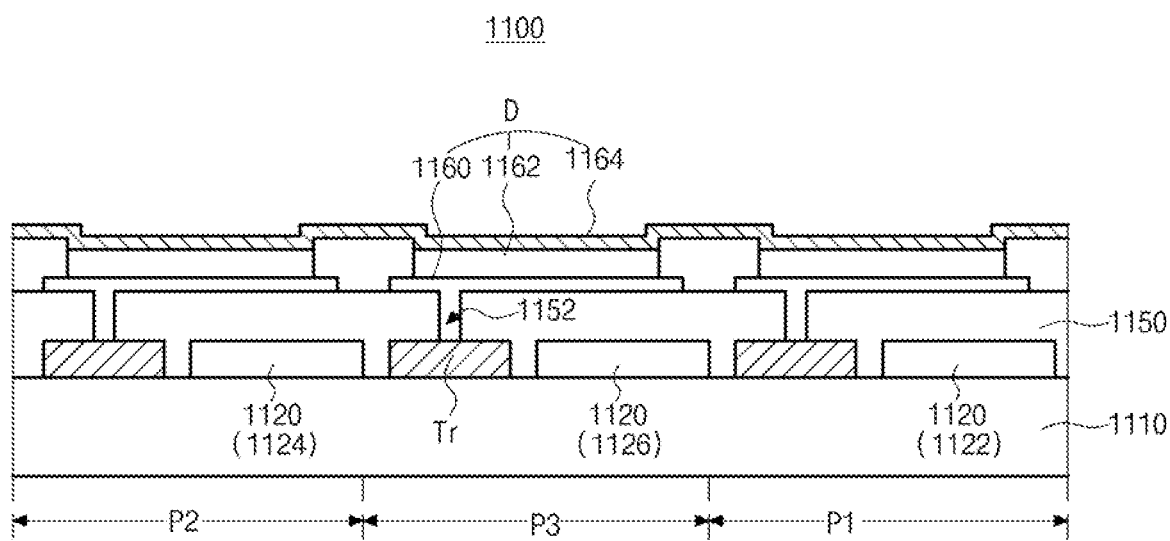
FIG. 12 is a schematic cross-sectional view of an organic light emitting display device according to a ninth embodiment of the present disclosure.

FIG. 12 is a schematic cross-sectional view of an organic light emitting display device according to a ninth embodiment of the present disclosure.

As shown in FIG. 12, the organic light emitting display device 1100 includes a substrate 1110, wherein first to third pixel regions P1, P2 and P3 are defined, a TFT Tr over the substrate 1110, an OLED D, which is disposed over the TFT Tr and is connected to the TFT Tr, and a color filter layer 1120 corresponding to the first to third pixel regions P1 to P3. For example, the first to third pixel regions P1, P2 and P3 may be a blue pixel region, a red pixel region and a green pixel region, respectively.

The substrate 1110 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

The TFT Tr is formed on the substrate 1110. Alternatively, a buffer layer (not shown) may be formed on the substarte 1110, and the TFT Tr may be formed on the buffer layer.

As explained with FIG. 2, the TFT Tr may include a semiconductor layer, a gate electrode, a source electrode and a drain electrode and may serve as a driving element.

In addition, the color filter layer 1120 is disposed on the substrate 1110. For example, the color filter layer 1120 may include a first color filter layer 1122 corresponding to the first pixel region P1, a second color filter layer 1124 corresponding to the second pixel region P2, and a third color filter layer 1126 corresponding to the third pixel region P3. The first to third color filter layers 1122, 1124 and 1126 may be a blue color filter layer, a red color filter layer and a green color filter layer, respectively. For example, the first color filter layer 1122 may include at least one of a blue dye and a blue pigment, and the second color filter layer 1124 may include at least one of a red dye and a red pigment. The third color filter layer 1126 may include at least one of a green dye and a green pigment.

A planarization layer (or passivation layer) 1150 is formed on the TFT Tr and the color filter layer 1120. The planarization layer 1150 has a flat top surface and includes a drain contact hole 1152 exposing the drain electrode of the TFT Tr.

The OLED D is disposed on the planarization layer 1150 and corresponds to the color filter layer 1120. The OLED D includes a first electrode 1160, an emitting layer 1162 and a second electrode 1164. The first electrode 1160 is connected to the drain electrode of the TFT Tr, and the emitting layer 1162 and the second electrode 1164 are sequentially stacked on the first electrode 1160. The OLED D emits the white light in each of the first to third pixel regions P1 to P3.

The first electrode 1160 is formed to be separate in the first to third pixel regions P1 to P3, and the second electrode 1164 is formed as one-body to cover the first to third pixel regions P1 to P3.

The first electrode 1160 is one of an anode and a cathode, and the second electrode 1164 is the other one of the anode and the cathode. In addition, the first electrode 1160 may be a light transmitting electrode (or a semi-transmitting electrode), and the second electrode 1164 may be a reflecting electrode.

For example, the first electrode 1160 may be the anode and may include a transparent conductive oxide material layer formed of a transparent conductive oxide (TCO) material having a relatively high work function. The second electrode 1164 may be the cathode and may include a metallic material layer formed of a low resistance metallic material having a relatively low work function. For example, the transparent conductive oxide material layer of the first electrode 1160 include at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc oxide alloy (Al:ZnO), and the second electrode 1164 may include Al, Mg, Ca, Ag, their alloy, e.g., Mg—Ag alloy, or their combination.

The emitting layer 1162 as an emitting unit is formed on the first electrode 1160. The emitting layer 1162 includes at least two emitting parts emitting different color light. Each emitting part may have a single-layered structure of an EML. Alternatively, each emitting part may further include at least one of an HIL, an HTL, an EBL, an HBL, an ETL and an EIL. In addition, the emitting layer 1162 may further include a charge generation layer (CGL) between the emitting parts.

The EML of one of the emitting parts includes the first compound of Formula 1 and the second compound of Formula 3. For example, the EML of one of the emitting parts may include the first compound being the delayed fluorescent compound and the second compound being the fluorescent compound. The EML of one of the emitting parts may further include a third compound being a host.

A bank layer 1166 is formed on the planarization layer 1150 to cover an edge of the first electrode 1160. Namely, the bank layer 1166 is positioned at a boundary of the first to third pixel regions P1 to P3 and exposes a center of the first electrode 1160 in the first to third pixel regions P1 to P3. As mentioned above, since the OLED D emits the white light in the first to third pixel regions P1 to P3, the emitting layer 1162 may be formed as a common layer in the first to third pixel regions P1 to P3 without separation in the first to third pixel regions P1 to P3. The bank layer 1166 may be formed to prevent the current leakage at an edge of the first electrode 1160 and may be omitted.

Although not shown, the organic light emitting display device 1100 may further include an encapsulation film is formed on the second electrode 1164 to prevent penetration of moisture into the OLED D. In addition, the organic light emitting display device 1100 may further include a polarization plate under the substrate 1110 for reducing an ambient light reflection.

In the organic light emitting display device 1100 of FIG. 12, the first electrode 1160 is a transparent electrode (light transmitting electrode), and the second electrode 1164 is a reflecting electrode. In addition, the color filter layer 1120 is positioned between the substrate 1110 and the OLED D. Namely, the organic light emitting display device 11000 is a bottom-emission type.

Alternatively, in the organic light emitting display device 1100, the first electrode 1160 may be a reflecting electrode, and the second electrode 1154 may be a transparent electrode (or a semi-transparent electrode). In this case, the color filter layer 1120 is positioned on or over the OLED D.

In the organic light emitting display device 1100, the OLED D in the first to third pixel regions P1 to P3 emits the white light, and the white light passes through the first to third color filter layers 1122, 1124 and 1126. Accordingly, the blue light, the red light and the green light are displayed in the first to third pixel regions P1 to P3, respectively.

Although not shown, a color conversion layer may be formed between the OLED D and the color filter layer 1120. The color conversion layer may include a blue color conversion layer, a red color conversion layer and a green color conversion layer respectively corresponding to the first to third pixel regions P1 to P3, and the white light from the OLED D can be converted into the blue light, the red light and the green light. The color conversion layer may include a quantum dot. Accordingly, the color purity of the OLED D may be further improved.

The color conversion layer may be included instead of the color filter layer 1120.

Figure 13:
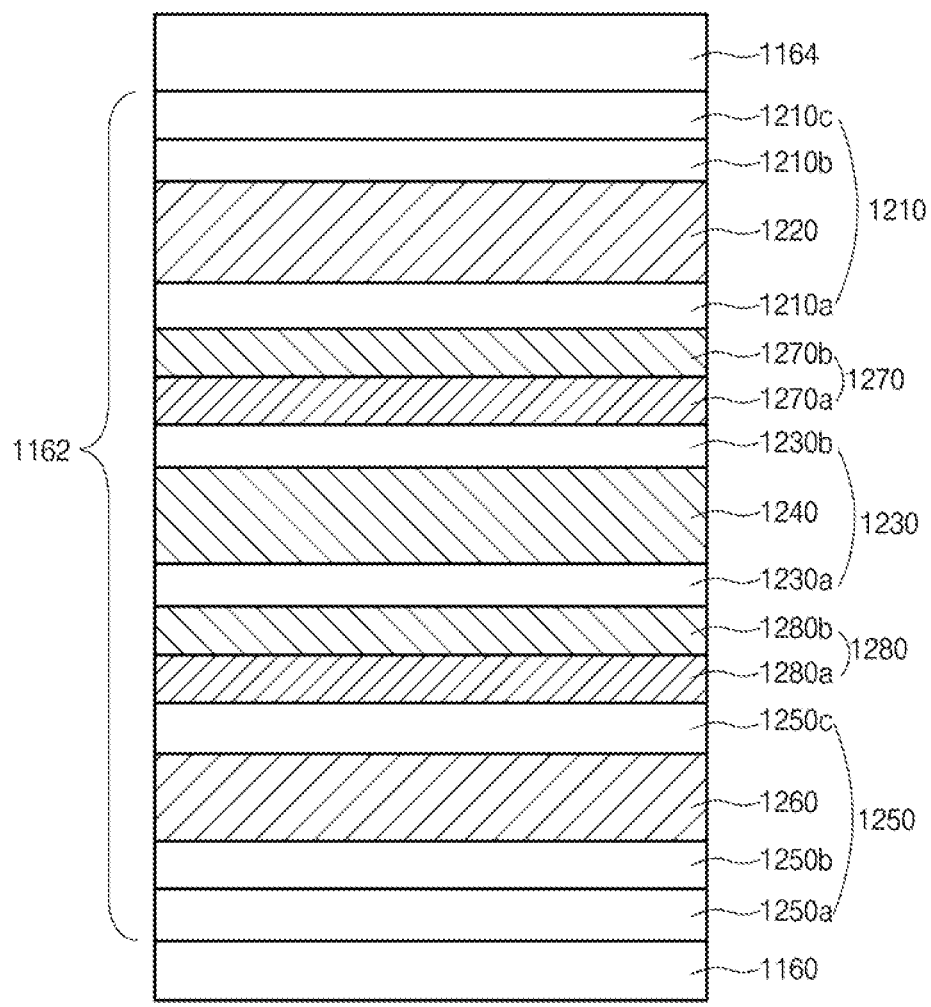
FIG. 13 is a schematic cross-sectional view of an OLED according to a tenth embodiment of the present disclosure.

FIG. 13 is a schematic cross-sectional view of an OLED according to a tenth embodiment of the present disclosure.

As shown in FIG. 13, the OLED D6 includes the first and second electrodes 1160 and 1164, which face each other, and the emitting layer 1162 therebetween.

The first electrode 1160 may be an anode, and the second electrode 1164 may be a cathode. The first electrode 1160 is a transparent electrode (a light transmitting electrode), and the second electrode 1164 is a reflecting electrode.

The emitting layer 1162 includes a first emitting part 1210 including a first EML 1220, a second emitting part 1230 including a second EML 1240 and a third emitting part 1250 including a third EML 1260. In addition, the emitting layer 1162 may further include a first CGL 1270 between the first and second emitting parts 1210 and 1230 and a second CGL 1280 between the first emitting part 1210 and the third emitting part 1250.

The first CGL 1270 is positioned between the first and second emitting parts 1210 and 1230, and the second CGL 1280 is positioned between the second and third emitting parts 1230 and 1250. Namely, the third emitting part 1250, the second CGL 1280, the second emitting part 1230, the first CGL 1270 and the first emitting part 1230 are sequentially stacked on the first electrode 1160. In other words, the first emitting part 1210 is positioned between the second electrode and the first and second CGL 1270, and the second emitting part 1230 is positioned between the first and second CGLs 1270 and 1280. The third emitting part 1250 is positioned between the second CGL 1280 and the first electrode 1160.

The first emitting part 1210 may further include a first HTL 1210a under the first EML 1220 and a first ETL 1210b over the first EML 1220. Namely, the first HTL 1210a may positioned between the first EML 1220 and the second CGL 1270, and the first ETL 1210b may be positioned between the first EML 1220 and the first CGL 1270.

In addition, the first emitting part 1210 may further include a first HTL 1210a under the first EML 1220, a first ETL 1210b over the first EML 1220 and an EIL 1210c over the first ETL 1210b. Namely, the first HTL 1210a is positioned between the first EML 1220 and the first CGL 1270, and the first ETL 1210b and the EIL 1210c are positioned between the first EML 1220 and the second electrode 1164.

In addition, the first emitting part 1210 may further include an EBL (not shown) between the first HTL 1210a and the first EML 1220 and an HBL (not shown) between the first ETL 1210b and the first EML 1220.

The second emitting part 1230 may further include a second HTL 1230a under the second EML 1240 and a second ETL 1230b over the second EML 1240. Namely, the second HTL 1230a is positioned between the second EML 1240 and the second CGL 1280, and the second ETL 1230b is positioned between the second EML 1240 and the first CGL 1270.

In addition, the second emitting part 1230 may further include an EBL (not shown) between the second HTL 1230a and the second EML 1240 and an HBL (not shown) between the second ETL 1230b and the second EML 1240.

The third emitting part 1250 may further include an HIL 1250a and a third HTL 1250b under the third EML 1260 and a third ETL 1250c over the third EML 1260. Namely, the HIL 1250a and the third HTL 1250b are positioned between the third EML 1260 and the first electrode 1160, and the third ETL 1250b is positioned between the third EML 1260 and the second CGL 1280.

In addition, the third emitting part 1250 may further include an EBL (not shown) between the third HTL 1250b and the third EML 1260 and an HBL (not shown) between the third ETL 1250c and the third EML 1260.

One of the first to third EMLs 1220, 1240 and 1260 may be a blue EML, another one of the first to third EMLs 1220, 1240 and 1260 may be a green EML, and the other one of the first to third EMLs 1220, 1240 and 1260 may be a red EML.

For example, the first EML 1220 may be a blue EML, the second EML 1240 may be a green EML, and the third EML 1260 may be a red EML. Alternatively, the first EML 1220 may be a blue EML, the second EML 1240 may be a red EML, and the third EML 1260 may be a green EML.

The first EML 1220 includes the first compound being the delayed fluorescent compound and the second compound being the fluorescent compound. The first EML 1220 may further include a third compound being a host. The first compound is represented by Formula 1, and the second compound is represented by Formula 3.

In the first EML 1220, the weight ratio of the first compound may be greater than that of the second compound and smaller than that of the third compound. When the weight ratio of the first compound is greater than that of the second compound, the energy transfer from the first compound into the second compound is sufficiently generated. For example, in the first EML 1220, the first compound may have a weight % of about 20 to 40, the second compound may have a weight % of about 0.1 to 10, and the third compound may have a weight % of about 50 to 80. However, it is not limited thereto.

The second EML 1240 includes a host and a green dopant (or a red dopant), and the third EML 1260 includes a host and a red dopant (or a green dopant). For example, in each of the second and third EMLs 1240 and 1260, the dopant may include at least one of a phosphorescent compound, a fluorescent compound and a delayed fluorescent compound.

The OLED D6 in the first to third pixel regions P1 to P3 (of FIG. 12) emits the white light, and the white light passes through the color filter layer 1120 (of FIG. 12) in the first to third pixel regions P1 to P3. Accordingly, the organic light emitting display device 1100 (of FIG. 12) can provide a full-color image.

Figure 14:
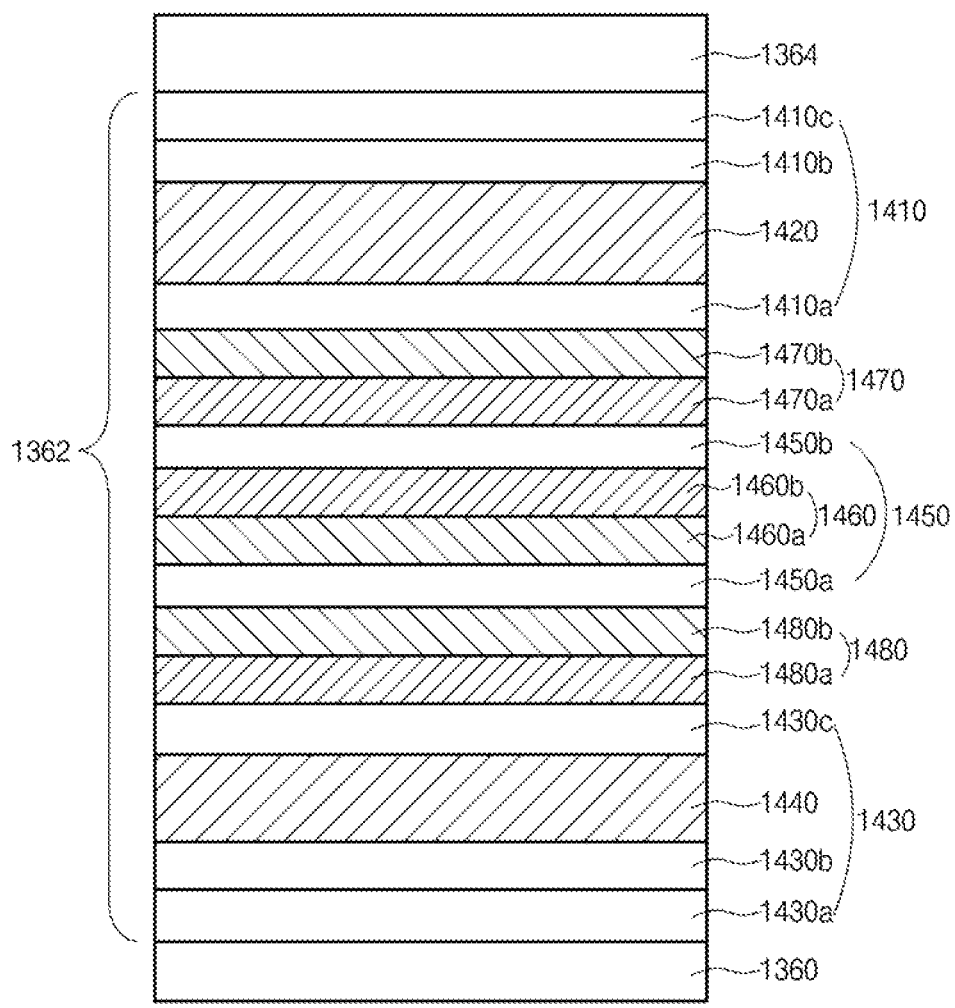
FIG. 14 is a schematic cross-sectional view of an OLED according to an eleventh embodiment of the present disclosure.

FIG. 14 is a schematic cross-sectional view of an OLED according to an eleventh embodiment of the present disclosure.

As shown in FIG. 14, the OLED D7 includes the first and second electrodes 1360 and 1364, which face each other, and the emitting layer 1362 therebetween.

The first electrode 1360 may be an anode, and the second electrode 1364 may be a cathode. The first electrode 1360 is a transparent electrode (a light transmitting electrode), and the second electrode 1364 is a reflecting electrode.

The emitting layer 1362 includes a first emitting part 1410 including a first EML 1420, a second emitting part 1430 including a second EML 1440 and a third emitting part 1450 including a third EML 1460. In addition, the emitting layer 1362 may further include a first CGL 1470 between the first and third emitting parts 1410 and 1450 and a second CGL 1480 between the second emitting part 1430 and the third emitting part 1450.

The first CGL 1470 is positioned between the first and third emitting parts 1410 and 1450, and the second CGL 1480 is positioned between the second and third emitting parts 1430 and 1450. Namely, the second emitting part 1430, the second CGL 1480, the third emitting part 1450, the first CGL 1470 and the first emitting part 1410 are sequentially stacked on the first electrode 1360. In other words, the first emitting part 1410 is positioned between the second electrode 1364 and the first CGL 1470, and the second emitting part 1430 is positioned between the second CGL 1480 and the first electrode 1360. The third emitting part 1450 is positioned between the first and second CGLs 1470 and 1480.

The first emitting part 1410 may further include a first HTL 1410a under the first EML 1420 and a first ETL 1410b and an EIL 1410c over the first EML 1420. Namely, the first HTL 1410a may positioned between the first EML 1420 and the first CGL 1470, and the first ETL 1410b and the EIL 1410c may be positioned between the first EML 1420 and the second electrode 1364.

In addition, the first emitting part 1410 may further include an EBL (not shown) between the first HTL 1410a and the first EML 1420 and an HBL (not shown) between the first ETL 1410b and the first EML 1420.

The second emitting part 1430 may further include an HIL 1430a, a second HTL 1430b under the second EML 1440 and a second ETL 1430c over the second EML 1440. Namely, the HIL 1430a, the second HTL 1430b may be positioned between the first electrode 1360 and the second EML 1440, and the second ETL 1430c may be positioned between the second EML 1440 and the second CGL 1480.

In addition, the second emitting part 1430 may further include an EBL (not shown) between the second HTL 1430b and the second EML 1440 and an HBL (not shown) between the second ETL 1430c and the second EML 1440.

The third emitting part 1450 may further include a third HTL 1450a under the third EML 1460 and a third ETL 1450b over the third EML 1460. Namely, the third HTL 1450a may be positioned between the second CGL 1480 and the third EML 1460, and the third ETL 1450b may be positioned between the third EML 1460 and the first CGL 1470.

In addition, the third emitting part 1450 may further include an EBL (not shown) between the third HTL 1450a and the third EML 1460 and an HBL (not shown) between the third ETL 1450b and the third EML 1460.

Each of the first and second EMLs 1420 and 1440 is a blue EML. At least one of the first and second EMLs 1420 and 1440, e.g., the first EML 1420, includes the first compound of Formula 1 and the second compound of Formula 3. In addition, the first EML 1420 may further include a third compound as a host.

In the first EML 1220, the weight ratio of the first compound may be greater than that of the second compound and smaller than that of the third compound. When the weight ratio of the first compound is greater than that of the second compound, the energy transfer from the first compound into the second compound is sufficiently generated.

For example, in the first EML 1420, the first compound may have a weight % of about 20 to 40, the second compound may have a weight % of about 0.1 to 10, and the third compound may have a weight % of about 50 to 80. However, it is not limited thereto.

The second EML 1440 may include the first compound of Formula 1 and the second compound of Formula 3. Namely, the second EML 1440 may have the same organic compound as the first EML 1420. Alternatively, the second EML 1440 may include a compound being different from at least one of the first compound and the second compound in the first EML 1420 such that the first and second EMLs 1420 and 1440 have a different in an emitted-light wavelength or an emitting efficiency.

The third EML 1460 includes a lower EML 1460a and an upper EML 1420b. The lower EML 1460a is closer to the first electrode 1360, and the upper EML 1460b is closer to the second electrode 1364.

One of the lower and upper EMLs 1460a and 1460b of the third EML 1460 is a green EML, and the other one of the lower and upper EMLs 1460a and 1460b of the third EML 1460 may be a red EML. Namely, the green EML (or the red EML) and the red EML (or the green EML) are sequentially stacked to form the third EML 1460.

Each of the lower EML 1460a and the upper EML 1460b may include a host and a dopant. In each of the lower EML 1460a and the upper EML 1460b, the dopant may include at least one of a phosphorescent compound, a fluorescent compound and a delayed fluorescent compound.

Alternatively, the third EML 1460 may have a single-layered structure of a yellow-green EML.

The OLED D7 in the first to third pixel regions P1 to P3 (of FIG. 12) emits the white light, and the white light passes through the color filter layer 1120 (of FIG. 12) in the first to third pixel regions P1 to P3. Accordingly, the organic light emitting display device 1100 (of FIG. 12) can provide a full-color image.

In FIG. 14, the OLED D7 has a three-stack (triple-stack) structure including the first and second EMLs 1420 and 1440 being the blue EML with the third EML 1460. Alternatively, one of the first and second EMLs 1420 and 1440 may be omitted such that the OLED D7 may have a two-stack (double-stack) structure.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. An organic light emitting diode, comprising:
a first electrode;
a second electrode facing the first electrode; and
an emitting material layer including a first compound and a second compound and positioned between the first and second electrodes,
wherein the first compound includes a hexagonal-ring moiety including one boron atom, one oxygen atom and four carbon atoms, and the second compound includes a hexagonal-ring moiety including one boron atom, one nitrogen atom and four carbon atoms, and

[Formula 1]

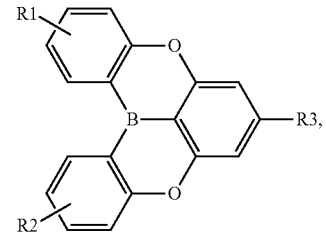

wherein each of R1 and R2 is independently selected from the group consisting of hydrogen, deuterium, tritium, halogen, C1 to C20 alkyl, C6 to C30 aryl, C5 to C30 heteroaryl, C1 to C20 alkylamine, and C6 to C30 arylamine, and R3 is C5 to C60 heteroaryl including a nitrogen atom.

2. The organic light emitting diode according to claim 1, wherein the first compound comprises one of the following compounds:

1-1

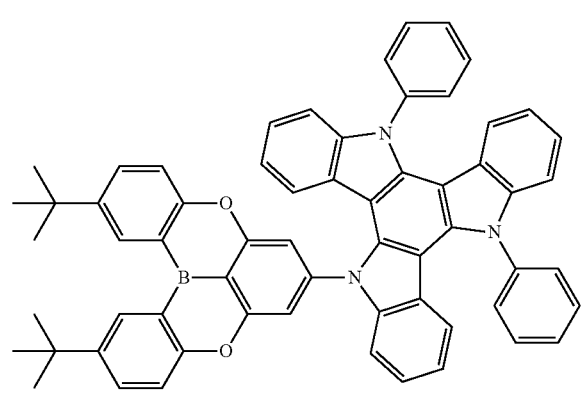

-continued
1-2
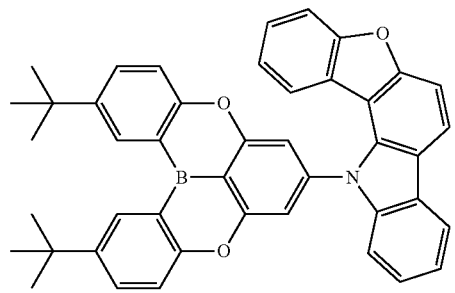
1-3
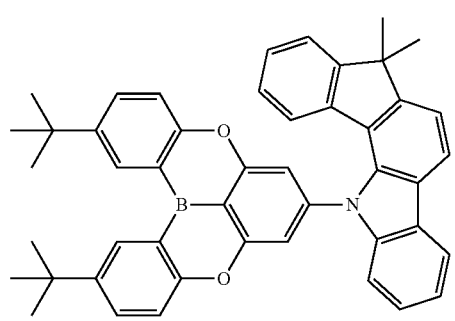
1-4
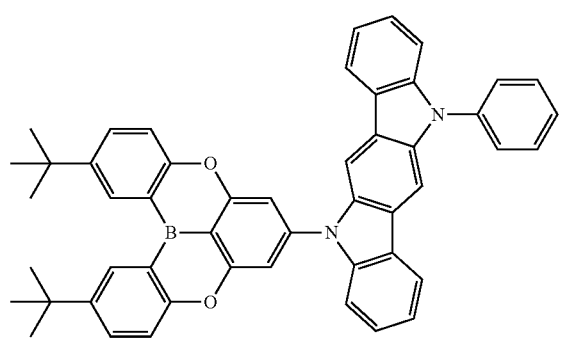
1-5
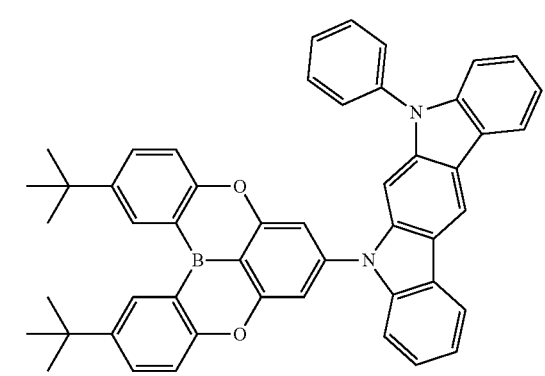
-continued
1-6
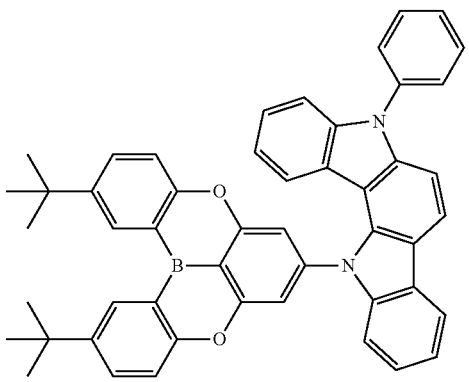
1-7
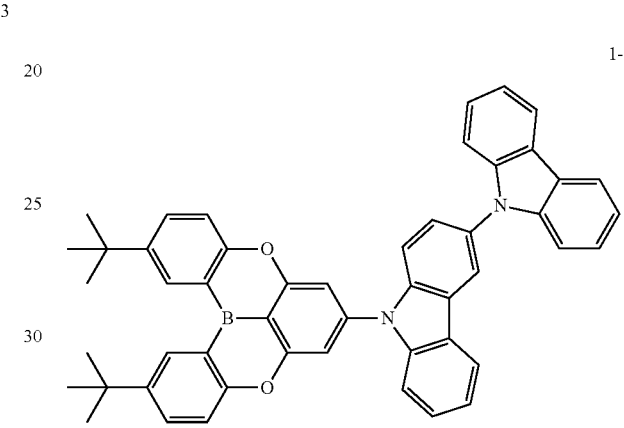
1-8
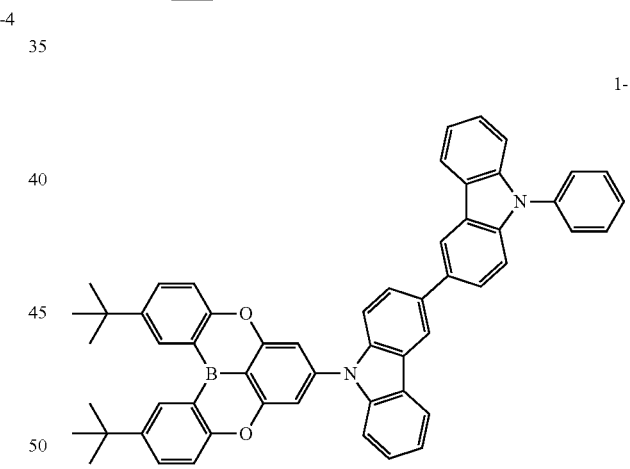
1-9
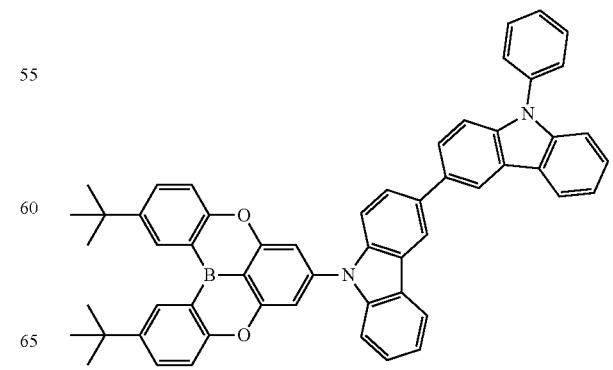

1-10
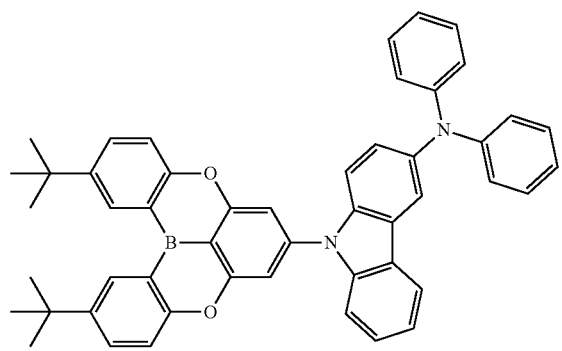
1-11
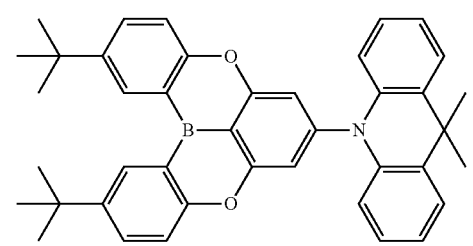
1-12
1-13
1-14
1-15
1-16
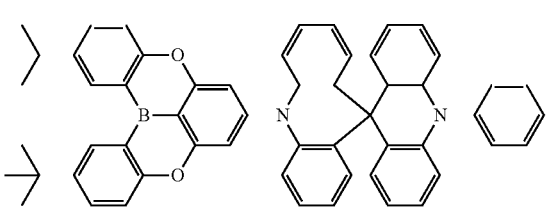
1-17
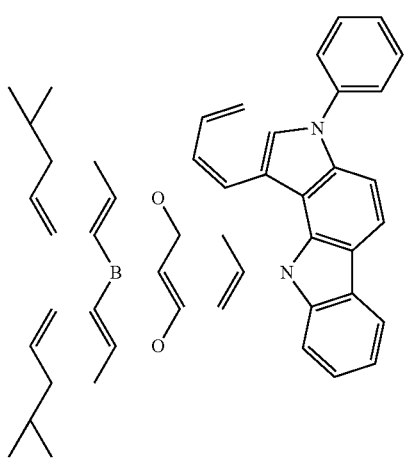
1-18
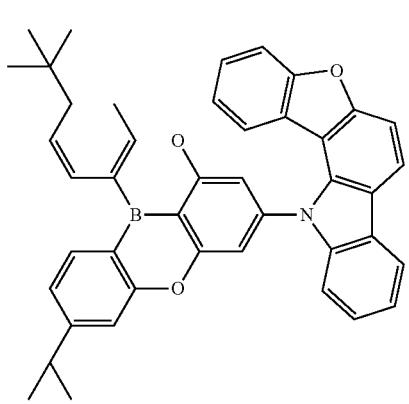
1-19
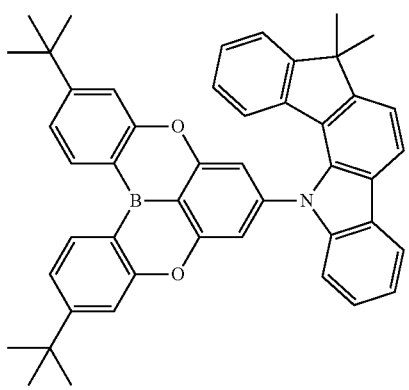
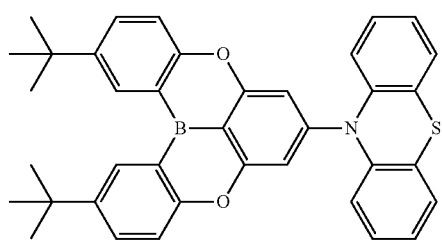
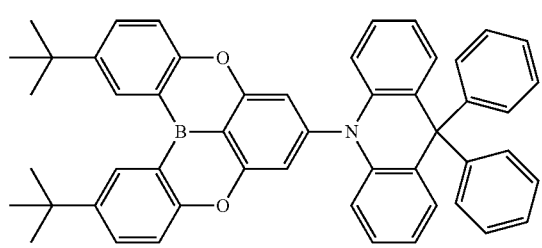
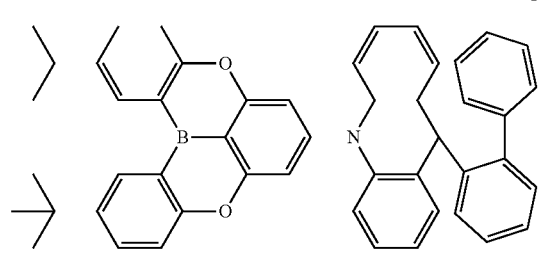

1-20
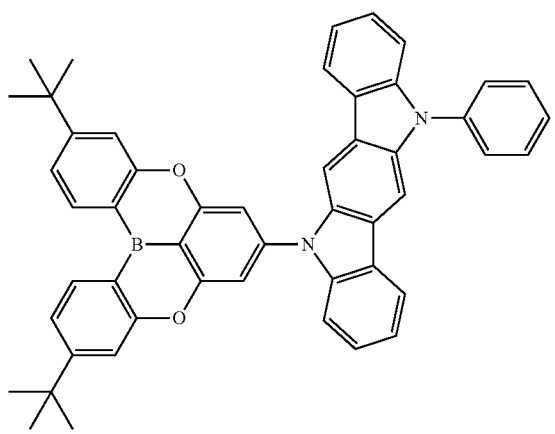
1-23
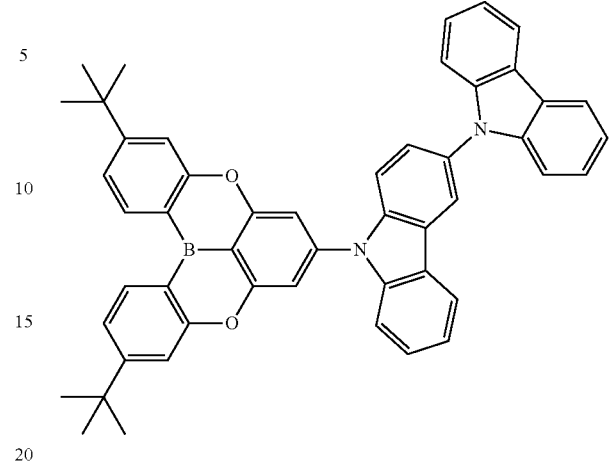
1-21
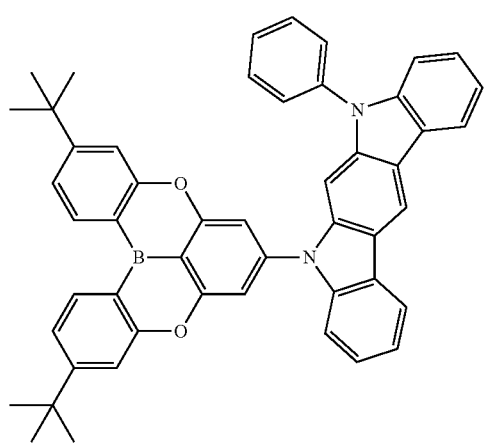
1-24
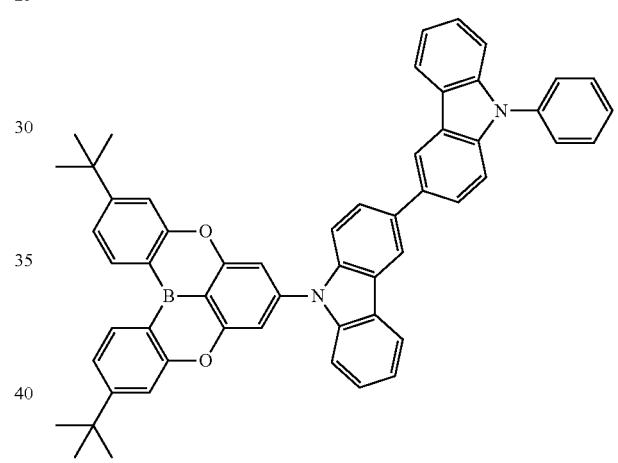
1-22
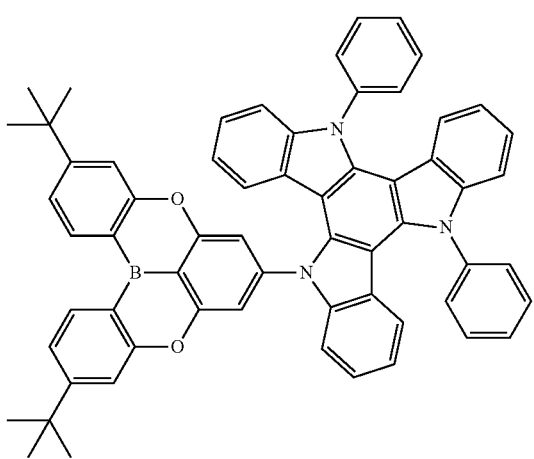
1-25
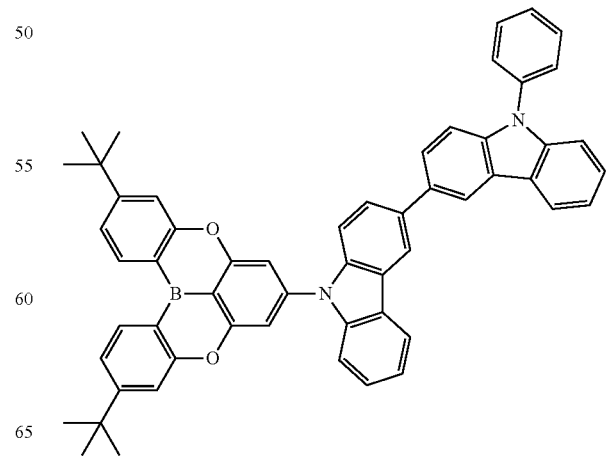

1-26
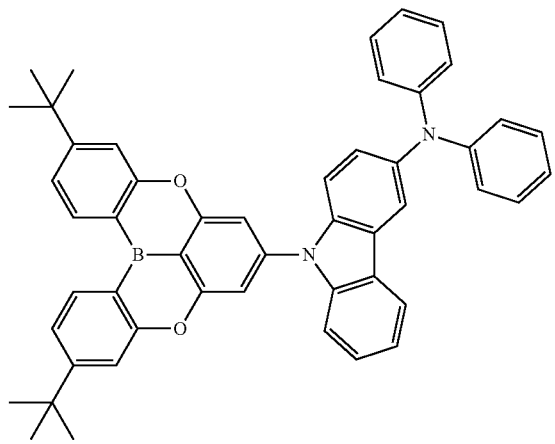
1-27
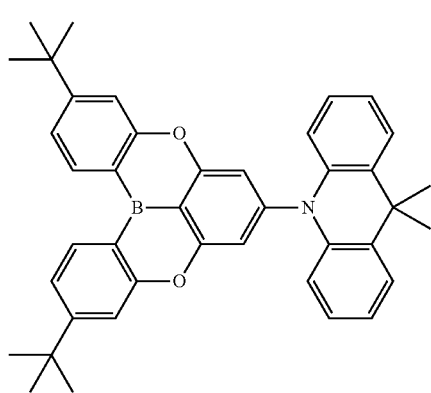
1-28
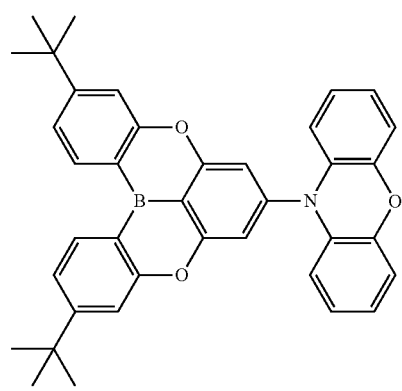
1-29
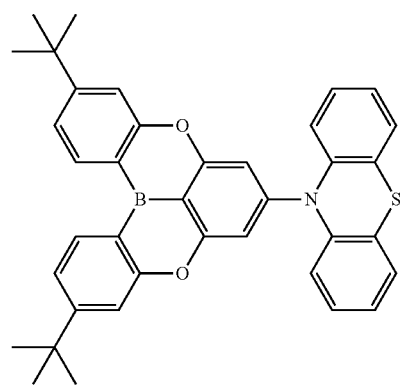
1-30
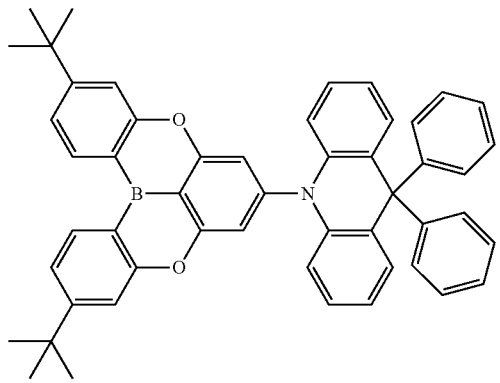
1-31
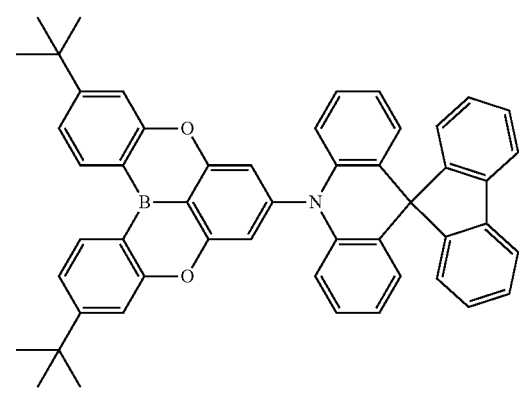
1-32
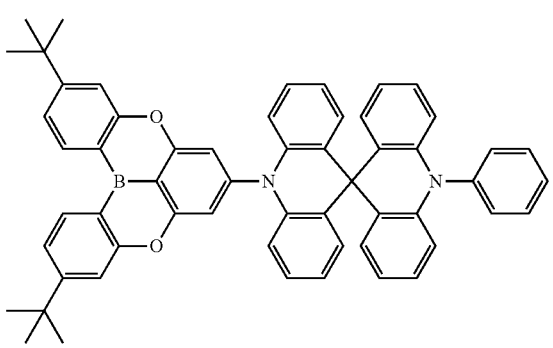
1-33
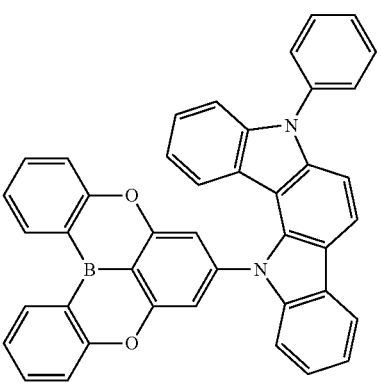

1-34
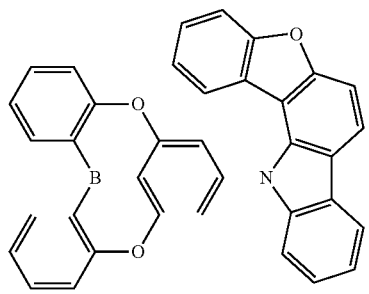
1-35
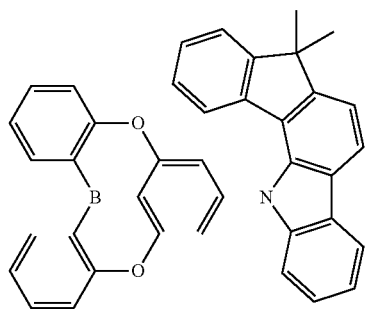
1-36
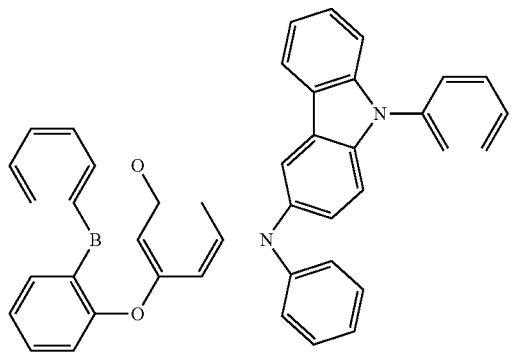
1-37
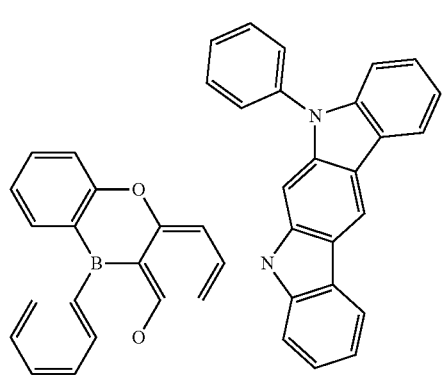
1-38
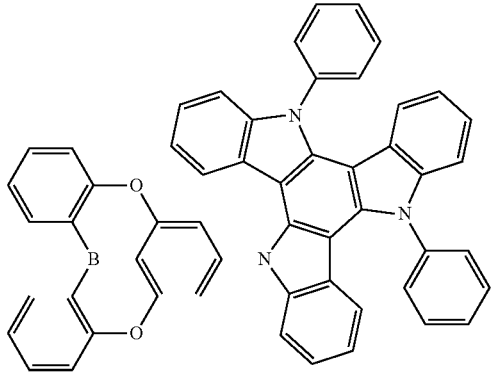
1-39
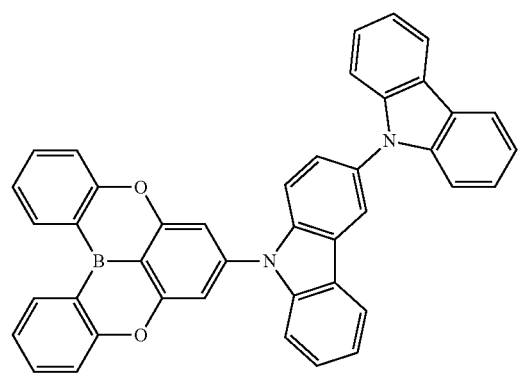
1-40
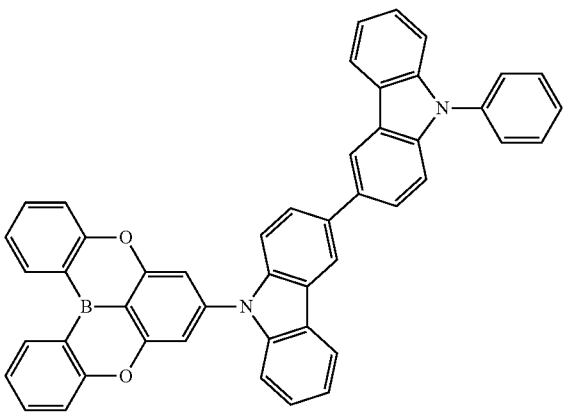
1-41

-continued
1-42
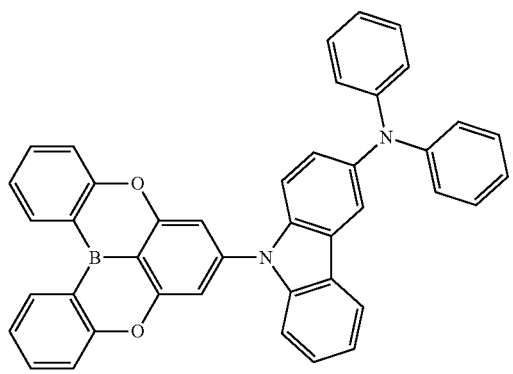
1-43
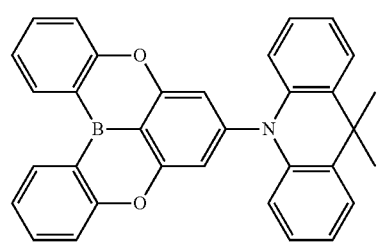
1-44
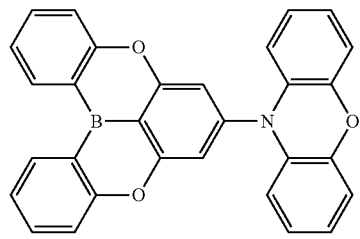
1-45
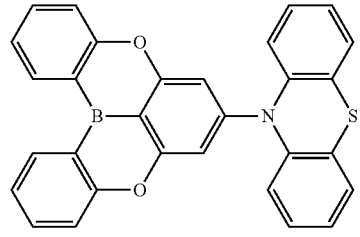
1-46
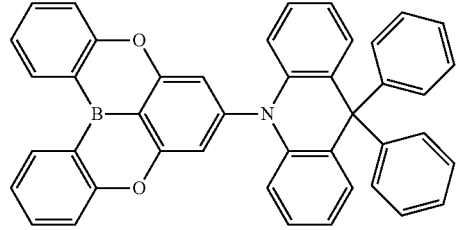
1-47
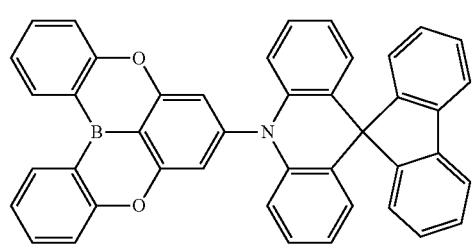
-continued
1-48
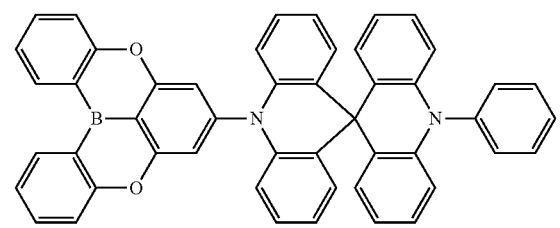
1-49
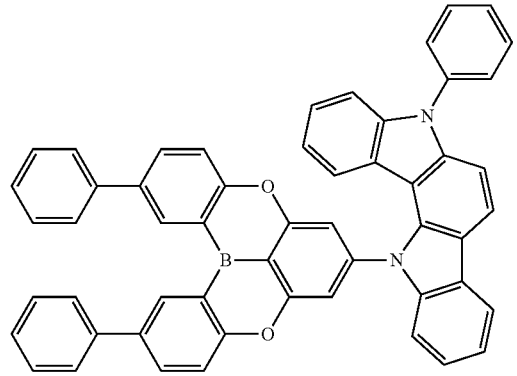
1-50
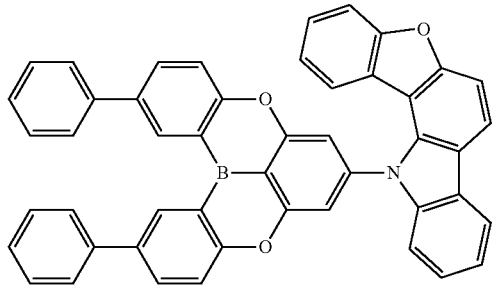
1-51
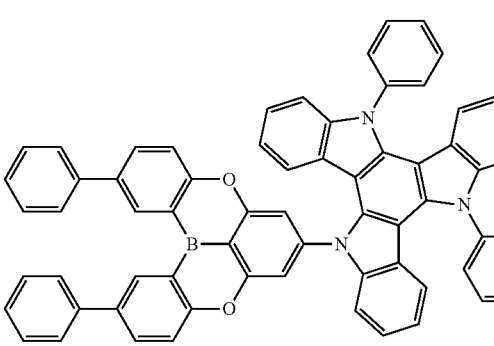
1-52
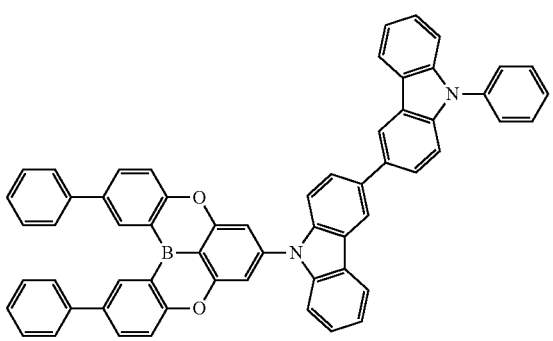

1-53
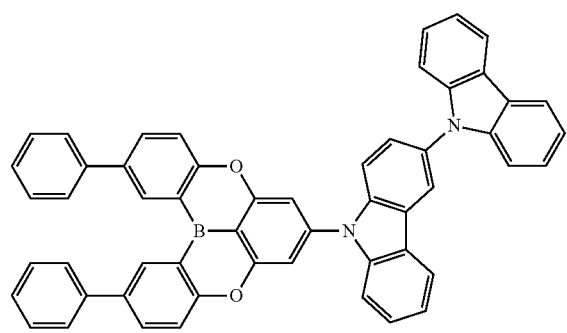
1-54
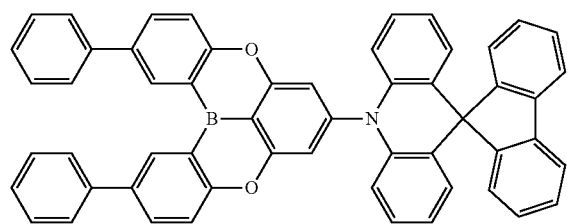
1-55
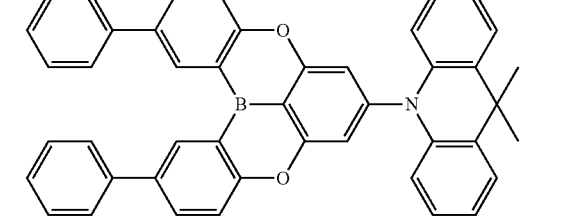
1-56
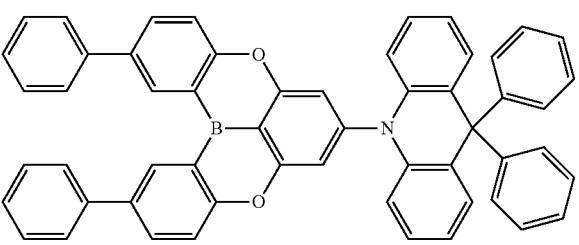
1-57
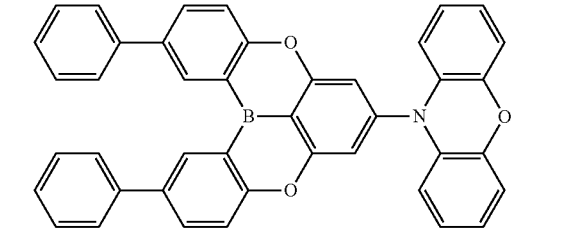
1-58
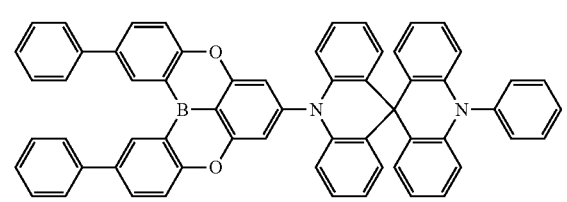
1-59
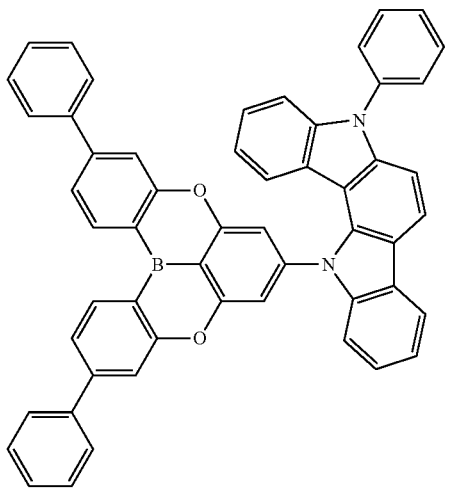
1-60
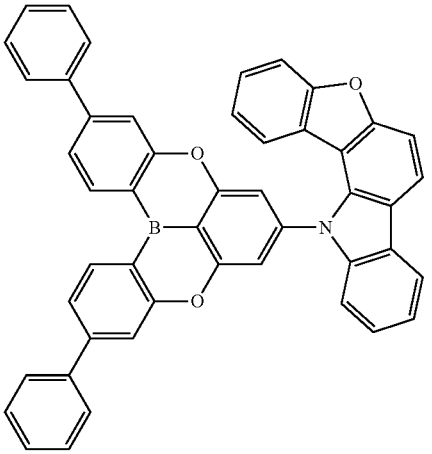
1-61
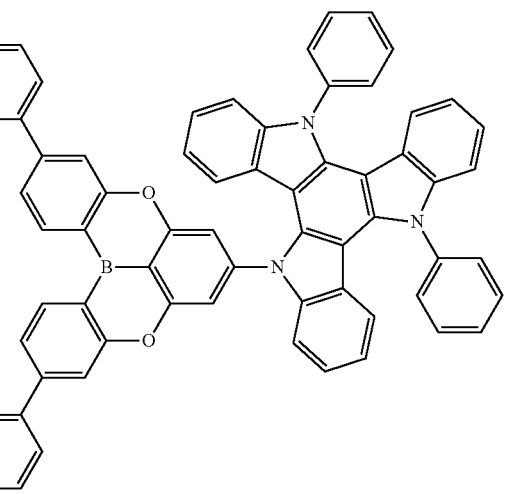

1-62
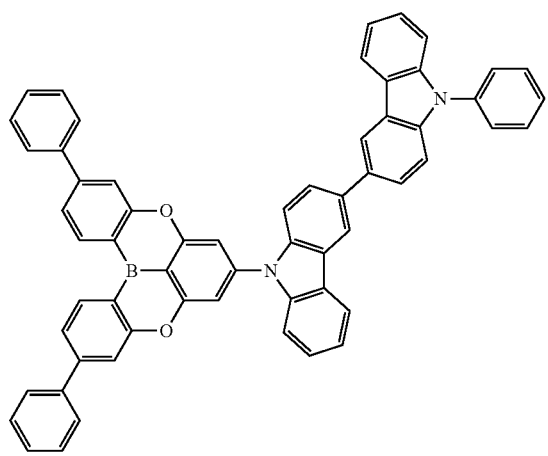
1-63
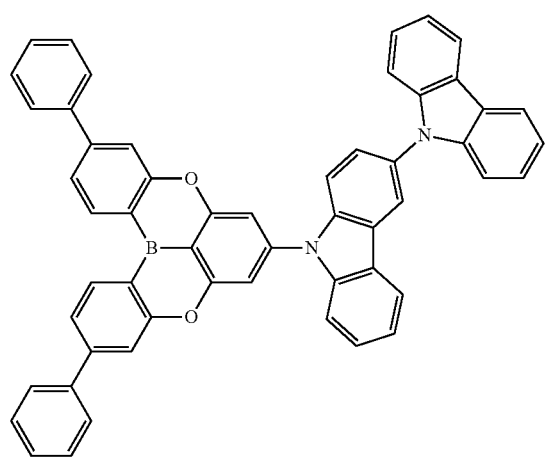
1-64
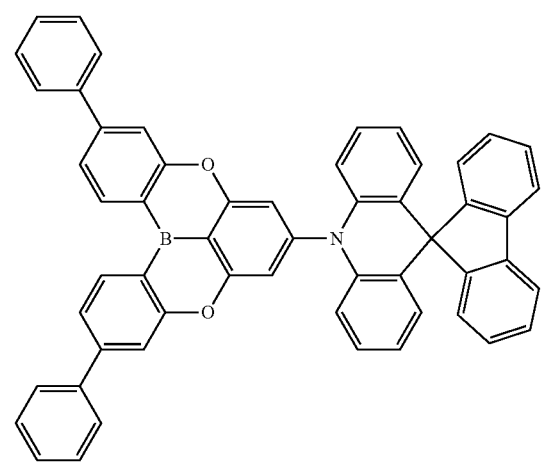
1-65
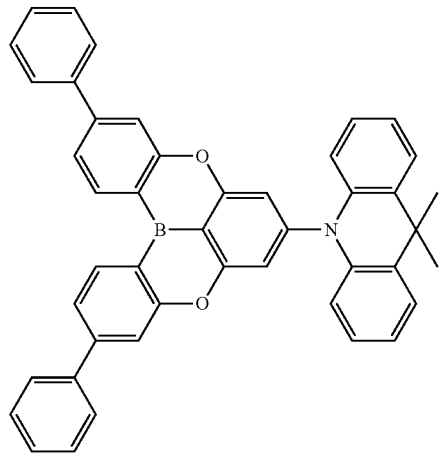
1-66
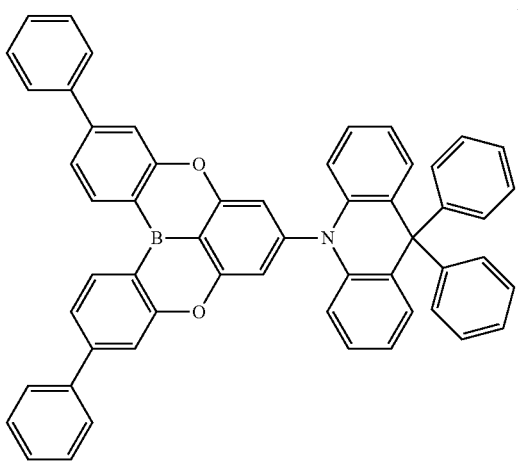
1-67
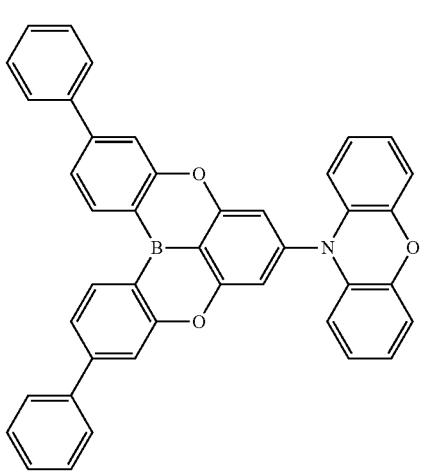

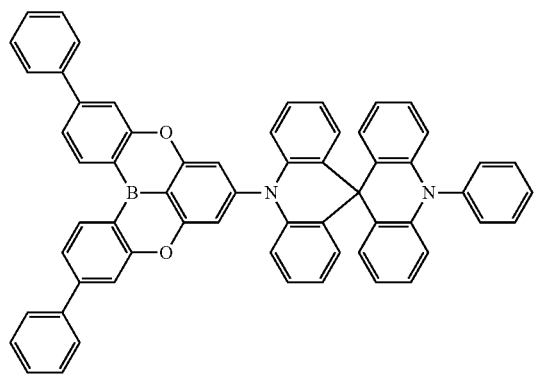

1-68

3. The organic light emitting diode according to claim 1, wherein the second compound is represented by Formula 3:

[Formula 3]

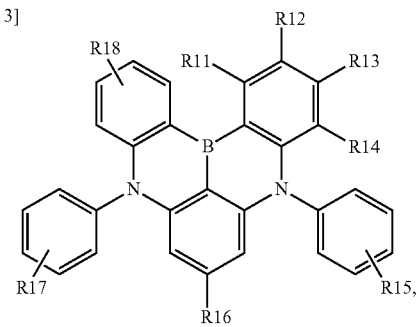

wherein each of R11 to R14 is independently selected from the group consisting of hydrogen, deuterium, tritium, boron, nitrogen, C1 to C20 alkyl, C6 to C30 aryl, C5 to C30 heteroaryl, C1 to C20 alkylamine, and C6 to C30 arylamine, or adjacent two of R11 to R14 are combined to form a fused ring including boron and nitrogen, and wherein each of R15 and R18 is independently selected from the group consisting of hydrogen, deuterium, tritium, boron, nitrogen, C1 to C20 alkyl, C6 to C30 aryl, C5 to C30 heteroaryl, C1 to C20 alkylamine, and C6 to C30 arylamine.

4. The organic light emitting diode according to claim 3, wherein the Formula 3 is represented by Formula 4-1 or Formula 4-2:

[Formula 4-1]

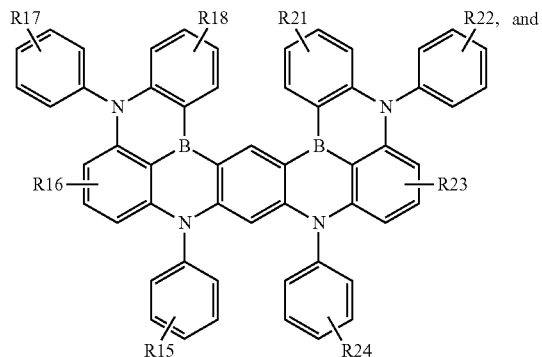

[Formula 4-2]

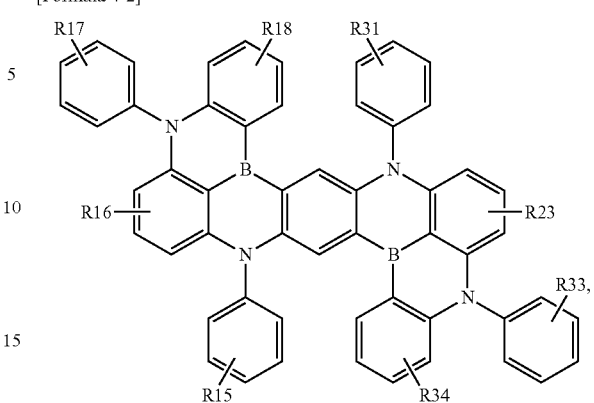

wherein in Formula 4-1, each of R15 to R18 and R21 to R24 is independently selected from the group consisting of hydrogen, deuterium, tritium, boron, nitrogen, C1 to C20 alkyl, C6 to C30 aryl, C5 to C30 heteroaryl, C1 to C20 alkylamine, and C6 to C30 arylamine, and wherein in Formula 4-2, each of R15 to R18 and R31 to R34 is independently selected from the group consisting of hydrogen, deuterium, tritium, boron and nitrogen, C 1 to C20 alkyl, C6 to C30 aryl, C5 to C30 heteroaryl, C1 to C20 alkylamine, and C6 to C30 arylamine.

5. The organic light emitting diode according to claim 3, wherein the second compound is selected from one of the following compounds:

2-1

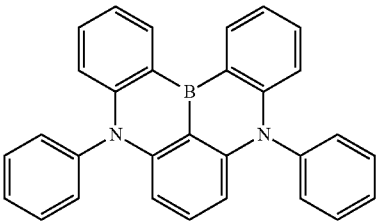

2-2

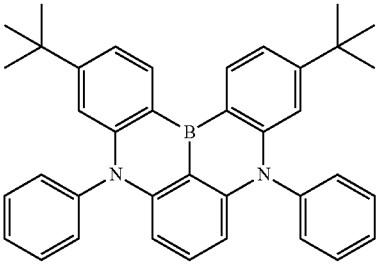

2-3

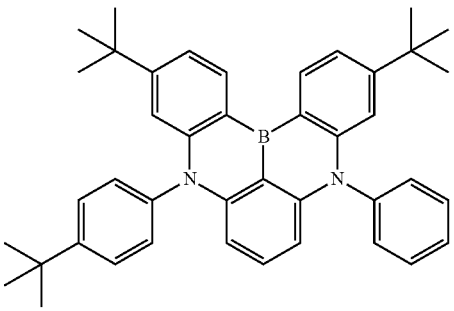

2-4
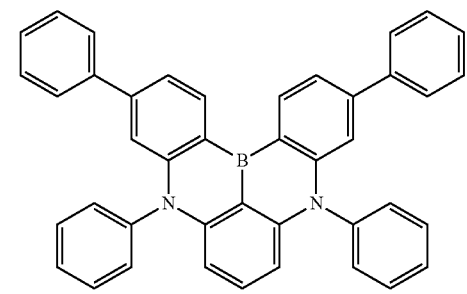
2-5
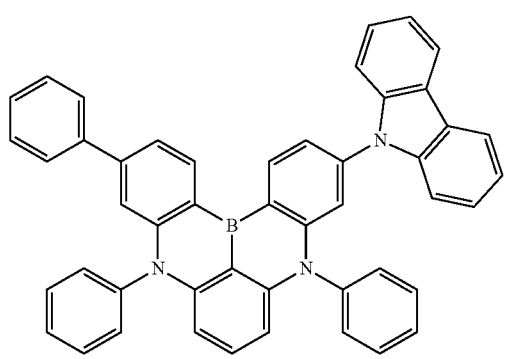
2-6
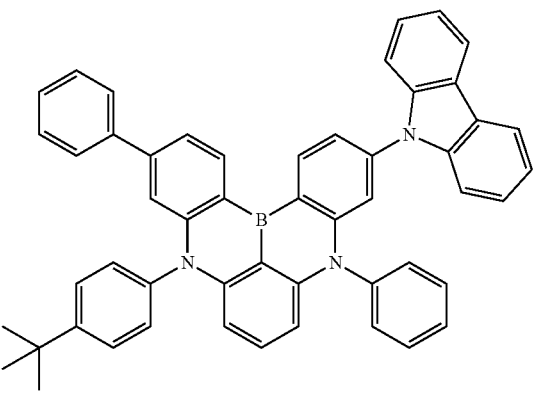
2-7
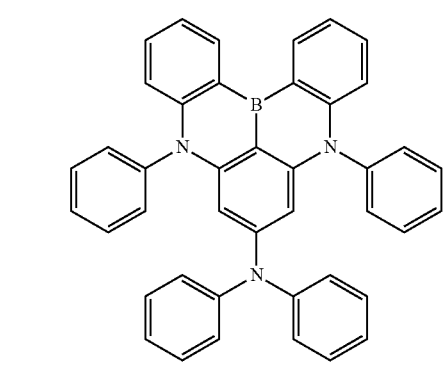
2-8
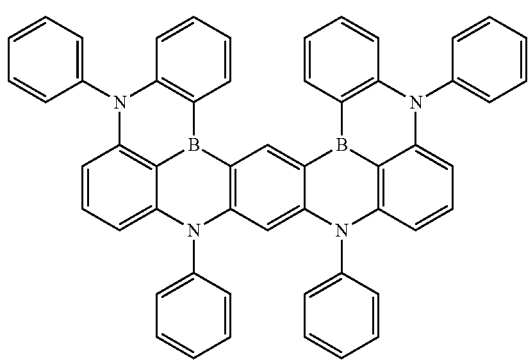
2-9
2-10
2-11
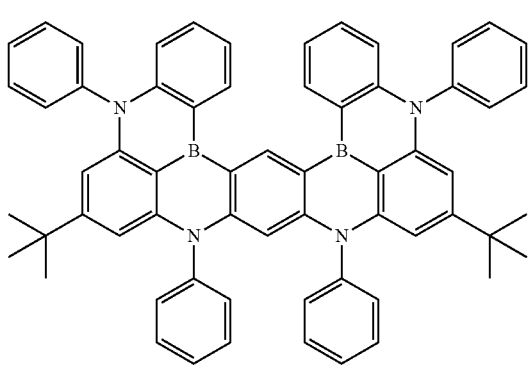

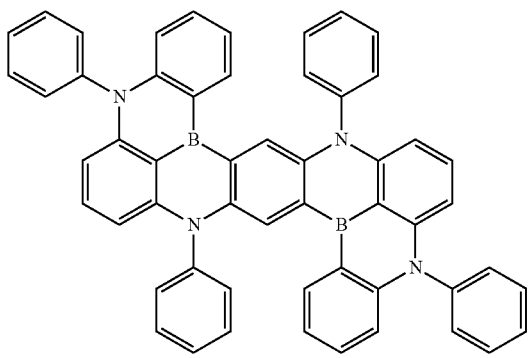

2-12

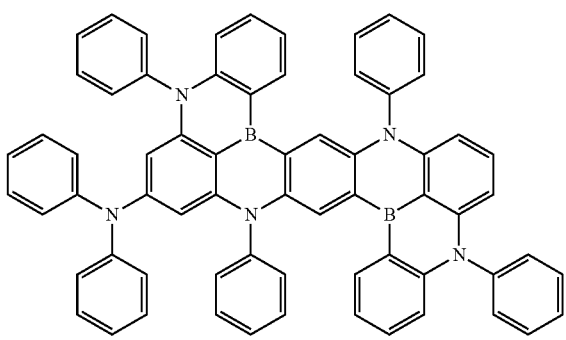

2-13

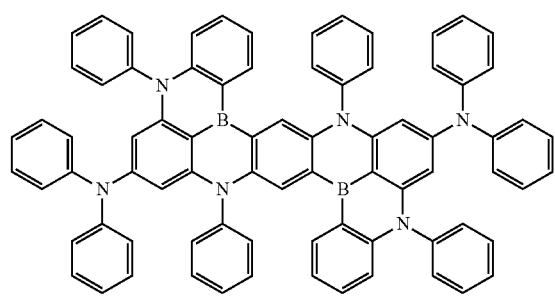

2-14

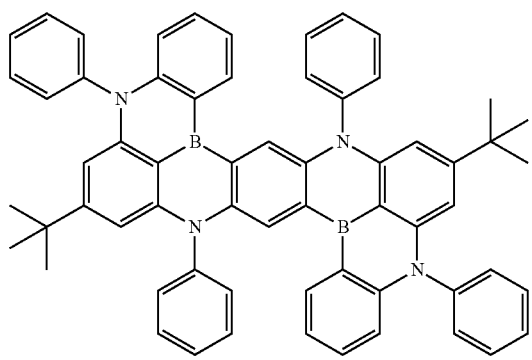

2-15

6. The organic light emitting diode according to claim 1, wherein a difference between an energy level of a highest occupied molecular orbital (HOMO) of the first compound and an energy level of a HOMO of the second compound is less than 0.3 eV.

7. The organic light emitting diode according to claim 1, wherein a weight % of the first compound is greater than that of the second compound.

8. The organic light emitting diode according to claim 1, wherein the emitting material layer includes a first emitting material layer and a second emitting material layer, and the second emitting material layer is positioned between the first emitting material layer and the first electrode, and
wherein the first compound is included in the first emitting material layer, and the second compound is included in the second emitting material layer.

9. The organic light emitting diode according to claim 8, wherein a weight % of the first compound in the first emitting material layer is greater than that of the second compound in the second emitting material layer.

10. The organic light emitting diode according to claim 8, wherein the emitting material layer further includes a third emitting material layer including the second compound and positioned between the second electrode and the first emitting material layer.

11. An organic light emitting device, comprising:
a substrate; and
an organic light emitting diode disposed on the substrate, the organic light emitting diode including:
a first electrode;
a second electrode facing the first electrode; and
an emitting material layer including a first compound and a second compound and positioned between the first and second electrodes,
wherein the first compound includes a hexagonal-ring moiety including one boron atom, one oxygen atom and four carbon atoms, and the second compound includes a hexagonal-ring moiety including one boron atom, one nitrogen atom and four carbon atoms, and

[Formula 1]

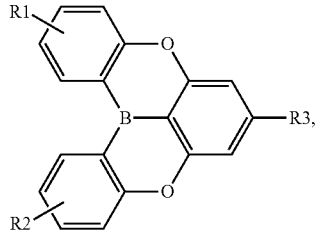

wherein each of R1 and R2 is independently selected from the group consisting of hydrogen, deuterium, tritium, halogen, C1 to C20 alkyl, C6 to C30 aryl, C5 to C30 heteroaryl, C1 to C20 alkylamine, and C6 to C30 arylamine, and R3 is C5 to C60 heteroaryl including a nitrogen atom.

12. The organic light emitting device according to claim 11, wherein the first compound is selected from one of the following compounds:

1-1
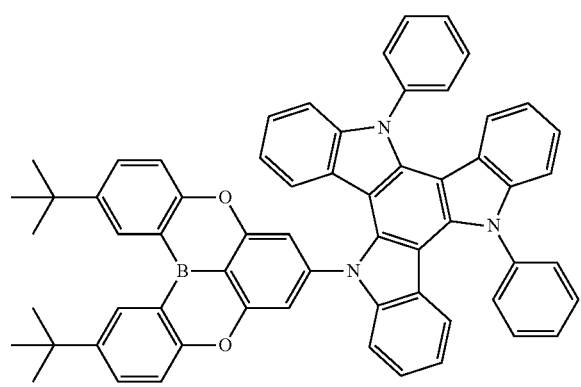
1-2
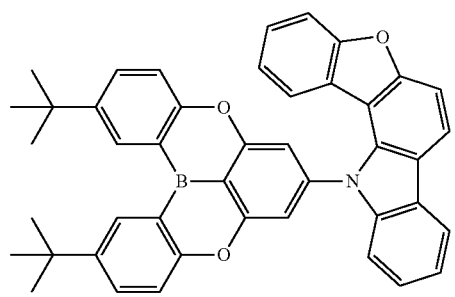
1-3
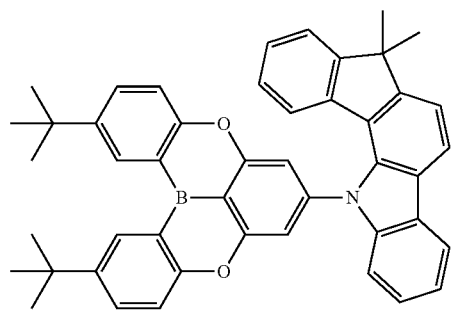
1-4
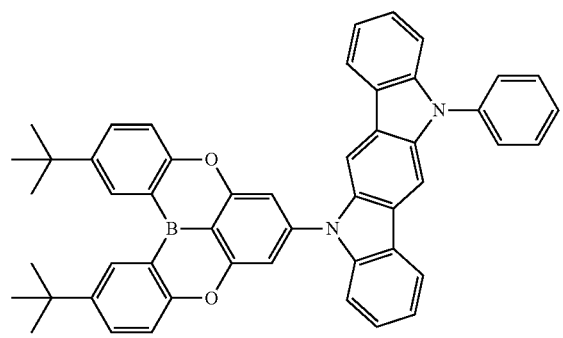
1-5
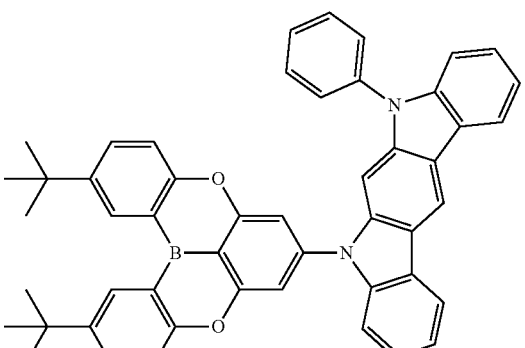
1-6
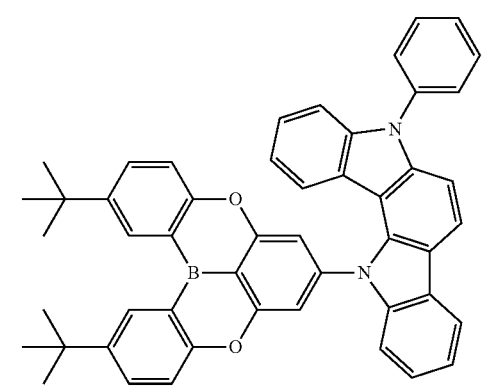
1-7
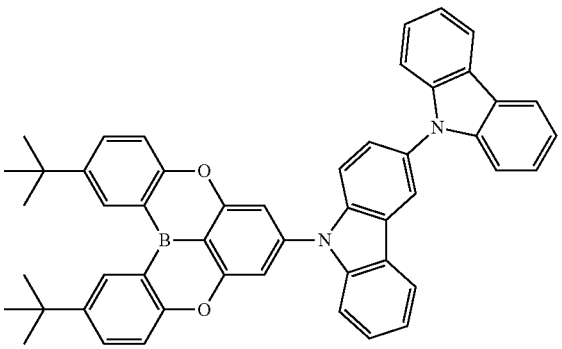
1-8
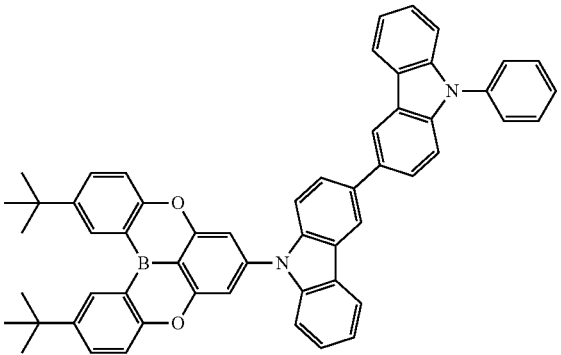

1-9
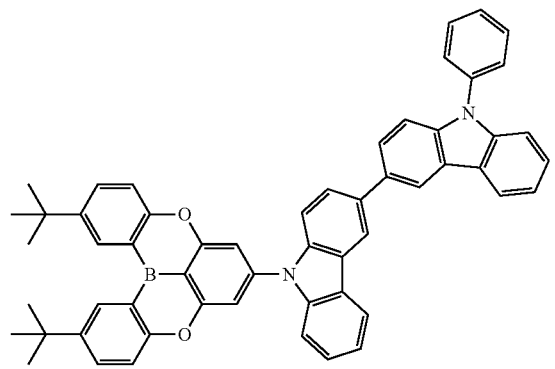
1-10
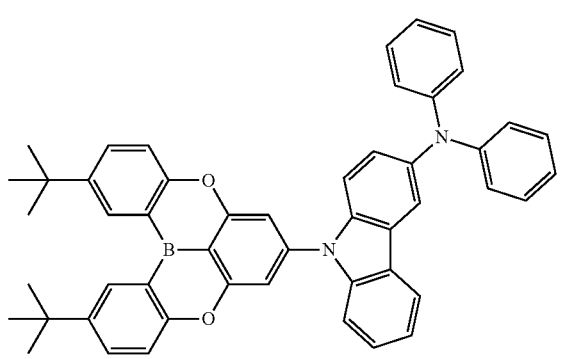
1-11
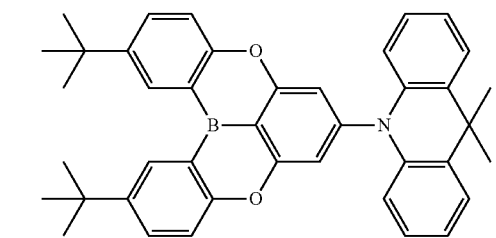
1-12
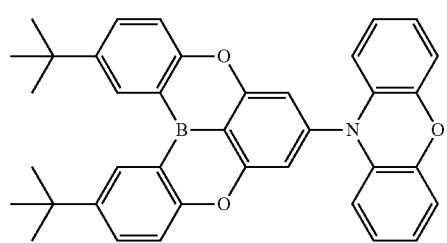
1-13
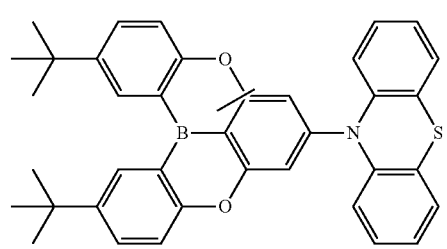
1-14
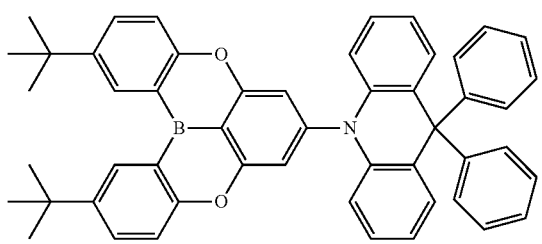
1-15
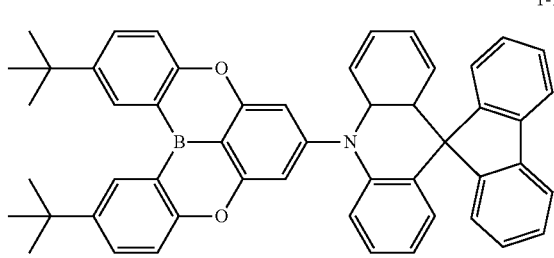
1-16
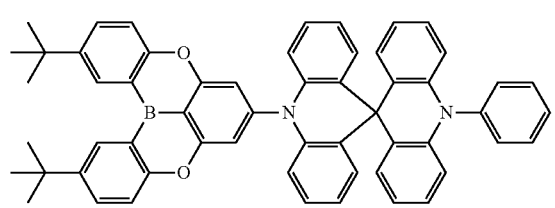
1-17
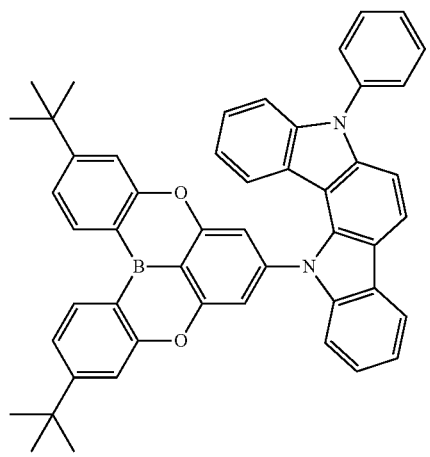
1-18
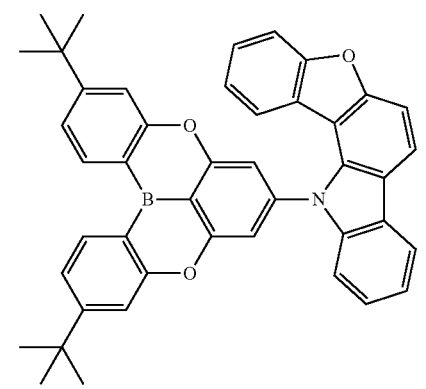

1-19
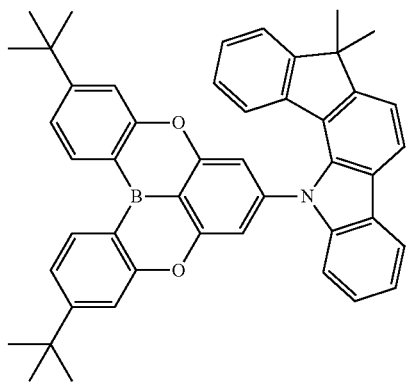
1-20
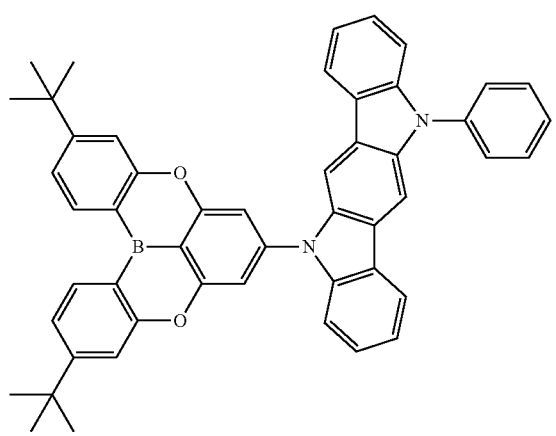
1-21
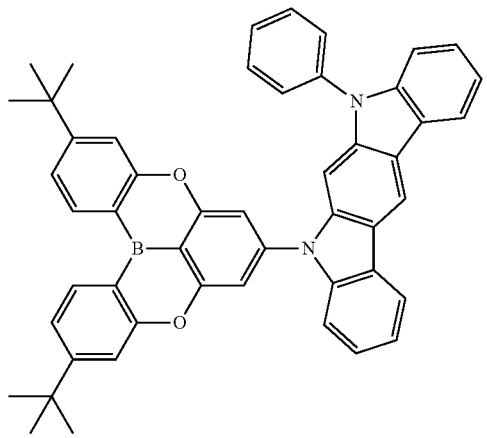
1-22
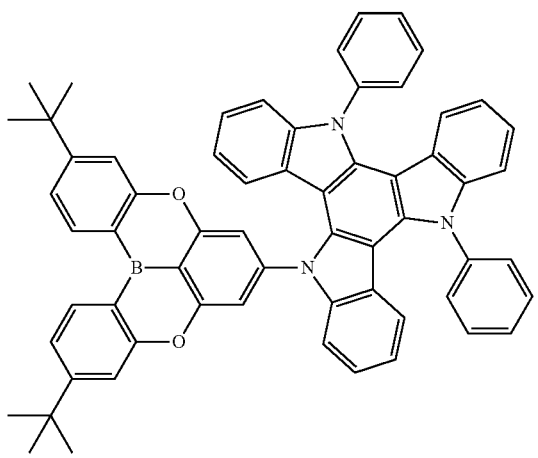
1-23
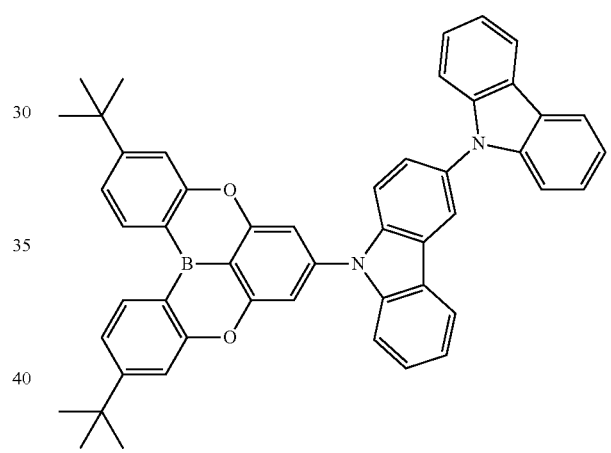
1-24
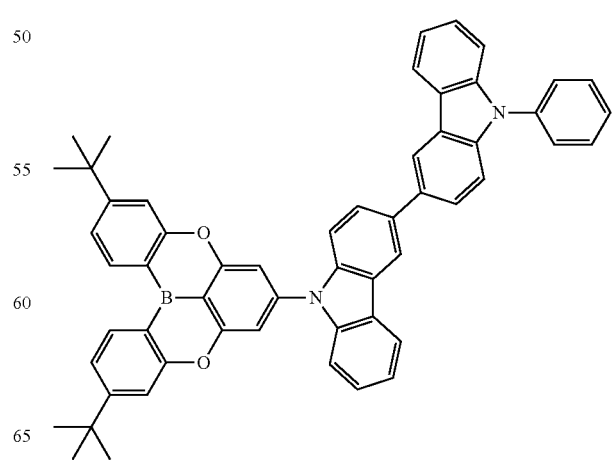

1-25
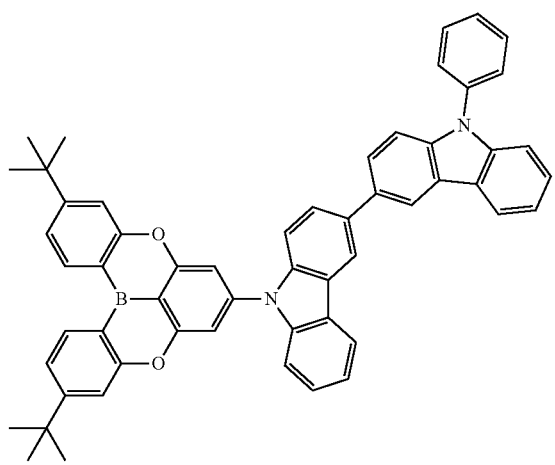
1-26
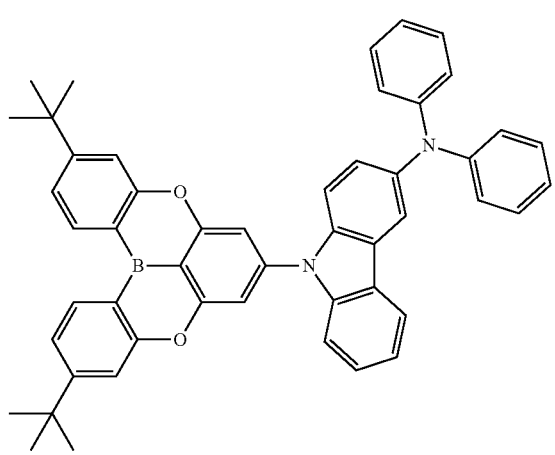
1-27
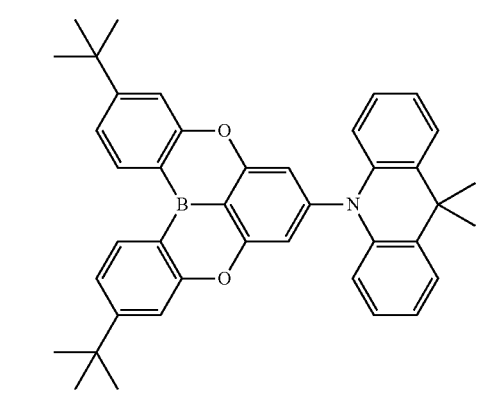
1-28
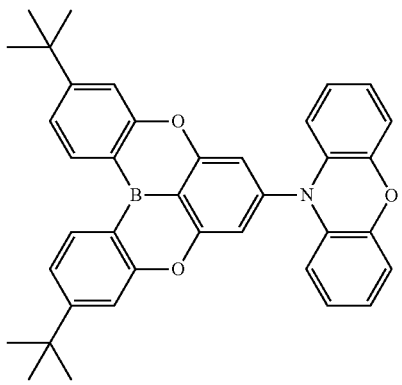
1-29
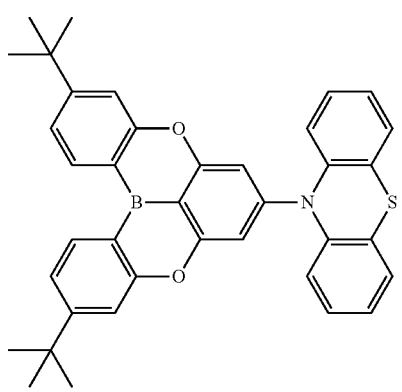
1-30
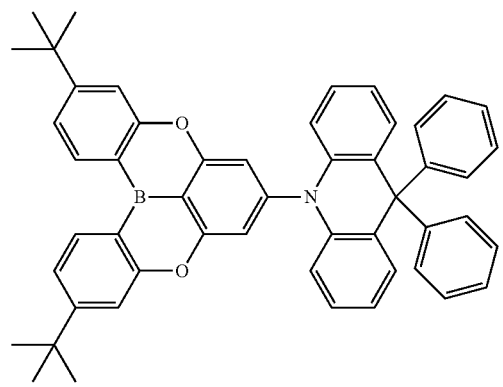
1-31
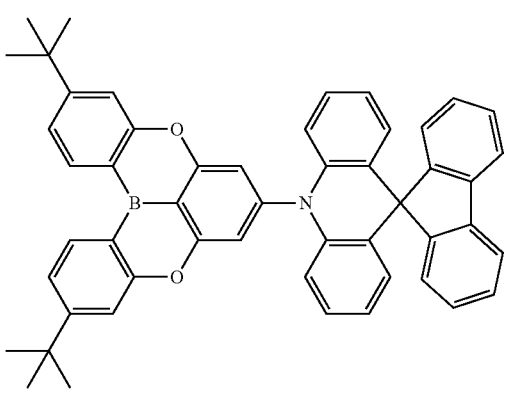

1-32
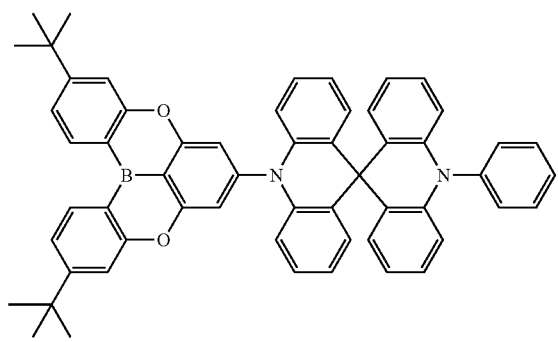
1-36
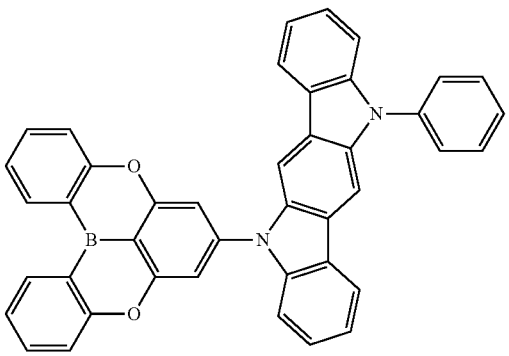
1-33
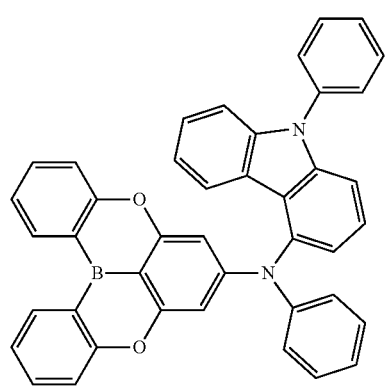
1-37
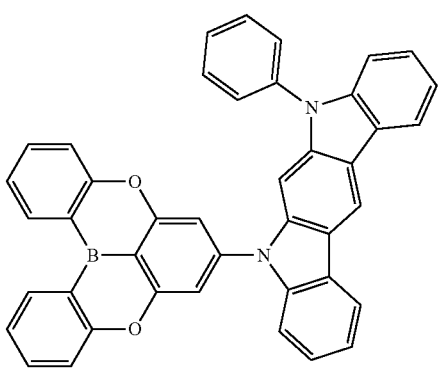
1-34
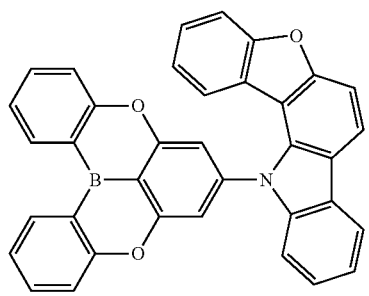
1-38
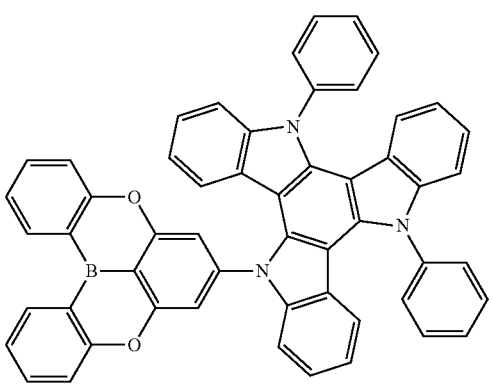
1-35
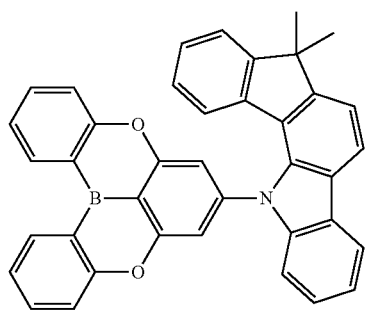
1-39
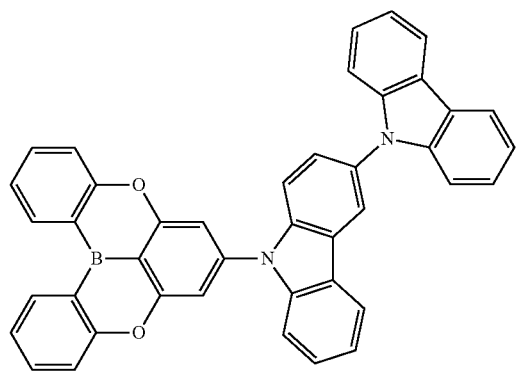

1-40
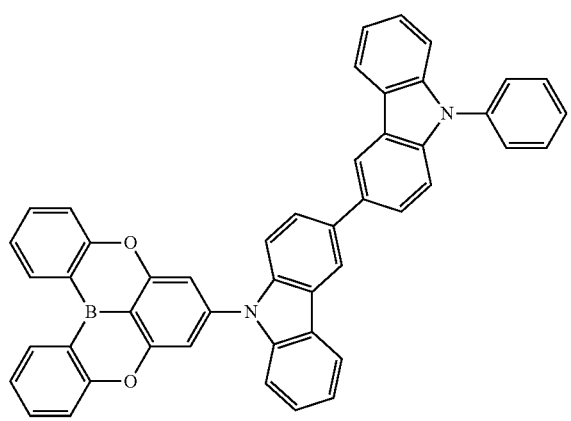
1-41
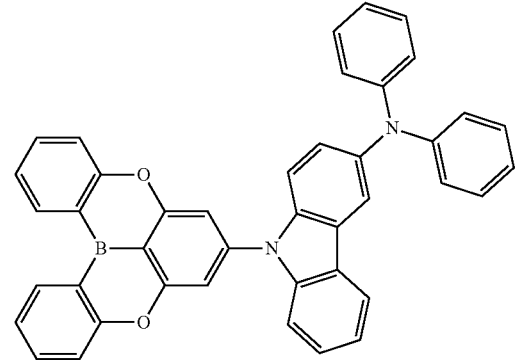
1-42
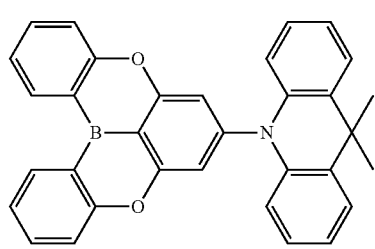
1-43
1-44
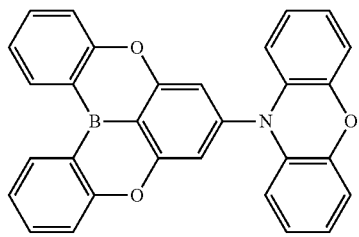
1-45
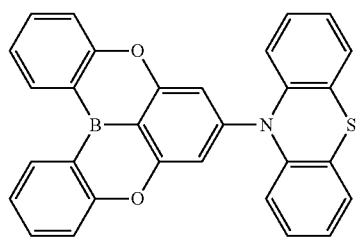
1-46
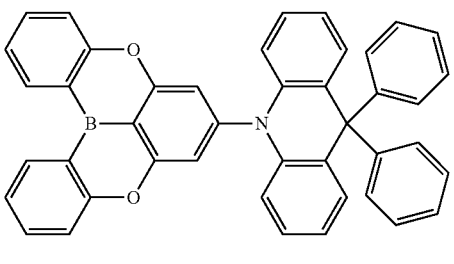
1-47
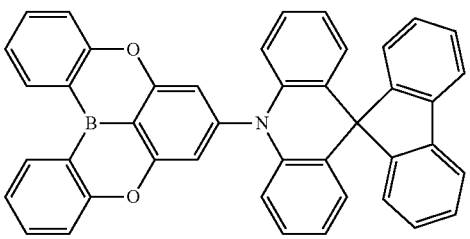
1-48
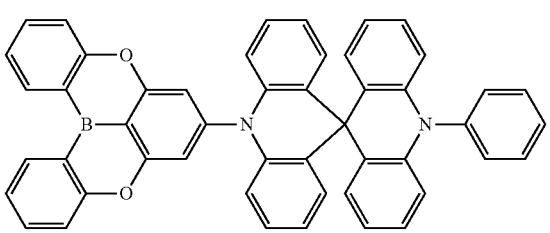
1-49
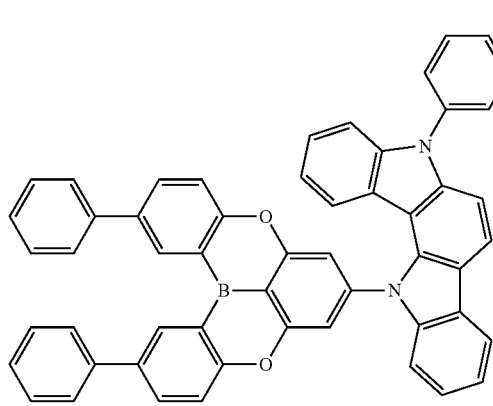

-continued
1-50
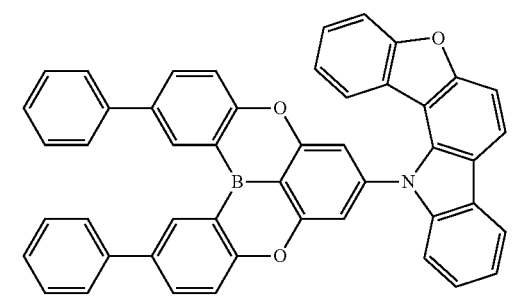
1-51
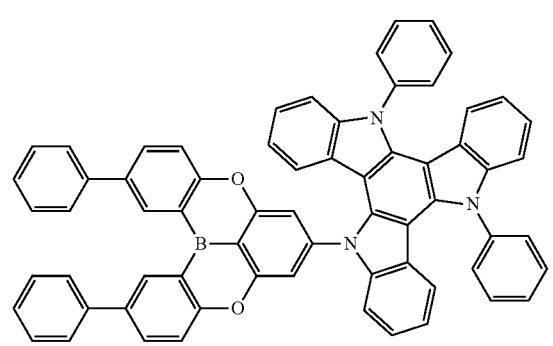
1-52
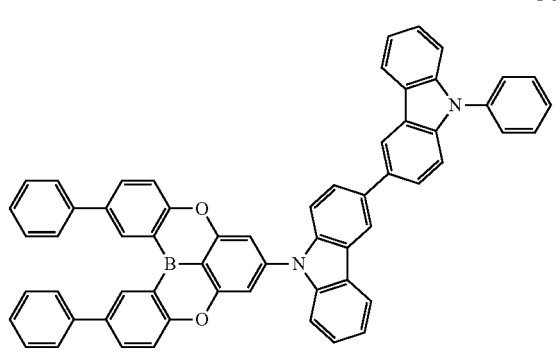
1-53
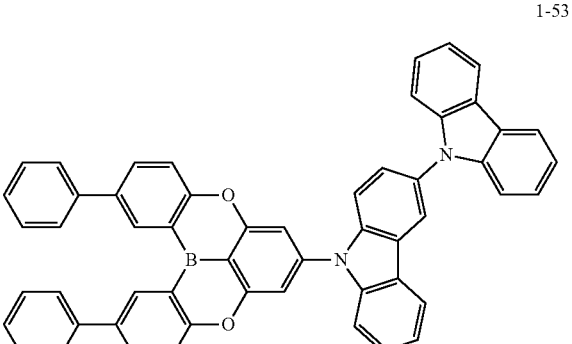
1-54
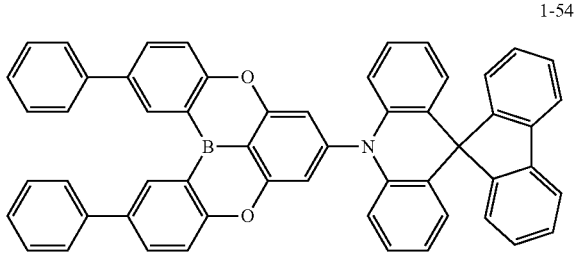
-continued
1-55
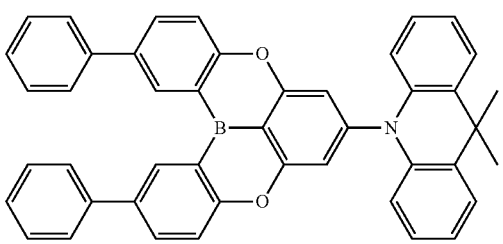
1-56
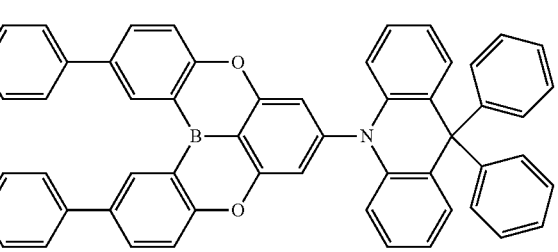
1-57
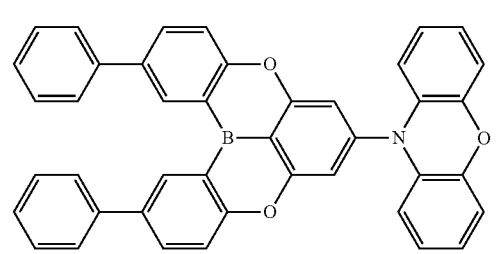
1-58
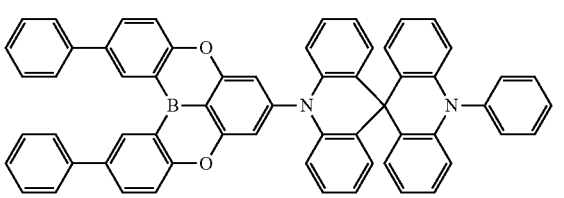
1-59
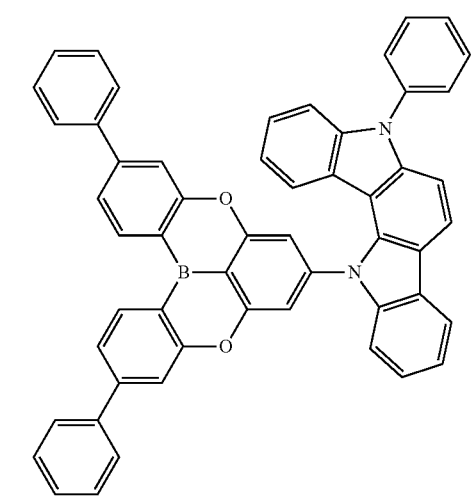

1-60
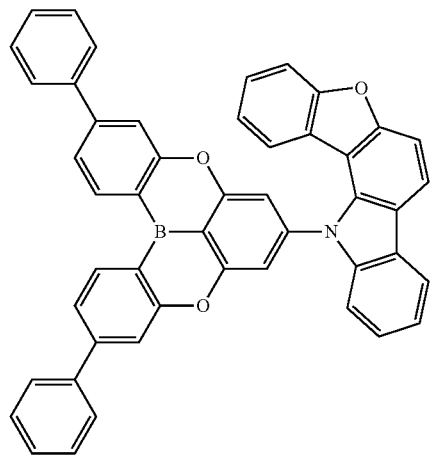
1-61
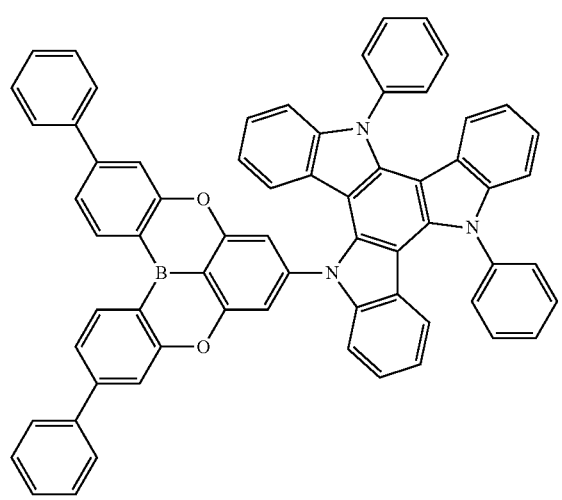
1-62
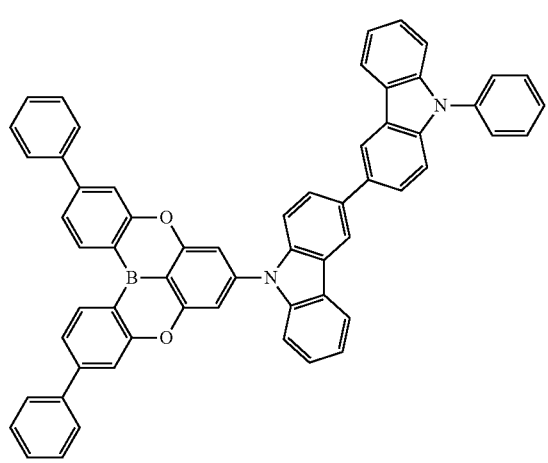
1-63
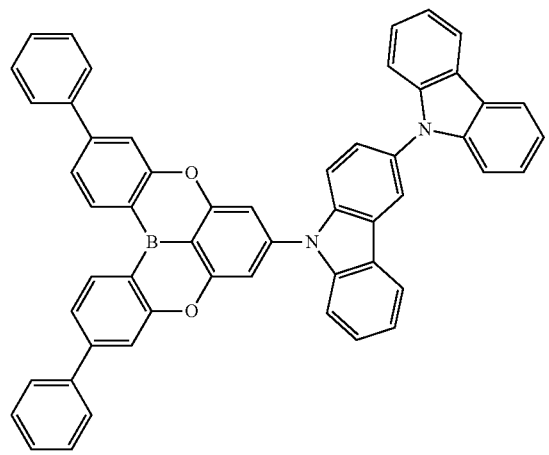
1-64
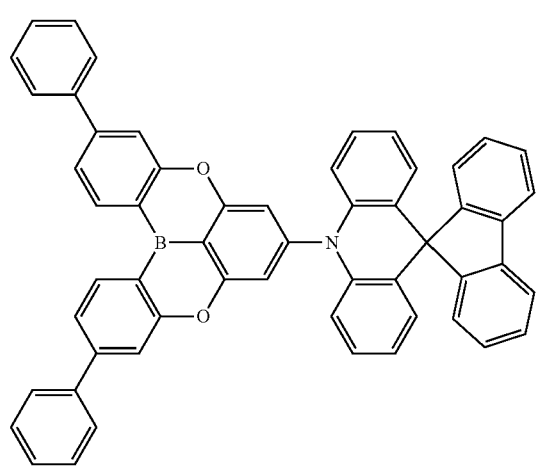
1-65
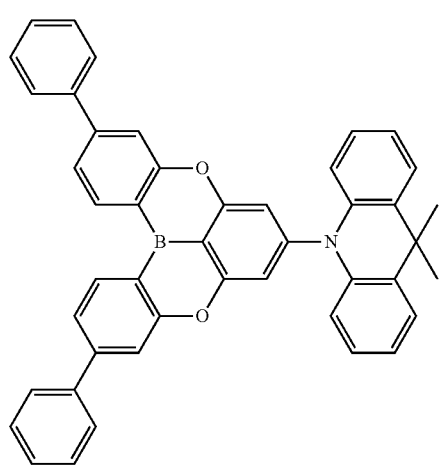

-continued 1-66
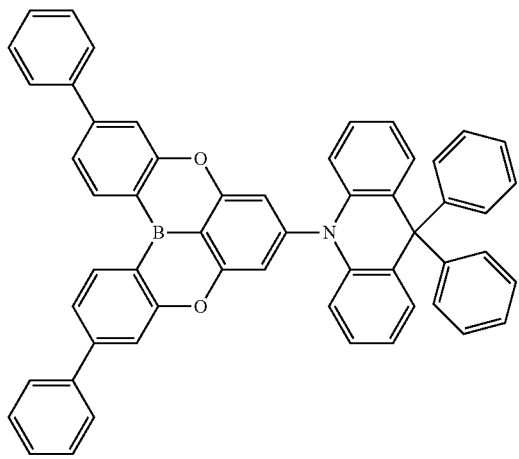

1-67
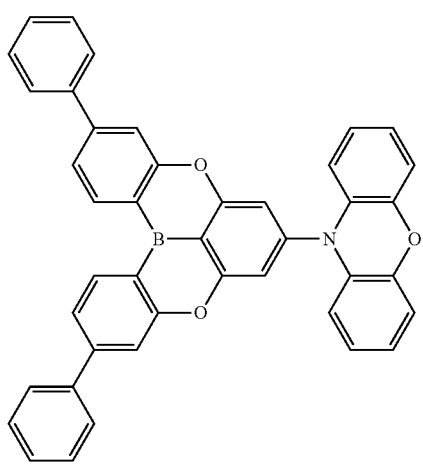

1-68
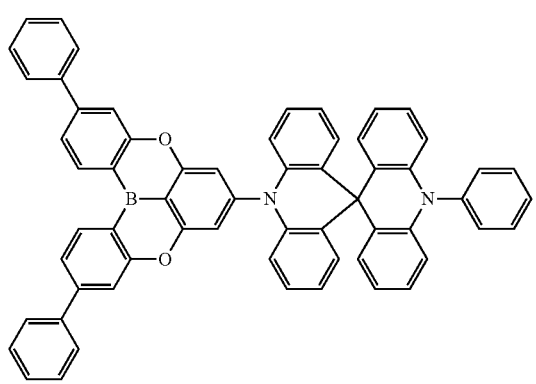

13. The organic light emitting device according to claim 11, wherein the second compound is represented by Formula 3:

[Formula 3]
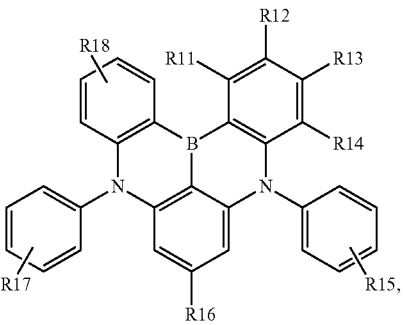

wherein each of R11 to R14 is independently selected from the group consisting of hydrogen, deuterium, tritium, boron, nitrogen, C1 to C20 alkyl, C6 to C30 aryl, C5 to C30 heteroaryl, C1 to C20 alkylamine, and C6 to C30 arylamine, or adjacent two of R11 to R14 are combined to form a fused ring including boron and nitrogen, and wherein each of R15 and R18 is independently selected from the group consisting of hydrogen, deuterium, tritium, boron, nitrogen, C1 to C20 alkyl, C6 to C30 aryl, C5 to C30 heteroaryl, C1 to C20 alkylamine, and C6 to C30 arylamine.

14. The organic light emitting device according to claim 13, wherein the Formula 3 is represented by Formula 4-1 or Formula 4-2:

[Formula 4-1]
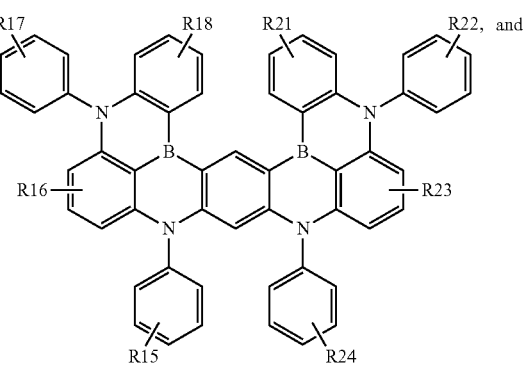

[Formula 4-2]
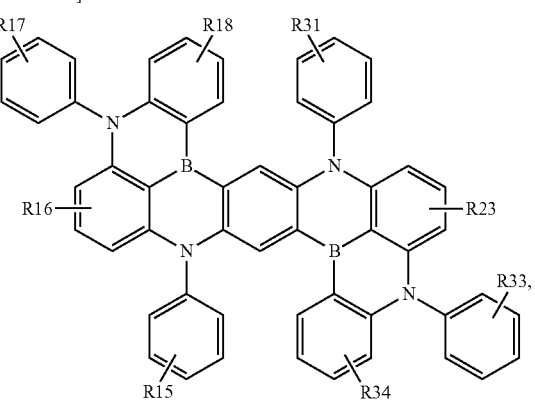

wherein in Formula 4-1, each of R15 to R18 and R21 to R24 is independently selected from the group consisting of hydrogen, deuterium, tritium, boron, nitrogen, C1 to C20 alkyl, C6 to C30 aryl, C5 to C30 heteroaryl, C1 to C20 alkylamine, and C6 to C30 arylamine, and wherein in Formula 4-2, each of R15 to R18 and R31 to R34 is independently selected from the group consisting of hydrogen, deuterium, tritium, boron and nitrogen, C1 to C20 alkyl, C6 to C30 aryl, C5 to C30 heteroaryl, C1 to C20 alkylamine, and C6 to C30 arylamine.

15. The organic light emitting device according to claim 13, wherein the second compound is selected from one of the following compounds:

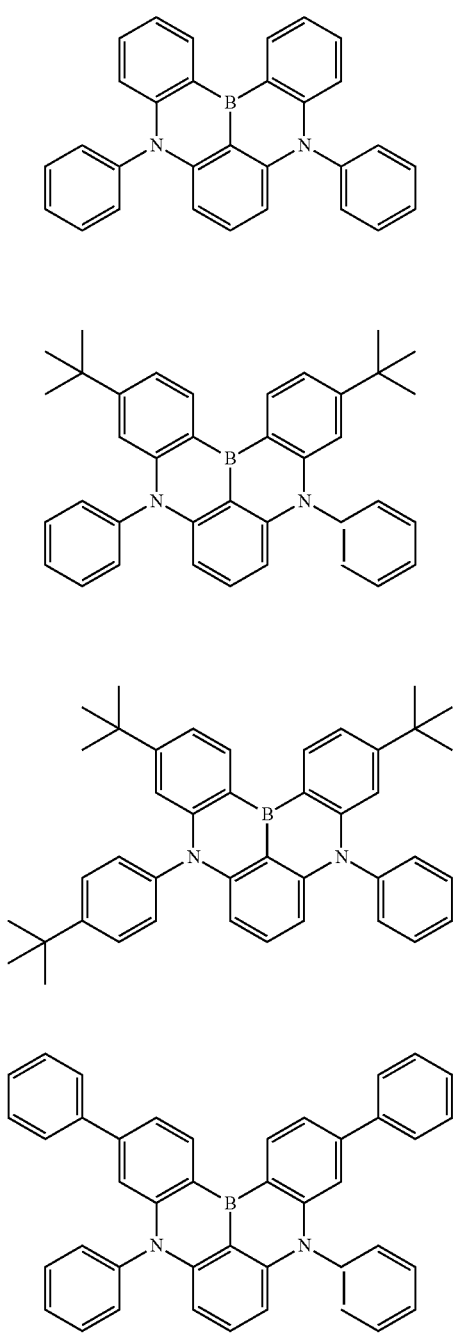

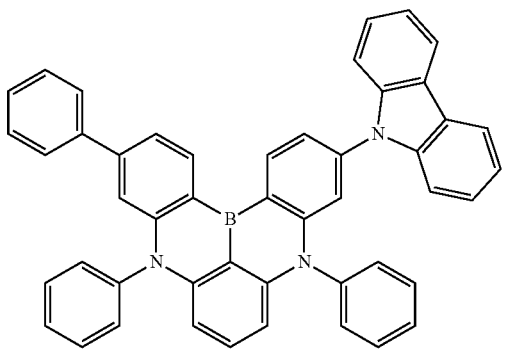

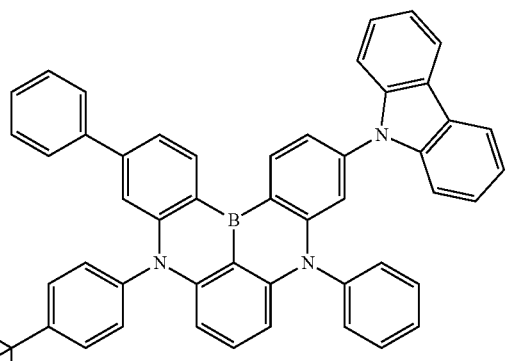

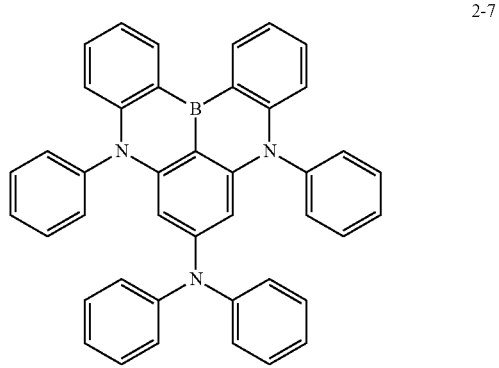

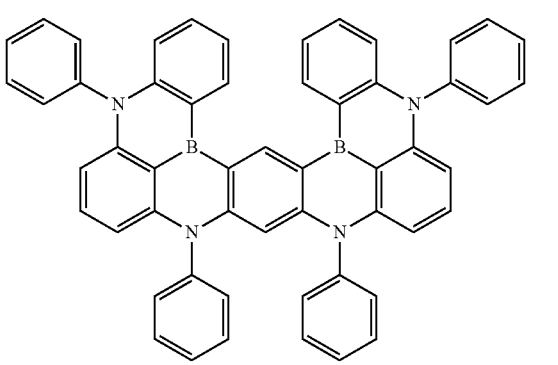

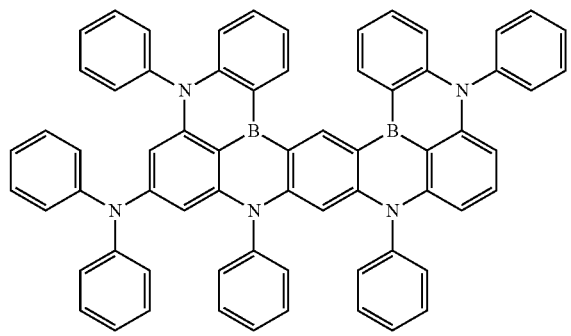

2-9

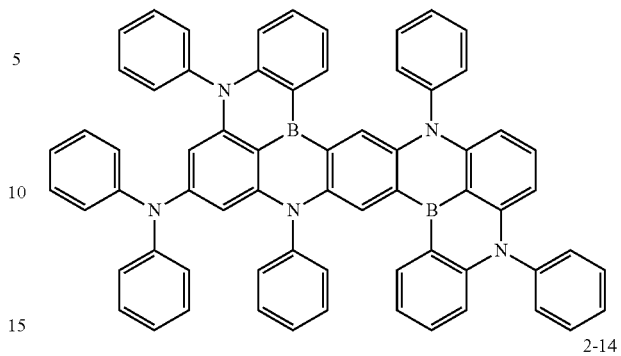

2-13

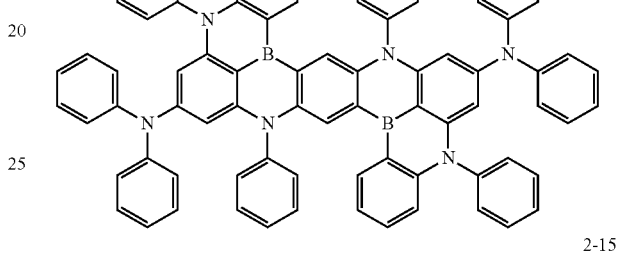

2-14

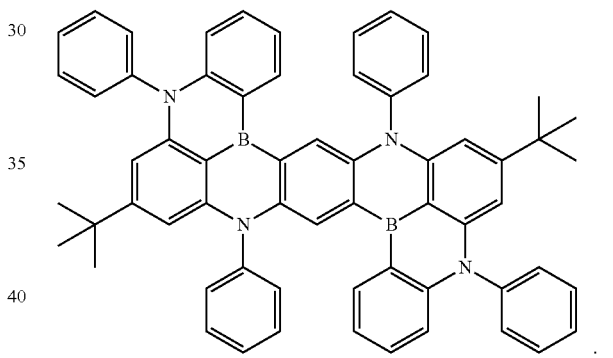

2-15

2-10

2-11

2-12

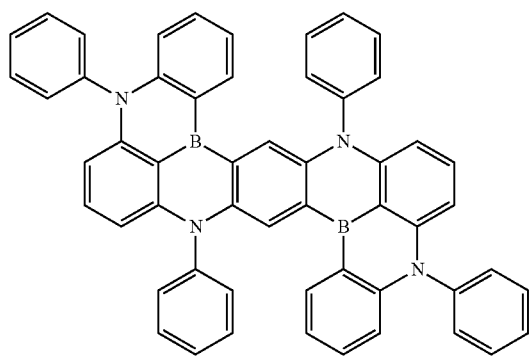

16. The organic light emitting device according to claim 11, wherein a difference between an energy level of a highest occupied molecular orbital (HOMO) of the first compound and an energy level of a HOMO of the second compound is less than 0.3 eV.

17. The organic light emitting diode according to claim 11, wherein the emitting material layer includes a first emitting material layer and a second emitting material layer, and the second emitting material layer is positioned between the first emitting material layer and the first electrode, and
  wherein the first compound is included in the first emitting material layer, and the second compound is included in the second emitting material layer.

18. The organic light emitting diode according to claim 17, wherein the emitting material layer further includes a third emitting material layer including the second compound and positioned between the second electrode and the first emitting material layer.

19. An organic light emitting diode, comprising:
  a first electrode;
  a second electrode facing the first electrode; and
  an emitting material layer including a first compound and a second compound and positioned between the first and second electrodes, wherein the first compound includes a hexagonal-ring moiety including one boron atom, one oxygen atom and four carbon atoms, and the second compound includes a hexagonal-ring moiety including one boron atom, one nitrogen atom and four carbon atoms, wherein the emitting material layer includes a first emitting material layer and a second emitting material layer, and the second emitting material layer is positioned between the first emitting material layer and the first electrode, and wherein the first compound is included in the first emitting material layer, and the second compound is included in the second emitting material layer.

20. The organic light emitting diode according to claim 19, wherein a weight % of the first compound in the first emitting material layer is greater than that of the second compound in the second emitting material layer.

* * * * *